United States Patent
Higuchi et al.

(10) Patent No.: US 9,952,361 B2
(45) Date of Patent: Apr. 24, 2018

(54) IR CUT FILTER, METHOD FOR MANUFACTURING THE SAME, AND SOLID-STATE IMAGING DEVICE

(71) Applicant: FUJIFILM CORPORATION, Tokyo (JP)

(72) Inventors: Reiji Higuchi, Haibara-gun (JP); Satoru Murayama, Haibara-gun (JP)

(73) Assignee: FUJIFILM Corporation, Minato-Ku, Tokyo (JP)

( * ) Notice: Subject to any disclaimer, the term of this patent is extended or adjusted under 35 U.S.C. 154(b) by 0 days.

(21) Appl. No.: 14/728,458

(22) Filed: Jun. 2, 2015

(65) Prior Publication Data
US 2015/0260886 A1    Sep. 17, 2015

Related U.S. Application Data

(63) Continuation of application No. PCT/JP2013/081908, filed on Nov. 27, 2013.

(30) Foreign Application Priority Data

Dec. 3, 2012 (JP) ................... 2012-264798

(51) Int. Cl.
*G02B 5/20* (2006.01)
*G02B 5/00* (2006.01)
(Continued)

(52) U.S. Cl.
CPC ............... *G02B 5/208* (2013.01); *C08F 2/44* (2013.01); *C08F 2/48* (2013.01); *G02B 1/12* (2013.01);
(Continued)

(58) Field of Classification Search
CPC . G02B 5/208; G02B 1/12; G02B 5/22; G02B 5/26; G02B 5/00; H01L 27/14625;
(Continued)

(56) References Cited

U.S. PATENT DOCUMENTS

2010/0052192 A1    3/2010 Hasegawa et al.
2010/0142069 A1*   6/2010 Nakamura ........ G02F 1/133512
                                                      359/885
(Continued)

FOREIGN PATENT DOCUMENTS

CA      2830592 A1 * 10/2012 ............... C08K 3/28
CN    102645692 A      8/2012
(Continued)

OTHER PUBLICATIONS

Communication dated Feb. 25, 2016, issued by the Korean Intellectual Property Office in corresponding Korean Application No. 10-2015-7014274.
(Continued)

*Primary Examiner* — John P Dulka
(74) *Attorney, Agent, or Firm* — Sughrue Mion, PLLC

(57) ABSTRACT

A solid-state imaging device comprises a CMOS sensor, a circuit board, a ceramic plate, an IR cut filter, a taking lens, a lens holder, and a support barrel. The CMOS sensor is mounted on the circuit board. The circuit board is fixed to the ceramic plate such that the CMOS sensor is placed inside an opening of the ceramic plate. The sides of the CMOS sensor are surrounded by the ceramic plate. The IR cut filter is fixed to the ceramic plate so as to cover the opening. The CMOS sensor is disposed behind the taking lens. The IR cut filter is disposed between the taking lens and the CMOS sensor. A light-shielding layer is formed over the entire periphery of edge portions of an incident surface of the IR cut filter. Harmful rays such as reflective light is blocked by the light-shielding layer.

14 Claims, 11 Drawing Sheets

(51) Int. Cl.
  *G02B 5/22* (2006.01)
  *G02B 5/26* (2006.01)
  *H04N 5/225* (2006.01)
  *C08F 2/44* (2006.01)
  *C08F 2/48* (2006.01)
  *H01L 27/146* (2006.01)
  *G02B 1/12* (2006.01)

(52) U.S. Cl.
  CPC ............... *G02B 5/00* (2013.01); *G02B 5/22* (2013.01); *G02B 5/26* (2013.01); *H01L 27/14618* (2013.01); *H01L 27/14623* (2013.01); *H01L 27/14625* (2013.01); *H04N 5/2254* (2013.01); *C08F 2400/02* (2013.01)

(58) Field of Classification Search
  CPC ......... H01L 27/14618; H01L 27/14623; C08F 2/44; C08F 2/48; C08F 2400/02; H04N 5/2254
  See application file for complete search history.

(56) References Cited

U.S. PATENT DOCUMENTS

| | | | |
|---|---|---|---|
| 2012/0162774 | A1 | 6/2012 | Ishida et al. |
| 2012/0211852 | A1* | 8/2012 | Iwafuchi ........... H01L 27/14618 257/435 |
| 2012/0257075 | A1 | 10/2012 | Kamada |
| 2017/0170219 | A1* | 6/2017 | Iwafuchi ........... H01L 27/14618 |
| 2017/0283587 | A1* | 10/2017 | Hamada ................. C08K 5/544 |

FOREIGN PATENT DOCUMENTS

| | | |
|---|---|---|
| EP | 2 490 262 A2 | 8/2012 |
| JP | 2002-268120 A | 9/2002 |
| JP | 2010-53084 A | 3/2010 |
| JP | 2010-56170 A | 3/2010 |
| JP | 2011-21976 A | 2/2011 |
| JP | 2011192593 A | 9/2011 |
| JP | 2012-169556 A | 9/2012 |
| JP | 2012-186434 A | 9/2012 |
| JP | 2012-222546 A | 11/2012 |
| TW | 201126196 A | 8/2011 |
| TW | 201238042 A | 9/2012 |
| WO | 2011019067 A1 | 2/2011 |

OTHER PUBLICATIONS

Communication dated Aug. 30, 2016 from the Korean Intellectual Property Office in counterpart application No. 10-2015-7014274.
Notification of Reason for Refusal, dated Nov. 3, 2016, in KR Application No. 10-2015-7014274, 11 pages in English and Korean.
Communication dated May 4, 2017 from the State Intellectual Property Office of the P.R.C. in counterpart Application No. 201380063029.8.
Communication, dated Sep. 28, 2015, issued in corresponding EP Application No. 13861270.0, 12 pages in English.
International Search Report of PCT/JP2013/081908, dated Jan. 28, 2014. [PCT/ISA/210], 5 pages in Japanese and English.
Communication dated Aug. 25, 2016 from the European Patent Office in counterpart application No. 13861270.0.
Communication dated Aug. 31, 2016 from the Japanese Patent Office in counterpart application No. 2013-246692.
Communication dated Aug. 18, 2016 from the State Intellectual Property Office of the P.R.C. in counterpart application No. 201380063029.8.
Communication dated Aug. 4, 2017 from the European Patent Office in counterpart Application No. 13 861 270.0.
Communication dated Jan. 6, 2016, issued by the Japan Patent Office in corresponding Japanese Application No. 2013-246692.
Communication dated Sep. 29, 2017 from the Taiwanese Intellectual Property Office in counterpart Application No. 102144094.
Final Examination Report from Intellectual Property Office of Economic Development issued in corresponding Taiwanese Application No. 102144094 dated Jan. 19, 2018, 6 pages in English and Chinese.

* cited by examiner

| | L2/L1 | PRESENCE/ABSENCE OF FLARE | ACCEPTANCE/REJECTION OF VIEWING ANGLE |
|---|---|---|---|
| EXAMPLE 1 | 1 | A | ACCEPTED |
| EXAMPLE 2 | 0.5 | B | ACCEPTED |
| EXAMPLE 3 | 0.1 | B | ACCEPTED |
| REFERENCE EXAMPLE 1 | 1.2 | B | REJECTED |
| COMPARATIVE EXAMPLE 1 | NO LIGHT-SHIELDING LAYER | Z | ACCEPTED |

| | L4/L3 | PRESENCE/ ABSENCE OF FLARE | ACCEPTANCE/ REJECTION OF VIEWING ANGLE |
|---|---|---|---|
| EXAMPLE 4 | 0.1 | C | ACCEPTED |
| EXAMPLE 5 | 0.5 | B | ACCEPTED |
| EXAMPLE 6 | 1 | B | ACCEPTED |
| COMPARATIVE EXAMPLE 2 | NO LIGHT-SHIELDING LAYER | Z | ACCEPTED |

IR CUT FILTER, METHOD FOR MANUFACTURING THE SAME, AND SOLID-STATE IMAGING DEVICE

CROSS-REFERENCE TO RELATED APPLICATIONS

This application is a Continuation of PCT International Application No. PCT/JP2013/081908 filed on Nov. 27, 2013, which claims priority under 35 U. S. C. § 119 (a) to Japanese Patent Application No. 2012-264798, filed Dec. 3, 2012. Each of the above application(s) is hereby expressly incorporated by reference, in its entirety, into the present application.

BACKGROUND OF THE INVENTION

1. Field of the Invention

The present invention relates to an IR cut filter that cuts IR light traveling toward a solid-state imaging element, a method for manufacturing an IR cut filter, and a solid-state imaging device.

2. Description Related to the Prior Art

A solid-state imaging device comprises a taking lens, a solid-state imaging element disposed behind the taking lens, a circuit board on which the solid-state imaging element is mounted. The solid-state imaging device is incorporated in an electronic device such as a digital camera, a mobile phone with a camera, a smartphone, or the like. The solid-state imaging element is an image sensor of a CCD-type, a CMOS type, or the like. The solid-state imaging element photoelectrically converts light incident on a light receiving surface to output three color signals. The three color signals are subjected to signal processing in a signal processing circuit incorporated in the electronic device, and then converted into image data. A taken image is displayed on a monitor based on the image data.

The sensitivity of the solid-state imaging element to the near-infrared region is higher than that of a human eye. In the case where the whole light including the IR (infrared) light is incident on the solid-state imaging element and photoelectrically converted, an image of a subject seen with human eyes and a taken image differ in color balance. For example, a green object appears as a gray or a reddish brown object and a blue-violet object appears as a reddish-violet object in the taken image.

In a solid-state imaging device described in US 2012/0257075 A1 (corresponding to JP 2012-222546 A), an IR cut filter, which cuts the infrared light while transmitting visible light, is provided between a taking lens and a solid-state imaging element to prevent the infrared light from entering the solid-state imaging element. Thereby, the color balance seen with the human eyes is reproduced in a taken image.

In the solid-state imaging device, harmful rays are caused by repetitive reflection and refraction of the visible light. Upon incidence on the solid-state imaging element, the harmful rays may cause so-called flare that is light fogging, resulting in degradation of image quality. In the US 2012/0257075 A1, the IR cut filter cuts the infrared light, but the harmful rays pass through the IR cut filter. The harmful rays are incident on the slid-state imaging element, causing the flare and also a phenomenon called "ghost" which is a clear appearance of the harmful rays in an image.

SUMMARY OF THE INVENTION

An object of the present invention is to provide an IR cut filter for inhibiting occurrences of flare and ghost, a method for manufacturing the same, and a solid-state imaging device.

In order to achieve the above object, the IR cut filter of the present invention comprises a filter body and a light-shielding layer. The IR cut filter is disposed and used on a light receiving surface side of a solid-state imaging element. The filter body cuts IR light of subject light traveling toward the light receiving surface. The light-shielding layer is formed over at least one of an edge portion of an incident surface of the filter body and a side end face of the filter body, and blocks visible light. The light-shielding layer includes a layer in which the size of a polymerizable composition particle is small and a low reflective layer in which the size of the polymerizable composition particle is large.

It is preferred that the light-shielding layer is formed over the edge portion of the incident surface. It is preferred that a length L1 from a side end of the incident surface to a side end of the solid-state imaging element in an orthogonal direction, which is orthogonal to an optical axis direction, and a length L2 from a side end of the filter body to an inner end of the light-shielding layer in the orthogonal direction satisfy L2≤L1.

It is preferred that the light-shielding layer contains carbon black or titanium black. It is preferred that the light-shielding layer is formed by a spin coating method or a spray coating method.

It is preferred that the light-shielding layer is formed over the side end face. It is preferred that a length L3 of the filter body in the optical axis direction and a length L4 from the incident surface to a rear end of the light-shielding layer in the optical axis direction satisfy L4≤L3. It is preferred that a reflectivity of the light-shielding layer is 2% or less and surface roughness is 0.55 μm or more.

The method for manufacturing an IR cut filter according to the present invention comprises a coating film forming step, an exposure step, and a development step. The IR cut filter is disposed and used on a light receiving surface side of a solid-state imaging element. In the coating film forming step, a coating liquid for forming a light-shielding layer is applied by a spin coating method or spray coating method to at least one of an incident surface and a side end surface of a filter body to form a coating film. The light-shielding layer blocking visible light. The filter body cuts IR light of subject light traveling toward the light receiving surface of the solid-state imaging element. The coating liquid contains a curing component that is cured by irradiation with light. In the exposure step, the coating film is irradiated with the light through a mask to cure an irradiated portion of the coating film. The mask covers the coating film such that an edge portion of the coating film is exposed when viewed in a normal direction of the incident surface. In the development step, the light-shielding layer is formed by eluting an unirradiated portion of the coating film into an alkaline aqueous solution. The coating film forming step comprises a substep for forming a film in which the size of polymerizable composition particle is small and a substep for forming a low reflective film in which the size of the polymerizable composition particle is large. The coating film includes the film in which the size of the polymerizable composition particle is small and the low reflective film.

It is preferred that an average particle diameter of the polymerizable composition particles in the film in which the size of the polymerizable composition particle is small is 20 μm or less and an average particle diameter of the polymerizable composition particles in the low reflective film is 70 μm or less.

The solid-state imaging device according to the present invention comprises a taking lens, a solid-state imaging element, an IR cut filter, and a support plate. The solid-state imaging element is disposed on an exit surface side of the taking lens. The IR cut filter is disposed between the taking lens and the solid-state imaging element. The IR cut filter has a filter body and a light-shielding layer. The filter body cuts IR light of subject light traveling toward a light receiving surface of the solid-state imaging element. The light-shielding layer blocks visible light. The light-shielding layer is formed over at least one of an edge portion of an incident surface of the filter body and a side end face of the filter body. The light-shielding layer includes a layer in which the size of a polymerizable composition particle is small and a low reflective layer in which the size of the polymerizable composition particle is large. The support plate supports the IR cut filter.

According to the present invention, the harmful rays are blocked by the light-shielding layer. Thereby the incidence of the harmful rays onto the light receiving surface of the solid-state imaging element, which is covered by the IR cut filter, is inhibited and the occurrences of flare and ghost in taken images are inhibited.

BRIEF DESCRIPTION OF DRAWINGS

The above and other objects and advantages of the present invention will be more apparent from the following detailed description of the preferred embodiments when read in connection with the accompanied drawings, wherein like reference numerals designate like or corresponding parts throughout the several views, and wherein.

DESCRIPTION OF THE PREFERRED EMBODIMENTS

[First Embodiment]

Figure 1:
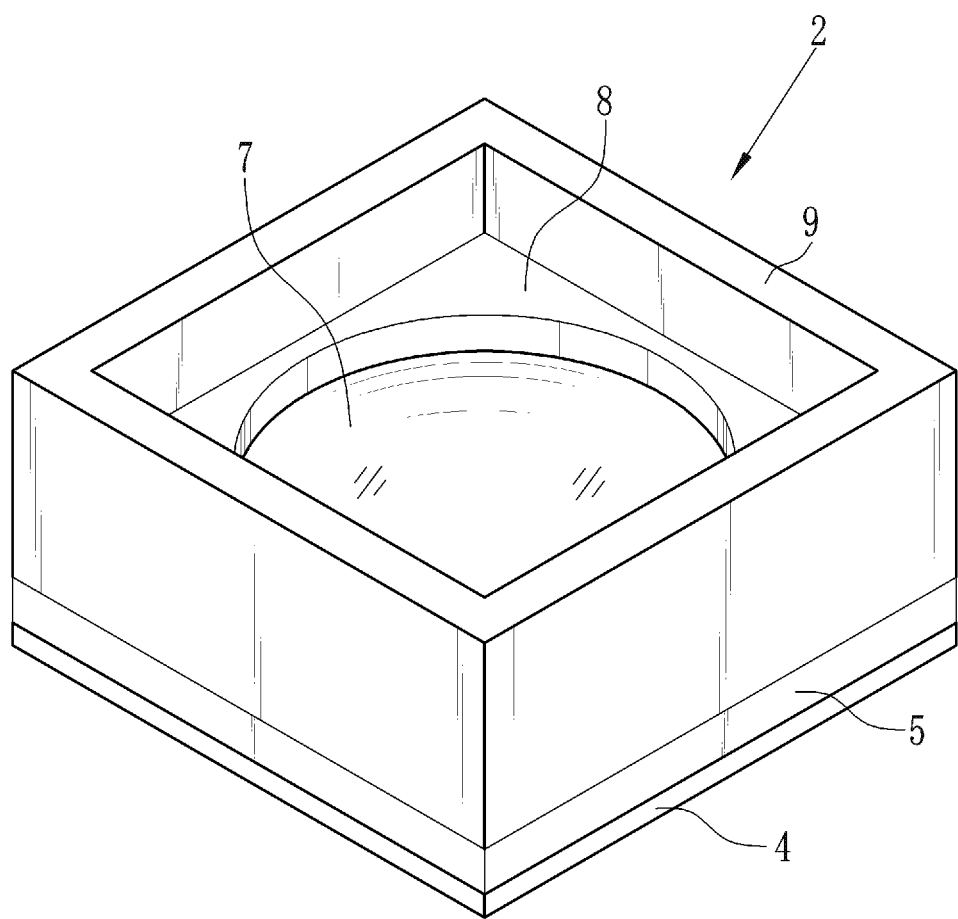
FIG. 1 is a perspective view illustrating a solid-state imaging device.
Figure 2:
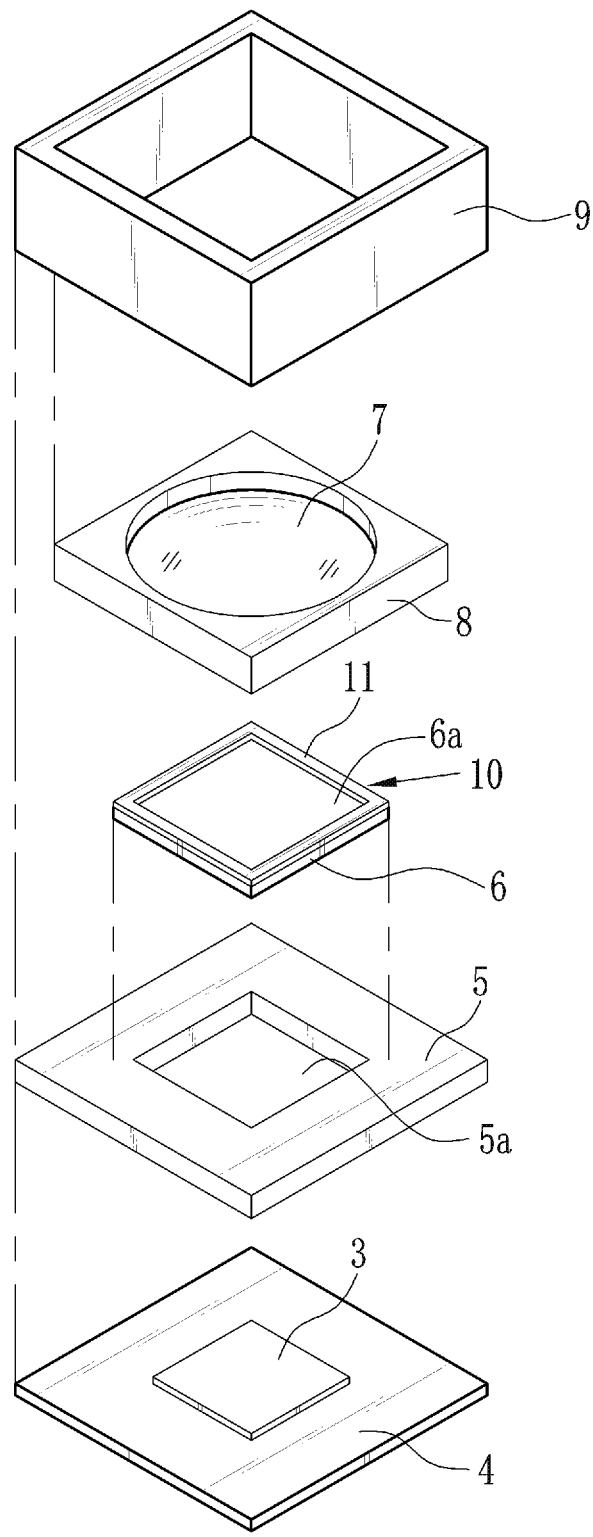
FIG. 2 is an exploded perspective view of the solid-state imaging device.

As illustrated in FIG. 1 and FIG. 2, a solid-state imaging device 2 comprises an image sensor 3, being a solid-state imaging element, a circuit board 4 on which the image sensor 3 is mounted, and a ceramic plate 5 to which the circuit board 4 is attached. The solid-state imaging device 2 comprises an IR cut filter 10, a taking lens 7, a lens holder 8, and a support barrel 9. The IR cut filter 10 is attached to the ceramic plate 5 and cuts infrared light (IR). The ceramic plate 5 is a support plate for supporting the IR cut filter 10. The lens holder 8 holds the taking lens 7. The support barrel 9 holds the lens holder 8 in a movable manner. Note that the number of the taking lens 7 may be changed as necessary. The image sensor 3 in this embodiment is of a CMOS type. The image sensor 3 may be of a CCD type instead. The solid-state imaging device 2 is incorporated in an electronic device, for example, a digital camera. Hereinafter, an example in which the solid-state imaging device 2 is incorporated in a digital camera is described.

The image sensor 3 is mounted at the center of one of surfaces of the circuit board 4. The ceramic plate 5 has the shape of a frame formed with an opening 5a. The image sensor 3 is disposed within the opening 5a. The circuit board 4 is fixed to the ceramic plate 5 such that the ceramic plate 5 surrounds the sides of the image sensor 3. The circuit board 4 and the ceramic plate 5 are fixed to each other with an adhesive (for example, an epoxy-based adhesive, the same hereinafter). Various circuit patterns are formed in the circuit board 4.

The IR cut filter 10 has a filter body 6 and a light-shielding layer 11, which will be described below. The filter body 6 cuts the IR light, and has plate-shaped glass formed with a reflective film (not shown) that reflects the IR light. The surface of the reflective film is an incident surface 6a on which subject light is incident. The filter body 6 is formed with the size slightly greater than that of the opening 5a, and fixed to the ceramic plate 5 with the adhesive so as to cover the opening 5a.

The taking lens 7 is formed with the diameter greater than that of the filter body 6. The lens holder 8 is formed with an opening at its center, and the taking lens 7 is mounted inside the opening. The support barrel 9 is fixed using the adhesive to the surface of the ceramic plate 5 on the IR cut filter 10 side. The support barrel 9 holds the lens holder 8 inside the support barrel 9 such that the lens holder 8 is movable in an optical axis direction (an up-and-down direction in FIG. 3). The lens holder 8 is moved inside the support barrel 9 in the optical axis direction by a moving mechanism (not shown).

In the solid-state imaging device 2 thus configured, the image sensor 3 is disposed on an exit surface side (the exit side) (in a lower portion in FIG. 2 and FIG. 3) of the taking lens 7. The IR cut filter 10 is disposed between the taking lens 7 and the image sensor 3. The subject light is incident on a light receiving surface of the image sensor 3 through the taking lens 7 and the IR cut filter 10. The infrared light contained in the subject light is cut by the filter body 6.

The circuit board 4 is connected to a control unit incorporated in the digital camera and power is supplied from a power source (battery) of the digital camera to the circuit board 4. A plurality of color pixels are arranged in two dimensions in the light receiving surface of the image sensor 3. Each color pixel photoelectrically converts the incident light and stores a signal charge generated. The control unit of the digital camera sequentially reads out the signal charge of each color pixel from the image sensor 3 and thereby allows outputting an image signal of one frame, and performs various types of signal processing on the image signal of one frame. Thus, a taken image is obtained.

Figure 3:
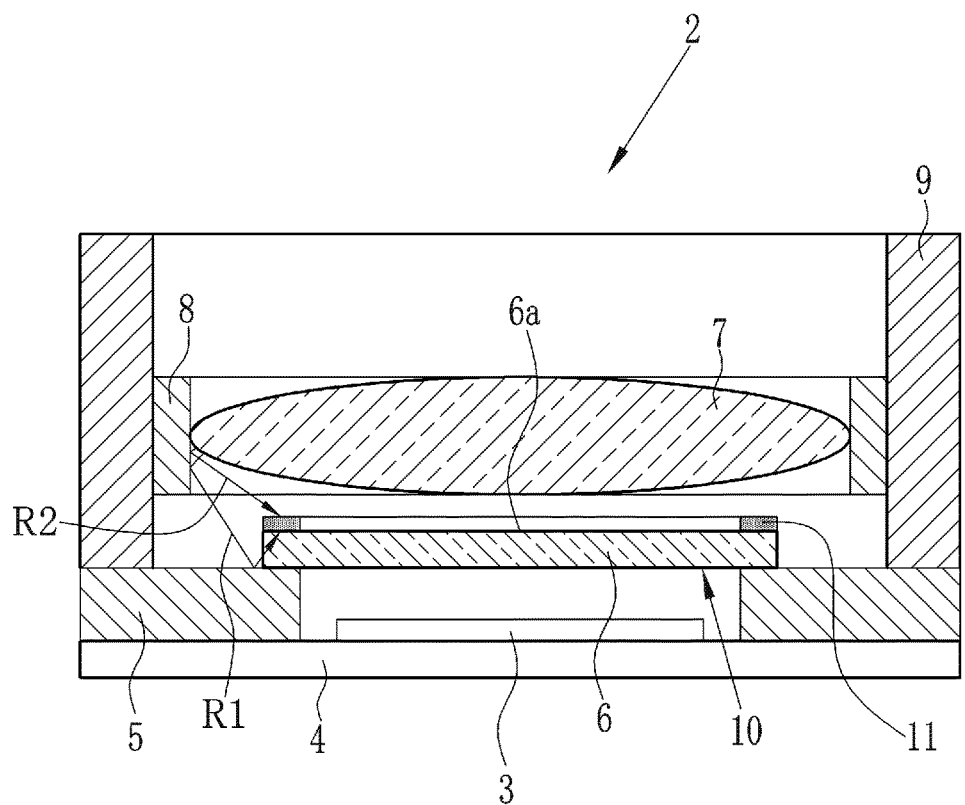
FIG. 3 is a cross-sectional view of the solid-state imaging device.
Figure 4:
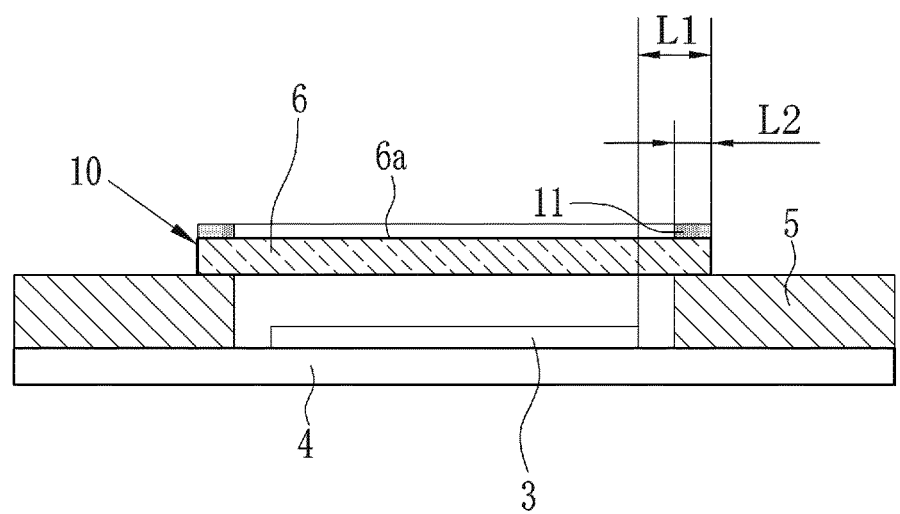
FIG. 4 is a cross-sectional view illustrating a CMOS sensor, a circuit board, a ceramic plate, an IR cut filter, and a light-shielding film.

As illustrated in FIG. 2 and FIG. 3, the light-shielding layer 11, which blocks visible light, is formed over the entire periphery of edge portions of the incident surface 6a of the filter body 6. The light-shielding layer 11 is formed into a film form. The light-shielding layer 11 and the incident surface 6a with no light-shielding layer 11 constitute a colored pattern. In a case where an IR cut filter with no light-shielding layer 11 is used, the incidence of the reflective light (visible light) R1, which exited from the taking lens 7 and reflected by the front surface (the top surface in FIGS. 2 and 3) of the ceramic plate 5 and then repeated the reflection and refraction inside the solid state imaging device, on the image sensor 3 and the incidence of the reflective light (visible light) R2, which exited from the taking lens 7 and reflected by the inner wall of the lens holder 8, on the image sensor 3 cause flare and ghost in a taken image. Since the IR cut filter 10 is formed with the light-shielding layer 11, the light-shielding layer 11 blocks the harmful rays such as the reflective light R1 and R2 traveling toward the image sensor 3. As a result, the flare and ghost are inhibited in a taken image. Note that the thickness of the light-shielding layer 11 is exaggerated in FIG. 2 and FIG. 3. As illustrated in FIG. 4, it is preferred to satisfy L2≤L1 where L1 denotes a length from a side end of the filter body 6 to a side end of the image sensor 3 and L2 denotes a length from the side end of the filter body 6 to an inner end of the light-shielding layer 11. Thereby the viewing angle in the case of L2≤L1 is greater than that in the case of L2>L1.

Hereinafter, each component contained in dispersion composition and polymerizable composition, which are used for forming the light-shielding layer 11, will be described below in detail.

Note that, in this specification, in a case a group (atomic group) is denoted without specifying whether it is substituted or unsubstituted, it includes a group having a substituent and a group having no substituent. For example, an "alkyl group" includes not only an alkyl group (unsubstituted alkyl group) having no substituent but also an alkyl group (substituted alkyl group) having a substituent.

The "radiation" in this specification includes visible light, ultraviolet rays, far ultraviolet rays, electron beams, X-rays and the like.

Description of the configuration requirements described below may be made on the basis of representative embodiments of the present invention, but the present invention is not limited to such embodiments. Note that the numerical range expressed by using the word "to" in this specification represents a range including the numerical value before the word "to" as the lower limit and the numerical value after the word "to" as the upper limit.

Note that, in this specification, "(meth) acrylate" represents an acrylate and methacrylate, "(meth) acrylic" represents acrylic and methacrylic, "(meth) acryloyl" represents acryloyl and methacryloyl. A monomer in the present invention is distinguished from an oligomer and a polymer and refers to a compound having the mass average molecular weight of less than or equal to 2,000. In this specification, a polymerizable compound refers to a compound having a polymerizable group, and may be a monomer or a polymer. The polymerizable group refers to a group involved in a polymerization reaction.

The dispersion composition for forming the light-shielding layer 11 contains (A) a black colorant (preferably titanium black or carbon black), (B) a dispersant (for example, a polymer compound having a structural unit having a graft chain and a hydrophobic structural unit which differs from the structural unit having the graft chain), and (C) a solvent. With the use of this dispersion composition, the dispersion composition with high dispersibility, high storage stability, and high coating properties is obtained.

The polymerizable composition for forming the light-shielding layer 11 also contains the above-described dispersion composition, (D) a polymerizable compound, and (E) a polymerization initiator. With the use of this polymerizable composition, a pattern in which a residue in an unexposed portion is inhibited is formed in a case where a pattern formation is performed by an exposure process described below. Also, the development margin and the development latitude in the pattern formation are improved. Here, the high development margin means that the exposed portion is likely to remain at the time of the pattern formation because it is difficult to peel off the exposed portion with a developer, and hence a desired pattern is likely to be obtained. The high development latitude means that the duration of time before the formed pattern is peeled off by the developer is long.

<(A) Black Colorant>

Various types of known black pigments and black dyes may be used as black colorants. More specifically, carbon black, titanium black, titanium oxide, iron oxide, manganese oxide, graphite, and the like are preferred from the viewpoint of achieving high optical density with a small amount. Of those, in particular, at least one of the carbon black and the titanium black is preferably contained. Especially, the titanium black is preferred.

Carbon black disclosed in paragraphs [0020] to [0024] in Japanese Patent Unexamined Application Publication No. 2006-301101 may be used as the above-mentioned carbon black.

The above-mentioned titanium black is black particles having titanium atoms, preferably lower titanium oxide, titanium oxynitride, or the like. The surfaces of titanium black particles may be modified as necessary for the purpose of improving dispersibility or inhibiting aggregation, and may be coated with silicon oxide, titanium oxide, germanium oxide, aluminum oxide, magnesium oxide, zirconium oxide, or the like. It is also possible to process the surfaces with a water-repellent substance such as those described in Japanese Patent Unexamined Application Publication No. 2007-302836.

Methods for manufacturing the titanium black are as follows: a method in which a mixture of titanium dioxide and metallic titanium is heated in a reducing atmosphere and reduced (Japanese Patent Unexamined Application Publication No. 49-5432), a method in which ultrafine titanium dioxide obtained by high temperature hydrolysis of titanium tetrachloride is reduced in a reducing atmosphere containing hydrogen (Japanese Patent Unexamined Application Publication No. 57-205322), a method in which titanium dioxide or titanium hydroxide is reduced in high temperature in the presence of ammonia (Japanese Patent Unexamined Application Publication Nos. 60-65069 and 61-201610), a method in which a vanadium compound is deposited to titanium dioxide or titanium hydroxide and high-temperature reduction is performed in the presence of ammonia (Japanese Patent Unexamined Application Publication No. 61-201610), but the methods are not limited thereto.

Typically, the titanium black is titanium black particles. It is preferred that the primary particle diameter of each particle and the average primary particle diameter are small. To be more specific, the average primary particle diameter is preferably in the range of 10 nm to 45 nm, more preferably in the range of 12 nm to 20 nm. Note that the particle diameter (size) in the present invention, that is, the particle diameter refers to the diameter of a circle having an area equal to the projected area of the outer surface of the particle. The projected area of the particle is obtained by measuring the area of the particle taken in an electron micrograph and correcting the magnification. The specific surface area of the titanium black is not particularly limited. Normally, a value measured by BET (Brunauer, Emmet and Teller's) method is preferably in the order of 5 $m^2/g$ to 150 $m^2/g$, and particularly preferably 20 $m^2/g$ to 100 $m^2/g$ so that the water repellency of the titanium black after the surface treatment using the water-repellent agent exhibits a predetermined performance.

Examples of commercially available titanium black include titanium black 10S, 12S, 13R, 13M, 13M-C, 13R, 13R—N, 13M-T (trade name, manufactured by Mitsubishi Materials Corporation), Tilack D (trade name, manufactured by Akokasei Co., Ltd.), and the like.

The surfaces of the titanium black particles may be modified as necessary for the purpose of improving dispersibility, inhibiting aggregation, or the like. As for the modification of the particle surfaces, for example, silicon oxide, titanium oxide, germanium oxide, aluminum oxide, magnesium oxide, zirconium oxide, or the like may be used for coating treatments. Treatments using the water-repellent substances described in the Japanese Patent Unexamined Application Publication No. 2007-302836 may be performed.

Furthermore, it is preferred that the dispersion composition contains the titanium black as a dispersoid containing the titanium black and Si atoms. In this form, it is preferred that the titanium black is contained as the dispersoid in the dispersion composition, and a content ratio (Si/Ti) of the Si atoms and Ti atoms in the dispersoid is greater than or equal to 0.05 in terms of mass. Here, the above-mentioned dispersoid includes both the titanium black in a state of primary particles and the titanium black in a state of aggregates (secondary particles). Note that it is preferred that the upper limit of the content ratio (Si/Ti) of the Si atoms and the Ti atoms in the dispersoid is 0.5 because it tends to be difficult to manufacture a pigment dispersion with the dispersoid in case where the content ratio exceeds 0.5.

In a case where the Si/Ti of the dispersoid is too small, a residue tends to remain in a removal section from which a polymerizable composition layer is removed after the polymerizable composition layer, which will be described below, with the dispersoid is patterned by photolithography or the like. In a case where the Si/Ti of the dispersoid is too large, the light-shielding ability tends to decrease. For these reasons, the Si/Ti of the dispersoid is preferably 0.05 to 0.5 and more preferably 0.07 to 0.4.

To change the Si/Ti of the dispersoid (for example, to 0.05 or more), the following means may be used. First, a dispersion is obtained by dispersing titanium oxide and silica particles with a dispersing machine and then the dispersion is subjected to a reducing process at high temperature (for example, 850 to 1000° C.). Thereby the dispersoid mostly composed of the titanium black particles and containing the Si and the Ti is obtained.

Here, specific examples for changing the Si/Ti in the dispersoid are described. The titanium black with the Si/Ti adjusted to, for example, 0.05 or more is prepared by methods described in, for example, paragraphs [0005] (6) and [0016] to [0021] in Japanese Patent Laid-Open Publication No. 2008-266045.

In the present invention, the content ratio (Si/Ti) between the Si atoms and the Ti atoms in the dispersoid containing the titanium black and the Si atoms is adjusted to a suitable range (for example, 0.05 or more). Thereby, in the case where the light-shielding layer 11 is formed from the composition containing such dispersoid, an amount of the residue, which is derived from the polymerizable composition, remaining on the outside of a region where the light-shielding layer 11 is formed is reduced. Note that the residue contains a component derived from the titanium black particles or photosensitive polymerizable composition such as a resin component.

The reason why the residue decreases has not been clarified yet. The above-mentioned dispersoid tends to have small particle diameter (e.g. the particle diameter of 30 nm or less). The adsorption to the underlying film of the whole light-shielding layer 11 is reduced as the component containing the Si atoms increases in the dispersoid. This is assumed to contribute to improvement of the development removability of uncured polymerizable composition (particularly, the titanium black particles) in the formation of the light-shielding layer 11.

Since the titanium black is excellent in light-shielding properties to light in a wavelength region over a wide range from ultraviolet to infrared, the light-shielding layer 11 formed from the dispersoid containing the titanium black and the Si atoms (preferably with the Si/Ti of 0.05 or more in terms of mass) exhibits excellent light-shielding properties.

Note that the content ratio (Si/Ti) of the Si atoms and the Ti atoms in the dispersoid is measured by using a method (1-1) or a method (1-2) described below.

<Method (1-1)>

A titanium black dispersion or a polymerizable composition containing a titanium black dispersion liquid and a polymerizable compound was heated in an oxygen atmosphere, and the dispersoid containing the titanium black, being the black colorant (A), and the Si atoms was taken out.

20 mg of the titanium black dispersion or the polymerizable composition was weighed, and 0.1 mL of HF, 1 mL of $HNO_3$ (10% aq.), 1 mL of $H_2SO_4$ (5% aq.), and 1 mL of HCL (3% aq.) were added thereto, and then this liquid dispersion is subjected to microwave dissolution. At this time, the liquid temperature was 180° C. Note that "aq." denotes aqueous solution.

Thereafter, $H_2O$ was added to the liquid dispersion until it reaches 100 ml, and then the liquid dispersion was subjected to ICP-OES (trade name: Attom, manufactured by SII Co.) for performing elemental analysis. From the results obtained, the mass ratio of Si/Ti is calculated.

<Method (1-2)>

Titanium black dispersion, or a polymerizable composition containing a polymerizable compound and the titanium black dispersion was heated to 700° C. in an oxygen atmosphere with a small rotary kiln (a product of Motoyama, Ltd.) and the temperature was maintained for 30 minutes, and then cooled. Thereby 2 g of powder was obtained. The obtained powder is placed on a tungsten plate with the thickness of 0.2 mm. The tungsten plate is set in a vacuum chamber equipped with an electron beam heating mechanism. The degree of vacuum is $10^{-5}$ Torr or less. The heat treatment was performed by electron beam heating for 30 seconds at 1000° C. Based on the powder subjected to the heat treatment, the Si atomic weight and the Ti atomic weight were obtained using field emission scanning electron microscope S-4800 (trade name, manufactured by Hitachi Technologies) and energy dispersive X-ray fluorescence detector INCA Energy PentaFETx3 (trade name, manufactured by Oxford Co.), to calculate the Si/Ti ratio.

As for the dispersoid contained in the cured film (the polymerizable composition layer) that is obtained by curing the polymerizable composition, a method (2) described below is used to determine whether the content ratio (Si/Ti) between the Si atoms and the Ti atoms in the dispersoid is 0.05 or more.

<Method (2)>

A cross-section of the polymerization composition layer is formed by dividing the substrate on which the polymerization composition layer is formed. The Si atomic weight and the Ti atomic weight in the surface of the polymerizable composition layer with respect to the cross-section are obtained using an energy dispersive X-ray fluorescence analyzer. A ratio between these quantities is evaluated as Si/Ti in the polymerizable composition layer. As for the energy dispersive X-ray fluorescence analysis in this case, S-4800 (trade name) manufactured by Hitachi High-Technologies Co., Ltd. is used as the scanning electron microscope and INCA Energy PentaFETx3 (trade name) manufactured by Oxford Inc. is used as an energy dispersive X-ray fluorescence detector as with the above.

In the dispersoid containing the titanium black and the Si atoms, the above-mentioned titanium black can be used. Further, in the dispersoid, one or two or more types of composite oxides such as Cu, Fe, Mn, V, and Ni, cobalt oxide, iron oxide, a black pigment composed of carbon black, aniline black, or the like may be combined with the titanium black as the dispersoid, for the purpose of adjusting dispersibility, coloration properties, and the like. In this case, it is preferred that the dispersoid composed of the titanium black occupies 50 mass % or more of the whole dispersoid.

Further, in the dispersoid, another colorant (such as an organic pigment or dye) may be used together with the black colorant as desired for the purpose of adjusting light-shielding properties as long as the colorant does not impair the effects of the present invention.

The following describes the materials used in introducing the Si atoms in the dispersoid. In order to introduce the Si atoms in the dispersoid, an Si-containing material such as silica may be used. The silica used in the present invention may be precipitated silica, fumed silica, colloidal silica, synthetic silica, or the like and is selected as appropriate. The silica is also commercially available. Examples of the silica particles include HS-101, HS-102, HS-103, HS-104, HS-105, HS-106, HS-107, HS-201, HS-202, HS-203, HS-204, HS-205, HS-301, HS-302, HS-303, HS-304, HS-305 (trade name) manufactured by Nippon Steel Materials Ltd.; Haipureshika SS, Haipureshika TS, Haipureshika BS, Haipureshika SP, and Haipureshika FQ (trade name) manufactured by Ube-Nitto Kasei; CAB-O-SIL (registered trademark) LM-150, CAB-O-SIL (registered trademark) LM-150, and CAB-O-SIL (registered trademark) S-17D manufactured by Cabot.

It is preferred to use fine-particle type silica as the silica particles because the light-shielding properties decrease in the case where the particle diameter of the silica particles is substantially the same as the thickness of the light-shielding layer 11. The examples of the fine-particle type silica include, for example, AEROSIL (registered trademark) 90, AEROSIL (registered trademark) 130, AEROSIL (registered trademark) 150, AEROSIL (registered trademark) 200, AEROSIL (registered trademark) 300, AEROSIL (registered trademark) 380, AEROSIL (registered trademark) OX 50, AEROSIL (registered trademark) EG 50, AEROSIL (registered trademark) TT 600, AEROSIL (registered trademark) 200 SP, AEROSIL (registered trademark) 300 SP, AEROPERL (registered trademark) 300/30, AEROSIL (registered trademark) R 972, AEROSIL (registered trademark) R 974, AEROSIL (registered trademark) R 104, AEROSIL (registered trademark) R 106, AEROSIL (registered trademark) R 202, AEROSIL (registered trademark) R805, AEROSIL (registered trademark) R 812, AEROSIL (registered trademark) R 812 S, AEROSIL (registered trademark) R 816, AEROSIL (registered trademark) R 7200, AEROSIL (registered trademark) R 8200, AEROSIL (registered trademark) R 9200, AEROSIL (registered trademark) MOX 80, AEROSIL (registered trademark) MOX 170, AEROSIL (registered trademark) COK 84, AEROSIL (registered trademark) RY 50, AEROSIL (registered trademark) NY 50, AEROSIL (registered trademark) RY 200, AEROSIL (registered trademark) RY 200, AEROSIL (registered trademark) RX 50, AEROSIL (registered trademark) NAX 50, AEROSIL (registered trademark) RX 200, AEROSIL (registered trademark) RX 300, AEROSIL (registered trademark) R 504, AEROPERL (registered trademark) 300/30, VPAEROPERL (registered trademark) P 25/20M05; S6, MA1004 (trade name, the same hereinafter), MA1006, MA1010, MA1013, MX030W, MX050W, MX100W, KE-E30, KE-E40, KE-E50, KE-E70, KE-E150, KE-P10, KE-P30, KE-P50, KE-P100, KE-P150, KE-P250 manufactured by SHOKUBAI KASEI Co.; HS-101 (trade name, the same hereinafter), HS-102, HS-103, HS-104, HS-105, HS-106, HS-107, HS-201, HS-202, HS-203, HS-204, HS-205, HS-301, HS-302, HS-303, HS-304, and HS-305 manufactured by Nippon Steel Materials; Haipureshika SS (trade name, the same hereinafter), Haipureshika TS, Haipureshika BS, Haipureshika SP, and Haipureshika FQ manufactured by Ube-Nitto Kasei Co., Ltd.; CAB-O-SIL (registered trademark, the same hereinafter) LM-150, CAB-O-SIL LM-150, and CAB-O-SIL S-17D manufactured by Cabot, but are not limited thereto.

The dispersion composition and the polymerizable composition may contain only one type of titanium black or two or more types of titanium black.

The content of the titanium black, with respect to the total solid content of the dispersion composition, is preferably in a range of 20 mass % to 94 mass %, more preferably in a range of 40 mass % to 92 mass %, and still more preferably in a range of 40 mass % to 80 mass %.

The content of the titanium black, with respect to the total solid content of the polymerizable composition, is preferably in a range of 5 mass % to 80 mass %, more preferably in a range of 10 mass % to 70 mass %, and still more preferably in a range of 20 mass % to 60 mass %. In the case where the content of the titanium black is within the above range, the curability of the polymerizable composition is excellent and a uniform film is formed.

The light-shielding layer 11 having sufficient light-shielding properties is formed with a content of the titanium black in high concentration.

<(A') Pigments Other than Titanium Black>

In addition to the titanium black, an extender pigment may be added as necessary to the dispersion composition or the polymerizable composition of the present invention. Examples of the extender pigments include barium sulfate, barium carbonate, calcium carbonate, silica, basic magnesium carbonate, alumina white, gloss white, titanium white, and hydrotalcite. These extender pigments can be used singly or in combination of two or more. Normally, the amount of the extender pigment is 0 to 100 parts by mass, preferably 5 to 50 parts by mass, and more preferably 10 to 40 parts by mass, with respect to 100 parts by mass of the titanium black. In the present invention, the surfaces of the above-mentioned titanium black and extender pigments may be optionally modified with a polymer.

In the dispersion composition and the polymerizable composition of the present invention, a substance other than the titanium black may be used as a light-shielding pigment. Such light-shielding pigment to be dispersed is not particularly limited as long as it has an absorbance in the visible range.

Examples of such pigments include the above-mentioned extender pigments, the carbon black, the following organic pigments, and the like.

<Organic Pigments>

An organic pigment described in paragraphs [0031] to [0033] of Japanese Patent Unexamined Application Publication No. 2011-057964 may be used as the organic pigment of the present invention. A pigment chosen from red organic pigments, yellow organic pigments, violet organic pigments, orange organic pigments, brown organic pigments, and black organic pigments may be used. Examples of the red organic pigments include C. I. Pigment, Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279. Examples of the violet organic pigments include C. I. Pigment Violet 1, 2, 19, 23, 27, 29, 32, 37, and 42.

Examples of the yellow organic pigments include C. I. Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214.

Examples of the orange pigments include C. I. Pigment Orange 2, 5, 13, 16, 17:1, 31, 34, 36, 38, 43, 46, 48, 49, 51, 52, 55, 59, 60, 61, 62, 64, 71, and 73.

Of the organic pigments, preferred are diketopyrrolopyrrole-based pigments, perylene-based pigments, benzimidazolone-based pigments, perinone-based pigments, naphthol-AS-based pigments, anthraquinone-based pigments, pyrazolone-based pigments, or isoindolinone-based pigments and more preferred are the diketopyrrolopyrrole-based pigments, the perylene-based pigments, the naphthol-AS-based pigments, and the anthraquinone-based pigments from the viewpoint of not impairing light transmittance in a short wavelength range (especially less than or equal to 400 nm) and of improving the light-shielding properties in the visible range. In particular, preferred are the C. I. Pigment Red 122, 150, 171, 175, 177, 209, 224, 242, 254, 255, 264; the C. I. Pigment Yellow 11, 24, 108, 109, 110, 138, 139, 150, 151, 154, 167, 180, 185; and the C. I. Pigment Orange 36, 38, 43, 64, and 71.

<Pigments Other than Those Described Above>

In addition to the above-described pigments, an organic pigment of a different color such as green, blue, or black, or an extender pigment may be used as necessary for the purpose of adjusting the light transmittance in a light-transmitting region and a light-shielding region, or the like. Examples of the organic pigments of different colors include C. I. Pigment Green 7, 10, 36, 37, 58; C. I. Pigment Blue 1, 2, 15, 15:1, 15:2, 15:3, 15:4, 15:6, 16, 22, 60, 64, 66, 79, 80; C. I. Pigment Brown 25, 28; and C. I. Pigment Black 1 and 7.

Examples in which a light-shielding pigment other than the titanium black is mixed include a mixture of the titanium black and the carbon black in proportions of 6:1 and a mixture of the titanium black and the titanium oxide in proportions of 3:1. The light-shielding pigment (other than the titanium black) to be mixed is used in a range of 0.01 to 99.99 parts by mass with respect to the titanium black of 100 parts by mass, more preferably, in a range of 20 to 70 parts by mass.

<(B) Dispersant>

A dispersant (B) is preferably a dispersant composed of polymer compound (B1), more preferably a polymer compound containing a structural unit having a graft chain and a hydrophobic structural unit different from the structural unit having the graft chain.

Examples of the polymer compounds (B1) include polymeric dispersants (for example, polyamidoamine and salts thereof, polycarboxylic acids and salts thereof, high molecular weight unsaturated acid ester, modified polyurethane, modified polyester, modified poly (meth) acrylates, (meth) acrylic copolymers, and naphthalenesulfonic acid-formaldehyde condensate), polyoxyethylene alkyl phosphoric acid esters, polyoxyethylene alkyl amines, alkanolamines, and pigment derivatives.

The polymer compounds (B1) are further classified into linear polymers, terminal-modified polymers, graft polymers, and block polymers based on the structure.

The polymer compound (B1) is held by adsorption on the surfaces of the dispersoid such as the titanium black particles and the pigment optionally used in combination with the titanium black particles, and acts to prevent reaggregation. Therefore, examples of the preferred structures thereof include an end-modified polymer having an anchor site to the pigment surface, a graft polymer, and a block polymer.

On the other hand, by modifying the surfaces of the dispersoid including the titanium black particles or the above-mentioned titanium black and the Si atoms, the adsorption properties of the polymer compound (B1) to the dispersoid may be enhanced.

The polymer compound (B1) has a structural unit having a graft chain as described above. Note that in this specification, the term "structural unit" is synonymous with the term "repeat unit". Such polymer compound (B1) having a structural unit having a graft chain has an affinity for a solvent due to the graft chain, so that the polymer compound (B1) is excellent in dispersibility of the titanium black particles and dispersion stability with time. Owing to the presence of a graft chain, the polymerizable composition has an affinity for a polymerizable compound, resin possibly combined, or the like, so that it is less likely that the alkali development causes a residue.

In a case where a graft chain is long, steric repulsion effect is high and dispersibility is improved. However, in a case where the graft chain is too long, the adsorption force to the titanium black is reduced, so that the dispersibility tends to be lowered. Therefore, the number of atoms excluding hydrogen atoms in the graft chain is preferably in the range of 40 to 10,000, more preferably in the range of 50 to 2000, and still more preferably in the range of 60 to 500. Here, the graft chain refers to a portion from the base (an atom which is in a group branched from the main chain and which is bonded to the main chain) of the main chain of a copolymer to the end of the group which is branched from the main chain.

It is preferred that the graft chain has a polymer structure. Examples of the polymer structures include a polyacrylate structure (e.g. a poly (meth) acrylic structure), a polyester structure, a polyurethane structure, a polyurea structure, a polyamide structure and a polyether structure.

In order to improve the interaction of the graft sites and a solvent, and to thereby increase the dispersibility, it is preferred that the graft chain has at least one structure selected from a group consisting of the polyester structure, the polyether structure, and the polyacrylate structure. It is more preferred that the graft chain has at least one of the polyester structure and the polyether structure.

The structure of a macromonomer having such a polymer structure in the form of a graft chain is not particularly limited as long as it has a substituent capable of reacting with a polymer main chain unit and meets the requirements of the present invention. It is preferred to use a macromonomer with a reactive double bond group.

Examples of commercially available macromonomers which correspond to the structural unit having a graft chain of the polymer compound (B1) and which are suitable for use in the synthesis of the polymer compound (B1) include AA-6 (trade name, (trade name, TOAGOSEI Co., Ltd.), AA-10 (trade name, manufactured by TOAGOSEI CO., Ltd.), AB-6 (trade name, manufactured by TOAGOSEI Co., Ltd.), AS-6 (TOAGOSEI Co., Ltd.), AN-6 (trade name, manufactured by TOAGOSEI Co., Ltd.), AW-6 (trade name, manufactured by TOAGOSEI Co., Ltd.), AA-714 (trade name, manufactured by TOAGOSEI Co., Ltd.), AY-707 (trade name, manufactured by TOAGOSEI Co., Ltd.), AY-714 (trade name, manufactured by TOAGOSEI Co., Ltd.), AK-5 (trade name, manufactured by TOAGOSEI Co., Ltd.), AK-30 (trade name, manufactured by TOAGOSEI Co., Ltd.), AK-32 (trade name, manufactured by TOAGOSEI Co., Ltd.), BLEMMER PP-100 (trade name, manufactured by NOF Co., Ltd.), BLEMMER PP-500 (trade name, NOF Corporation), BLEMMER PP-800 (trade name, manufactured by NOF Co., Ltd.), BLEMMER PP-1000 (trade name, manufactured by NOF Co., Ltd.), BLEMMER 55-PET-800 (manufactured by NOF Co., Ltd.), BLEMMER PME-4000 (trade name, manufactured by NOF Co., Ltd.), BLEMMER PSE-400 (trade name, manufactured by NOF Co., Ltd.), BLEMMER PSE-1300 (trade name, manufactured by NOF Co., Ltd.), BLEMMER 43PAPE-600B (trade name, manufactured by NOF Co., Ltd.), and the like. Of those, the AA-6 (manufactured by TOAGOSEI Co., Ltd.), the AA-10 (trade name, TOAGOSEI Co., Ltd.), the AB-6 (trade name, manufactured by TOAGOSEI Co., Ltd.), the AS-6 (trade name, TOAGOSEI Co., Ltd.), the AN-6 (trade name, manufactured by TOAGOSEI Co. Ltd.), and BLEMMER PME-4000 (trade name, manufactured by NOF Co., Ltd.), are preferably used.

The polymer compound (B1) preferably contains a structural unit represented by any one of the following formulas (1) to (4) as the structural unit having a graft unit, more preferably a structural unit represented by any one of the following formulas (1A), (2A), (3A), (3B), and (4).

[Chemical formula 1]

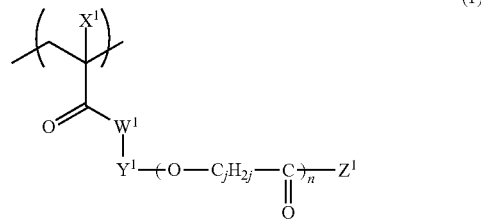

(1)

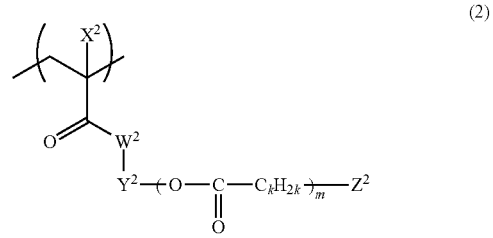

(2)

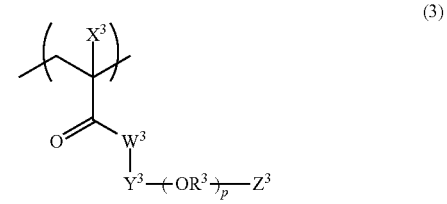

(3)

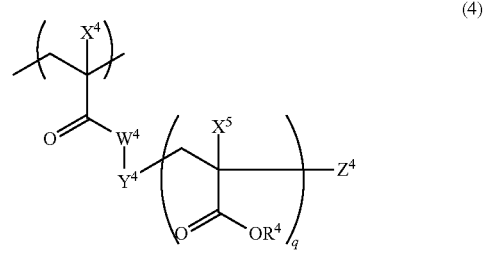

(4)

In the formulas (1) to (4), each of $W^1$, $W^2$, $W^3$, and $W^4$ independently represents an oxygen atom or NH. It is preferred that $W^1$, $W^2$, $W^3$, and $W^4$ is an oxygen atom.

In the formulas (1) to (4), each of $X^1$, $X^2$, $X^3$, $X^4$, and $X^5$ independently represents a hydrogen atom or a monovalent organic group. In terms of constraints of synthesis, it is preferred that each of $X^1$, $X^2$, $X^3$, $X^4$, and $X^5$ independently represents a hydrogen atom or an alkyl group with the number of carbon atoms from 1 to 12. It is more preferred that each of $X^1$, $X^2$, $X^3$, $X^4$, and $X^5$ independently represents a hydrogen atom or a methyl group. The methyl group is particularly preferred.

In the formulas (1) to (4), each of $Y^1$, $Y^2$, $Y^3$, and $Y^4$ independently represents a divalent linking group, and the linking group is not particularly limited structurally. Specific examples of the divalent linking groups represented by $Y^1$, $Y^2$, $Y^3$, and $Y^4$ include the following linking groups represented by (Y-1) to (Y-21). In the structures shown below, A and B denote binding sites to a left terminal group and a right terminal group, respectively, in the formulas (1) to (4). Of the structures shown below, (Y-2) or (Y-13) is more preferred in terms of easy synthesis.

[Chemical formula 2]

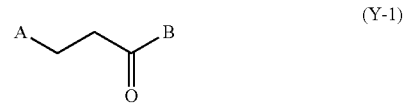

(Y-1)

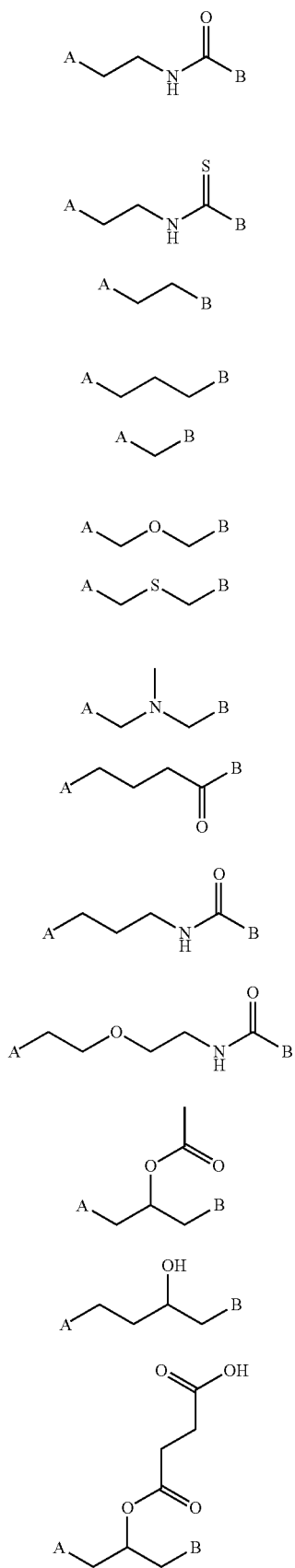
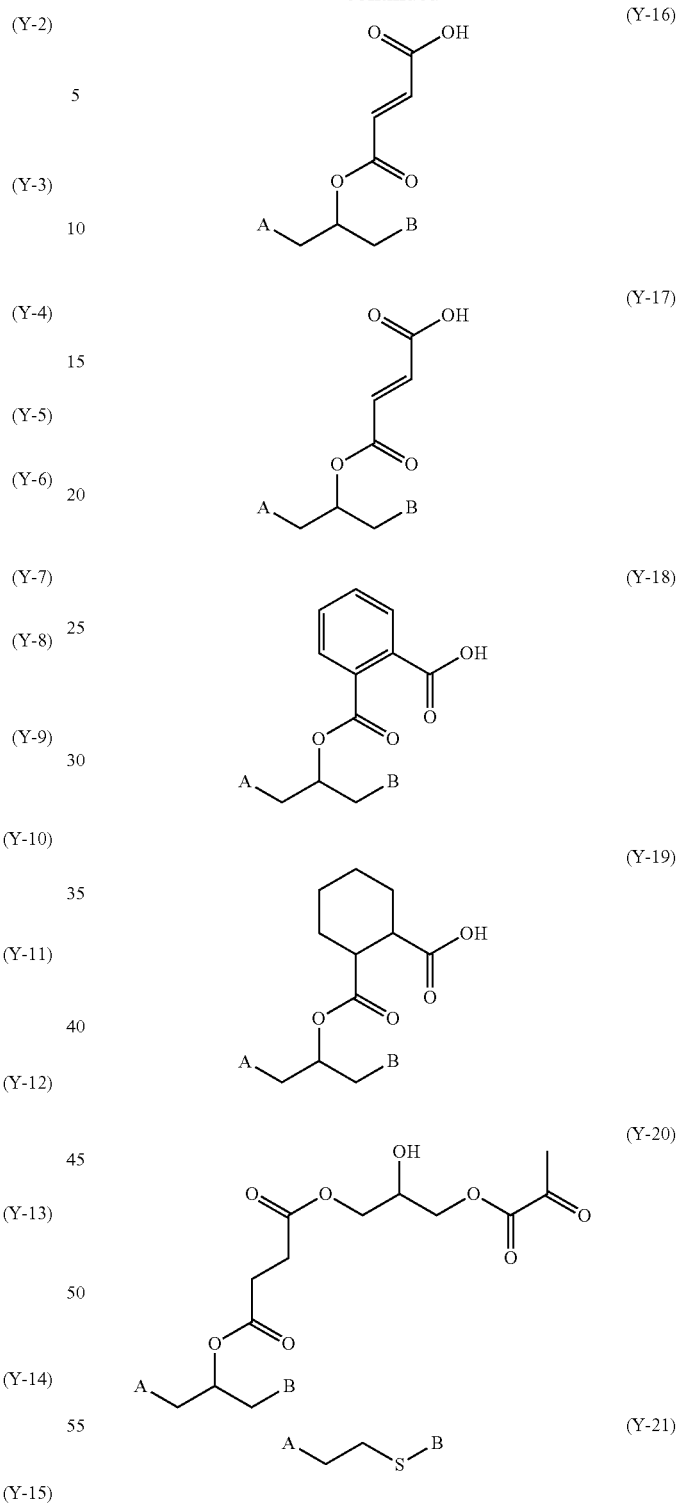

In the formulas (1) to (4), each of $Z^1$, $Z^2$, $Z^3$, and $Z^4$ independently represents a monovalent organic group. The structure of the organic group is not particularly limited. Specific examples of the organic groups include an alkyl group, a hydroxyl group, an alkoxy group, an aryloxy group, a heteroaryl oxy group, an alkyl thioether group, an aryl thioether group, a heteroarylthioether group, and an amino group. Of those, ones having the steric repulsion effect are preferred as the organic groups represented by $Z^1$, $Z^2$, $Z^3$, and $Z^4$ from the viewpoint of improving the dispersibility. It is preferred that each of $Z^1$, $Z^2$, $Z^3$, and $Z^4$ independently represents an alkyl group with the number of carbon atoms from 5 to 24. Of those, it is particularly preferred that each of $Z^1$, $Z^2$, $Z^3$, and $Z^4$ independently represents a branched alkyl group or a cyclic alkyl group with the number of carbon atoms from 5 to 24.

In the formulas (1) to (4), each of n, m, D and q denotes an integer of 1 to 500. In the formulas (1) and (2), each of j and k independently denotes an integer of 2 to 8. Each of j and k in the formulas (1) and (2) preferably denotes an integer of 4 to 6, most preferably 5, from the viewpoint of dispersion stability and development properties.

In the formula (3), $R^3$ represents a branched or straight chain alkylene group, preferably an alkylene group having 1 to 10 carbon atoms, and more preferably an alkylene group having 2 or 3 carbon atoms. In a case where p is 2 to 500, two or more $R^3$ present may be the same or different from each other.

In the formula (4), $R^4$ represents a hydrogen atom or a monovalent organic group. The monovalent organic group is not particularly limited structurally. Examples of $R^4$ preferably include a hydrogen atom, an alkyl group, an aryl group, and a heteroaryl group, and $R^4$ is more preferably a hydrogen atom or an alkyl group. In a case where $R^4$ is an alkyl group, a linear alkyl group having 1 to 20 carbon atoms, a branched alkyl group having 3 to 20 carbon atoms, or a cyclic alkyl group having 5 to 20 carbon atoms is preferred. A linear alkyl group having 1 to 20 carbon atoms is more preferred. A linear alkyl group having 1 to 6 carbon atoms is particularly preferred. In the formula (4), in a case where q is 2 to 500, $X^5$ and $R^4$, a plurality of each present in a graft copolymer, may be the same or different from each other.

In the polymer compound (B1), the structural units represented by the formulas (1) to (4) are preferably contained in a range of 10% to 90% in terms of mass with respect to the total mass of the polymer compound (B1), more preferably in a range of 30% to 70%. In the case where the structural units represented by the formulas (1) to (4) are contained within this range, the dispersibility of the titanium black particles is high and the development properties at the time of forming the light-shielding layer 11 is excellent.

The polymer compound (B1) may have two or more types of structural units which differ from each other in structure and each having a graft polymer. In other words, the structural units represented by the formulas (1) to (4), which differ from each other in structure, may be contained in molecules of the polymer compound (B1). In the formulas (1) to (4), in a case where each of n, m, p, and q denotes an integer greater than or equal to 2, j and k may contain different structures in the side chains of the formulas (1) and (2), respectively. In the formulas (3) and (4), a plurality of $R^3$, $R^4$, and $R^5$, which are present in the molecules, may be the same or different from each other.

As for the structural unit represented by the above-described formula (1), a structural unit represented by the following formula (1A) is more preferred from the viewpoint of dispersion stability and development properties. As for the structural unit represented by the above-described formula (2), a structural unit represented by the following formula (2A) is more preferred from the viewpoint of dispersion stability and development properties.

[Chemical formula 3]

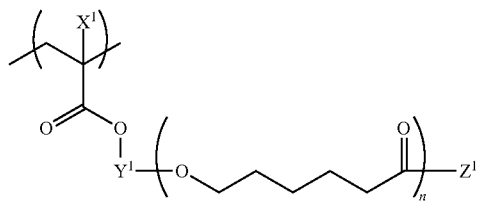

(1A)

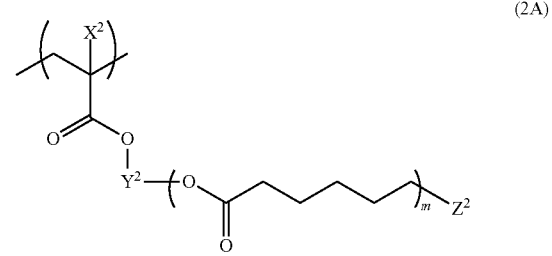

(2A)

In the formula (1A), $X^1$, $Y^2$, $Z^2$ and n are synonymous with $X^1$, $Y^2$, $Z^2$ and n in the above formula (1), and the preferred ranges are the same. In the formula (2A), $X^2$, $Y^2$, $Z^2$ and m are synonymous with $X^2$, $Y^2$, $Z^2$ and m in the above formula (2), and the preferred ranges are the same.

As for the structural unit represented by the above formula (3), a structural unit represented by a formula (3A) or (3B) described below is more preferred from the viewpoint of dispersion stability and development properties.

[Chemical formula 4]

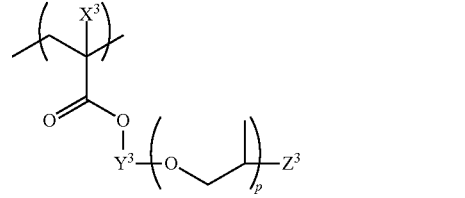

(3A)

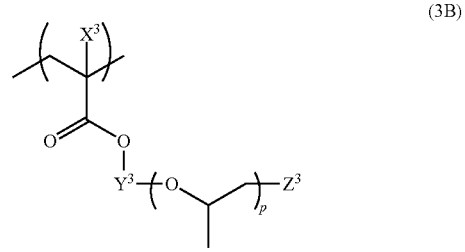

(3B)

In the formula (3A) or (3B), $X^3$, $Y^3$, $Z^3$ and p are synonymous with $X^3$, $Y^3$, $Z^3$ and p in the formula (3), and the preferred ranges are the same.

It is more preferred that polymer compound (B1) has the structural unit represented by the above formula (1A) as the structural unit having a graft polymer.

In the polymer compound (B1), it is preferred that the structural unit having a graft polymer is contained in a range of 10% to 90%, in terms of mass, with respect to the total mass of the polymer compound (B), and more preferably 30% to 70%. In the case where the structural unit having a graft chain is contained within this range, the dispersibility of the titanium black particles is high and the development properties at the time of forming the light-shielding layer 11 is excellent.

As described above, the polymer compound (B1) has a hydrophobic structural unit which differs from the structural unit having a graft chain (that is, which does not correspond to the structural unit having a graft chain). In the present invention, the hydrophobic structural unit is a structural unit with no acid group (e.g. a carboxylic acid group, a sulfonic acid group, a phosphate group, a phenolic hydroxyl group, or the like).

The hydrophobic structural unit is preferably a structural unit which is derived from (corresponds to) a compound (monomer) having the ClogP value of 1.2 or more, and more preferably a structural unit derived from a compound having the ClogP value of 1.2 to 8. Thereby, the effects of the present invention are expressed with more reliability.

A ClogP value is a value calculated by the program "CLOGP", which is available from Daylight Chemical Information System, Inc. This program provides values of "calculated logP" calculated using Hansch and Leo's fragment approach (see documents below). The fragment approach is based on the chemical structure of a compound, and divides the chemical structure into partial structures (fragments) and sums the logP contribution allocated to each fragment. Thereby the logP value of the compound is estimated. The details thereof are described in the following documents. In the present invention, the ClogP values calculated by the program CLOGP v4.82 are used.

A. J. Leo, Comprehensive Medicinal Chemistry, Vol. 4, C. Hansch, P. G. Sammnens, J. B. Taylor andC. A. Ramsden, Eds., p. 295, Pergamon Press, 1990 C. Hansch &A. J. Leo. Substituent Constants For Correlation Analysis in Chemistry and Biology. John Wiley & Sons. A. J. Leo. Calculating logPoct from structure. Chem. Rev., 93, 1281-1306, 1993.

The term logP refers to the common logarithm of a partition coefficient P. The logP is a physical value representing how an organic compound is distributed in an equilibrium of the two-phase system of oil (typically 1-octanol) and water in a quantitative numeric value. The logP is expressed in the following expression.

$$\log P = \log(Coil/Cwater)$$

In the expression, Coil represents the molar concentration of the compound in the oil phase, and Cwater represents the molar concentration of the compound in the aqueous phase. Oil solubility increases as the value of logP crosses zero and increases in the positive direction and water solubility increases as an absolute value increases in the negative direction. The logP has a negative correlation with the water-solubility of the organic compound and is widely used as a parameter for estimating the hydrophilic or hydrophobic properties of an organic compound.

It is preferred that the polymer compound (B1) has at least one type of structural unit, being the hydrophobic structural unit, selected from the structural units derived from monomers represented by the following formulas (i) to (iii).

[Chemical formula 5]

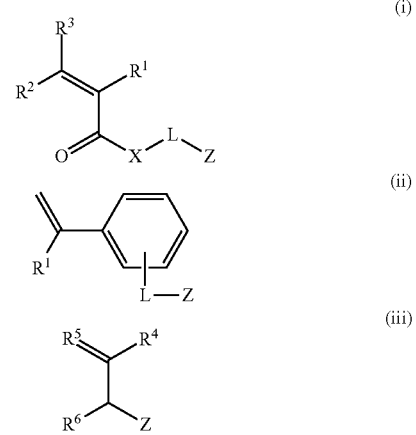

In the above formulas (i) to (iii), each of $R^1$, $R^2$, and $R^3$ independently represents a hydrogen atom, a halogen atom (e.g. fluorine, chlorine, bromine, or the like), or an alkyl group (e.g. a methyl group, an ethyl group, a propyl group, or the like) having 1 to 6 carbon atoms.

Each of $R^1$, $R^2$, and $R^3$ is more preferably a hydrogen atom or an alkyl group having 1 to 3 carbon atoms, most preferably a hydrogen atom or a methyl group. It is particularly preferred that each of $R^2$ and $R^3$ is a hydrogen atom. X represents an oxygen atom (—O—) or an imino group (—NH—), and is preferably an oxygen atom.

L is a single bond or a divalent linking group. Examples of the divalent linking groups include a divalent aliphatic group (e.g. an alkylene group, a substituted alkylene group, an alkenylene group, a substituted alkenylene group, alkynylene group, or a substituted alkynylene group), a divalent aromatic group (e.g. an arylene group or a substituted arylene group), a divalent heterocyclic group, and a combination of one of the above and an oxygen atom (—O—), a sulfur atom (—S—), an imino group (—NH—), a substituted imino group (—NR$^{31}$—, wherein R$^{31}$ is an aliphatic group, an aromatic group, or a heterocyclic group) or a carbonyl group (—CO—).

The divalent aliphatic group may have a cyclic structure or a branched structure. The number of carbon atoms in the aliphatic group is preferably 1 to 20, more preferably 1 to 15, and still more preferably 1 to 10. The aliphatic group may be a saturated aliphatic group or an unsaturated aliphatic group, but is preferably a saturated aliphatic group. Further, the aliphatic group may have a substituent. Examples of the substituents include a halogen atom, an aromatic group, and a heterocyclic group.

The number of carbon atoms in the divalent aromatic group is preferably 6 to 20, more preferably 6 to 15, and most preferably 6 to 10. The aromatic group may have a substituent. Examples of the substituents include a halogen atom, an aliphatic group, an aromatic group, and a heterocyclic group.

The divalent heterocyclic group preferably has a 5- or 6-membered ring as the hetero ring. Another heterocyclic ring, an aliphatic ring, or an aromatic ring may be condensed with the heterocyclic ring. The heterocyclic group may have a substituent. Examples of the substituents include a halogen atom, a hydroxy group, an oxo group (=O), a thioxo group (=S), an imino group (=NH), a substituted imino group (=N—R$^{32}$, wherein R$^{32}$ represents an aliphatic group, an aromatic group, or a heterocyclic group), an aliphatic group, an aromatic group, and a heterocyclic group.

L is preferably a single bond or a divalent linking group containing an alkylene group or an oxyalkylene structure. The oxyalkylene structure is more preferably an oxyethylene structure or an oxypropylene structure. Furthermore, L may contain a polyoxyalkylene structure containing two or more repeating oxyalkylene structures. The polyoxyalkylene structure is preferably a polyoxyethylene structure or a polyoxypropylene structure. The polyoxyethylene structure is represented by —(OCH$_2$CH$_2$)n-, and n is preferably an integer of 2 or more, and more preferably an integer of 2 to 10.

Examples of Z include an aliphatic group (e.g. an alkyl group, a substituted alkyl group, an unsaturated alkyl group, or a substituted unsaturated alkyl group), an aromatic group (e.g. an arylene group or a substituted arylene group), a heterocyclic group, and a combination of one of the above and an oxygen atom (—O—), a sulfur atom (—S—), an imino group (—NH—), a substituted imino group (—NR$^{31}$—, here R$^{31}$ represents an aliphatic group, an aromatic group, or a heterocyclic group), or a carbonyl group (—CO—), and the like.

The above-described aliphatic group may have a cyclic structure or a branched structure. The number of carbon atoms in the aliphatic group is preferably 1 to 20, more preferably 1 to 15, still more preferably 1 to 10. Furthermore a ring assembly hydrocarbon group or a crosslinked cyclic hydrocarbon ring is included. Examples of the ring assembly hydrocarbon groups include bicyclohexyl group, perhydronaphthalenyl group, biphenyl group, and 4-cyclohexyl phenyl group. Examples of the crosslinked cyclic hydrocarbon rings include bicyclic hydrocarbon rings such as pinane, bornane, norpinane, norbornane, bicyclooctane ring (bicyclo [2.2.2] octane ring, bicyclo[3.2. 1] octane ring, and the like), tricyclic hydrocarbon rings such as homobredane, adamantane, tricyclo[5.2.1.0$^{2,6}$] decane, tricyclo[4.3.1.1$^{2,5}$] undecane ring, and tetracyclic hydrocarbon rings such as tetracyclic [4.4.0.1$^{2,5}$.1$^{7,10}$] dodecane, perhydro-1,4-methano-5, 8 methano naphthalene ring and the like. In addition, the crosslinked cyclic hydrocarbon rings include fused cyclic hydrocarbon rings which are multiple fused rings of 5- to 8-membered cycloalkane rings such as perhydronaphthalene (decalin), perhydroanthracene, perhydrophenanthrene, perhydroacenaphthene, perhydrofluorene, perhydroindene, and perhydrophenalene ring.

As for the aliphatic group, saturated aliphatic group is preferred to unsaturated aliphatic group. The aliphatic group may have a substituent. Examples of the substituents include a halogen atom, an aromatic group, and a heterocyclic group. However, the aliphatic group contains no acid group as a substituent.

The number of carbon atoms in the above-mentioned aromatic group is preferably 6 to 20, more preferably 6 to 15, and most preferably 6 to 10. The aromatic group may have a substituent. Examples of the substituents include a halogen atom, an aliphatic group, an aromatic group, and a heterocyclic group. However, the aromatic group has no acid group as a substituent.

The above-mentioned heterocyclic group preferably has a 5- or 6-membered ring as the heterocyclic ring. Another heterocyclic ring, aliphatic ring, or aromatic ring may be condensed with the heterocyclic ring. The heterocyclic group may have a substituent. Examples of the substituents include a halogen atom, a hydroxy group, an oxo group (=O), a thioxo group (=S), an imino group (=NH), a substituted imino group (=N—R$^{32}$, wherein R$^{32}$ is an aliphatic group, an aromatic group, or a heterocyclic group), an aliphatic group, an aromatic group, and a heterocyclic group. However, the heterocyclic group has no acid group as a substituent.

In the formula (iii), each of R$^4$, R$^5$, and R$^6$ independently represents a hydrogen atom, a halogen atom (e.g. fluorine, chlorine, or bromine), an alkyl group with 1 to 6 carbon atoms (e.g. a methyl group, an ethyl group, or a propyl group), Z, or -L-Z. Here, L and Z are synonymous with those defined above. As for R$^4$, R$^5$, and R$^6$, a hydrogen atom or an alkyl group having 1 to 3 carbon atoms is preferred, and an a hydrogen atom is more preferred.

In the present invention, as for a monomer represented by the general formula (i), a compound in which each of R1, R2, and R3 is a hydrogen atom or a methyl group and L is an alkylene group or divalent linking group containing oxyalkylene structure and X is an oxygen atom or an imino group and Z is an aliphatic group, a heterocyclic group, or an aromatic group is preferred.

As for the monomer represented by the general formula (ii), a compound in which R$^1$ is a hydrogen atom or a methyl group and L is an alkylene group and Z is an aliphatic group, a heterocyclic group, or an aromatic group and Y is a methine group is preferred. As for the monomer represented by the general formula (iii), a compound in which each of R4, R5, and R6 is a hydrogen atom or a methyl group and Z is an aliphatic group, a heterocyclic group, or an aromatic group is preferred.

Examples of representative compounds represented by the formulas (i) to (iii) include radical polymerizable compounds selected from acrylic acid esters, methacrylic acid esters, and styrenes.

Specific examples of acrylic acid esters such as alkyl acrylate (preferably having 1 to 20 carbon atoms in the alkyl group) include benzyl acrylate, 4-biphenyl acrylate, butyl acrylate, sec-butyl acrylate, t-butyl acrylate, 4-t-butylphenyl acrylate, octyl acrylate, dodecyl acrylate, 4-chlorophenyl acrylate, pentachlorophenyl acrylate, trifluoromethyl methyl acrylate, tridecane fluoro-hexyl ethyl acrylate 4-cyano benzyl acrylate, cyanomethyl acrylate, cyclohexyl acrylate, 2-ethoxyethyl acrylate, ethyl acrylate, 2-ethylhexyl acrylate, heptyl acrylate, hexyl acrylate, isobornyl acrylate, isopropyl acrylate, methyl acrylate, 3,5-dimethyl adamantyl acrylate, 2-naphthyl acrylate, neopentyl acrylate, fluorenyl acrylate, phenethyl acrylate, phenyl acrylate, propyl acrylate, tolyl acrylate, amyl acrylate, tetrahydrofurfuryl acrylate, allyl acrylate, 2-allyloxyethyl acrylate, propargyl acrylate, adamantyl acrylate, and the like.

Examples of methacrylic acid esters such as alkyl methacrylate (preferably having 1 to 20 carbon atoms in the alkyl group) include benzyl methacrylate, 4-biphenyl methacrylate, butyl methacrylate, sec-butyl methacrylate, t-butyl methacrylate, 4-t-butyl phenyl methacrylate, octyl methacrylate, dodecyl methacrylate, 4-chlorophenyl methacrylate, pentachlorophenyl methacrylate, trifluoromethyl methyl methacrylate, tridecane fluoro-hexyl ethyl methacrylate, 4-cyanophenyl methacrylate, cyanomethyl methacrylate, cyclohexyl methacrylate, 2-ethoxyethyl methacrylate, ethyl methacrylate, 2-ethylhexyl methacrylate, heptyl methacrylate, hexyl methacrylate, isobornyl methacrylate, isopropyl methacrylate, methyl methacrylate, 3,5-dimethyl adamantyl methacrylate, 2-naphthyl methacrylate, neopentyl methacrylate, fluorenyl methacrylate, phenethyl methacrylate, phenyl methacrylate, propyl methacrylate, tolyl methacrylate, amyl methacrylate, tetrahydrofurfuryl methacrylate, allyl methacrylate, 2-allyloxyethyl methacrylate, propargyl methacrylate, adamantyl methacrylate, and the like.

Examples of styrenes include styrenes, alkyl styrenes, alkoxy styrenes, halogenated styrenes, and the like. The examples of the alkyl styrenes include methyl styrene, dimethyl styrene, trimethyl styrene, ethyl styrene, diethyl styrene, isopropyl styrene, butyl styrene, hexyl styrene, cyclohexyl styrene, decyl styrene, benzyl styrene, chloromethyl styrene, trifluoromethyl styrene, ethoxymethyl styrene, acetoxymethyl styrene, and the like. Examples of the alkoxy styrenes include methoxy styrene, 4-methoxy-3-methyl styrene, dimethoxy styrene, and the like. The examples of the halogenated styrenes include chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethyl styrene, 4-fluoro-3-trifluoromethyl styrene, and the like.

Of these radical polymerizable compounds, preferably used are methacrylic acid esters and styrenes. Particularly preferably used are benzyl methacrylate, t-butyl methacrylate, 4-t-butylphenyl methacrylate, pentachlorophenyl methacrylate, 4-cyanophenyl methacrylate, cyclohexyl methacrylate, ethyl methacrylate, 2-ethylhexyl methacrylate, isobornyl methacrylate, isopropyl methacrylate, methyl methacrylate, 3, 5-dimethyl adamantyl methacrylate, 2-naphthyl methacrylate, neopentyl methacrylate, phenyl methacrylate, tetrahydrofurfuryl methacrylate, allyl methacrylate, styrene, methyl styrene, dimethyl styrene, trimethyl styrene, isopropyl styrene, butyl styrene, cyclohexyl styrene, chloromethyl styrene, trifluoromethyl styrene, ethoxymethyl styrene, acetoxymethyl styrene, methoxy styrene, 4-methoxy-3-methyl styrene, chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethyl styrene, 4-fluoro-3-trifluoromethyl styrene, 1-vinyl naphthalene, and 2-vinyl naphthalene.

Of the monomers corresponding to the hydrophobic structural unit, the compounds containing heterocyclic group are as follows.

[Chemical formula 6]

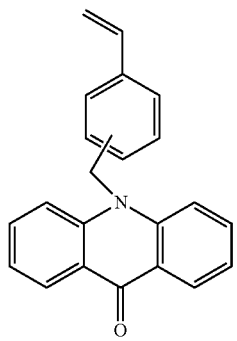

M-1

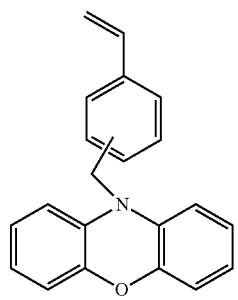

M-2

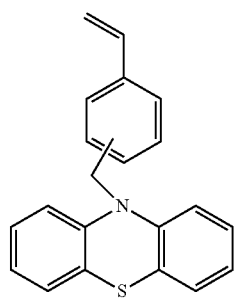

M-3

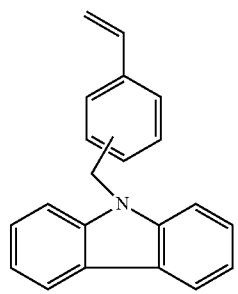

M-4

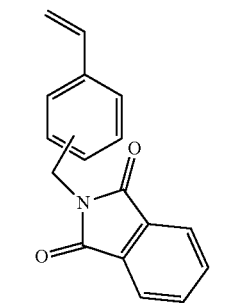

M-5

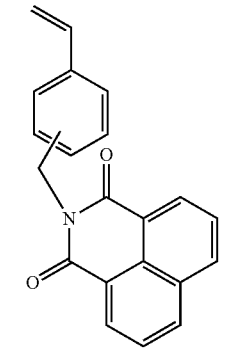

M-6

-continued
M-7
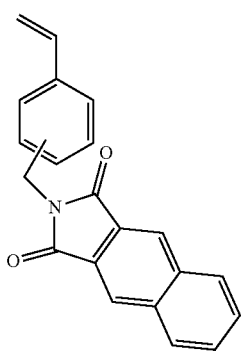
M-8
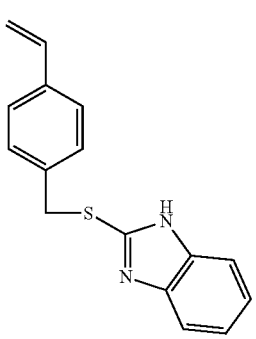
M-9
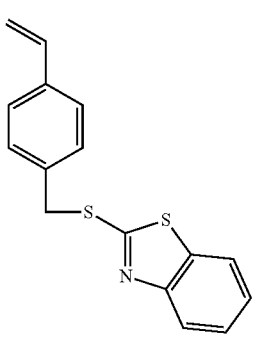
M-10
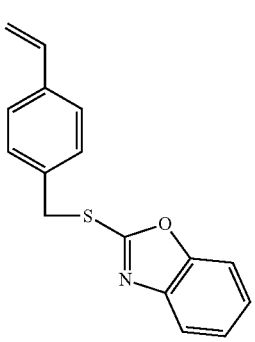
M-11
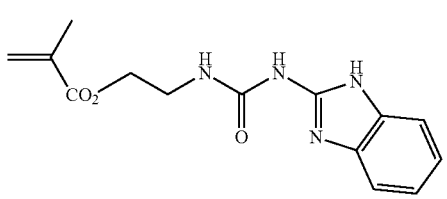
-continued
M-12
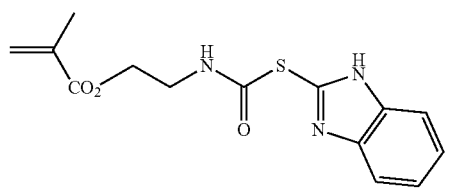
M-13
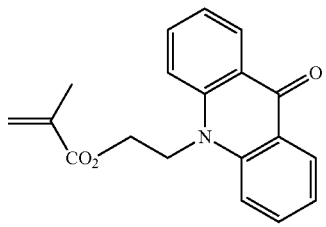
M-14
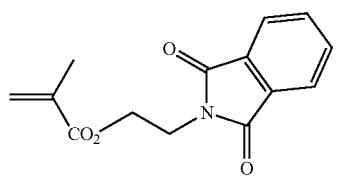
[Chemical formula 7]
M-15
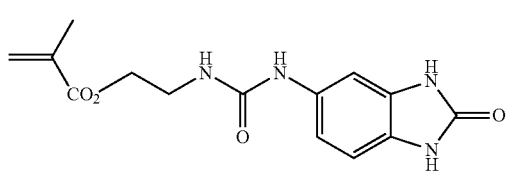
M-16
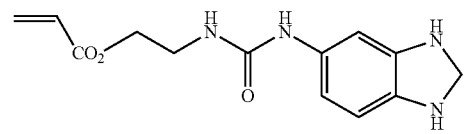
M-17
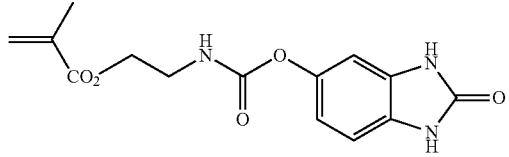
M-18
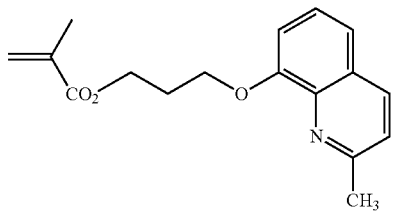
M-19
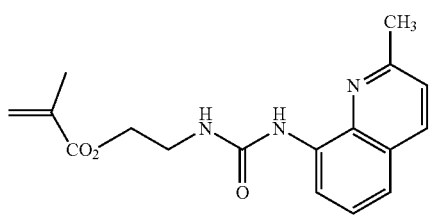

M-20
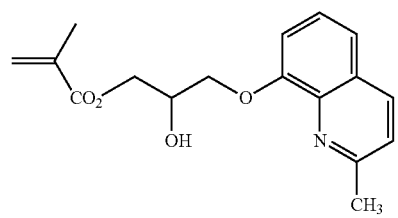

M-21
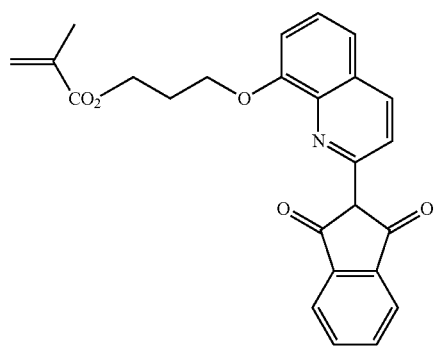

M-22
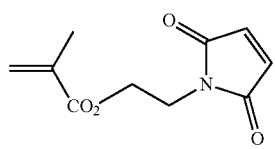

M-23
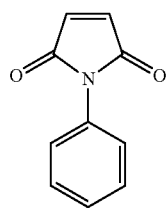

M-24
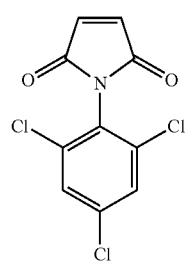

M-25
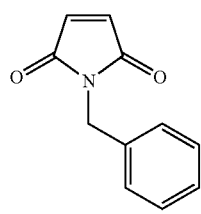

M-26
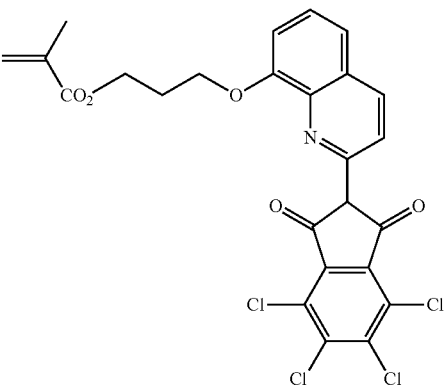

In the polymer compound (B1), it is preferred that the hydrophobic structural unit is contained in a range of 10% to 90%, in terms of mass, with respect to the total mass of the polymer compound (B1), more preferably in a range of 20% to 80%. In the case where the content is within the above-mentioned range, a sufficient pattern formation is achieved.

The polymer compound (B1) is capable of introducing a functional group capable of interacting with the titanium black. Here, it is preferred that the polymer compound (B1) has a structural unit having a functional group capable of interacting with the titanium black. Examples of the functional groups capable of interacting with the titanium black particles include an acid group, a basic group, a coordinating group, and a reactive functional group.

In a case where the polymer compound (B1) or the dispersant (B) has the acid group, the basic group, the coordinating group, or the reactive functional group, it is preferably in a form of a structural unit having the acid group, a structural unit having the basic group, a structural unit having the coordinating group, or a structural unit having the reactivity, respectively. In particular, by further containing an alkali-soluble group, such as a carboxylic acid group, as an acid group, the polymer compound (B1) is provided with developing properties for pattern formation through alkali development. In other words, by introducing the alkali-soluble group to the polymer compound (B1), the polymer compound (B1), being the dispersant indispensable for the dispersion of the titanium black particles, in the dispersion composition of the present invention has alkali-solubility. The polymerizable composition containing such dispersion composition is excellent in light-shielding properties in the exposure step, and improves alkali-developing properties of an unexposed portion.

By having a structural unit having an acid group, the polymer compound (B1) has an affinity for the solvent (C), so that the coating properties also tend to improve. It is assumed that the acid group in the structural unit having the acid group is likely to interact with the titanium black, being the black colorant (A), so that the polymer compound (B1) disperses the titanium black stably. In addition, it is assumed that the viscosity of the polymer compound (B1) for dispersing the titanium black is reduced by the above-described graft chain having the polyester structure, so that the polymer compound (B1) itself is likely to be dispersed stably.

The structural unit having the alkali-soluble group as the acid group may be the same as or different from the above-described structural unit having the graft chain. However, the structural unit having the alkali-soluble group as the acid group differs from the above-described hydrophobic structural unit (i.e. the structural unit having the alkali-soluble group as the acid group does not correspond to the hydrophobic structural unit described above).

Examples of the acid groups, being the functional groups capable of interacting with the titanium black, include a carboxylic acid group, a sulfonic acid group, a phosphate group, and a phenolic hydroxyl group. Preferred is at least one of the carboxylic acid group, the sulfonic acid group, and the phosphate group. Particularly preferred is the carboxylic acid group, which has excellent adsorption force to the titanium black particles and high dispersion properties. In other words, it is preferred that the polymer compound (B1) further contains a structural unit having at least one of the carboxylic acid group, a sulfonic acid group, and a phosphate group.

The polymer compound (B1) may have one or two or more types of structural units having an acid group. The polymer compound (B1) may or may not contain a structural unit having an acid group. In the case where the polymer compound (B1) contains a structural unit having an acid group, a content of the structural unit having an acid group is preferably 5% to 80%, in terms of mass, with respect to the total mass of the polymer compound (B1), more preferably 10% to 60% from the viewpoint of inhibiting damage to image intensity caused by the alkali development described below.

Examples of the basic groups, being the functional groups capable of interacting with the titanium black, include a primary amino group, a secondary amino group, a tertiary amino group, a hetero ring containing N atom, and an amide group. Particularly preferred is the tertiary amino group, which has excellent adsorption force to the titanium black and high dispersibility thereof. The polymer compound (B1) can contain one or more of such basic groups.

The polymer compound (B1) may or may not contain a structural unit having a basic group. In the case where the polymer compound (B1) contains it, the content (in terms of mass) of the structural unit having a basic group, with respect to the total mass of the polymer compound (B1) is preferably 0.01% to 50%, and more preferably 0.01% to 30% from the viewpoint of reducing the development inhibition.

The examples of the coordinating groups, being the functional groups capable of interacting with the titanium black, and the reactive functional groups include an acetylacetoxy group, a trialkoxysilyl group, an isocyanate group, acid anhydride, and acid chloride. Particularly preferred is the acetylacetoxy group, which has excellent adsorption force to the titanium black and high dispersibility. The polymer compound (B1) may have one or more types of these groups.

The polymer compound (B1) may or may not contain a structural unit having a coordinating group or a structural unit having a reactive functional group. In the case where the polymer compound (B1) contains it, the content of the structural unit, in terms of mass, with respect to the total mass of the polymer compound (B1) is preferably 10% to 80%, and more preferably 20% to 60% from the viewpoint of reducing the development inhibition.

In the case where the polymer compound (B1) has a functional group, other than the graft chain, capable of interacting with the titanium black, the polymer compound (B1) may have the above-described functional group capable of interacting with the various types of titanium black. How those functional groups are introduced is not particularly limited. However, it is preferred that the polymer compound (B1) has at least one type of structural unit selected from the structural units derived from monomers represented by the following general formulas (iv) to (vi).

[Chemical formula 8]

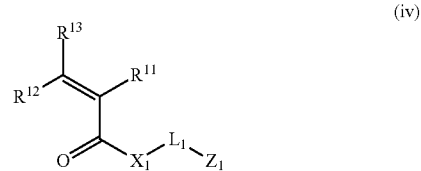

(iv)

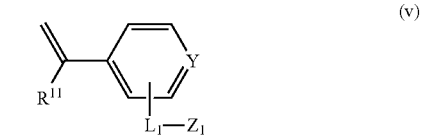

(v)

(vi)

In the general formulas (iv) to (vi), each of $R^{11}$, $R^{12}$, and $R^{13}$ independently represents a hydrogen atom, a halogen atom (e.g. a fluorine atom, a chlorine atom, a bromine atom, or the like), or an alkyl group (e.g. a methyl group, an ethyl group, or a propyl group) having 1 to 6 carbon atoms.

In the general formulas (iv) to (vi), it is more preferred that each of $R^{11}$, $R^{12}$, and $R^{13}$ independently represents a hydrogen atom or an alkyl group having 1 to 3 carbon atoms. The hydrogen atom or the a methyl group are most preferred. In the formula (iv), it is particularly preferred that each of $R^{12}$ and $R^{13}$ independently represents a hydrogen atom.

In the general formula (iv), $X_1$ represents an oxygen atom (—O—) or imino group (—NH—), and is preferably an oxygen atom. In the general formula (v), Y represents a methine group or a nitrogen atom.

In the general formulas (iv) to (v), $L_1$ represents a single bond or a divalent linking group. Examples of the divalent linking groups include a divalent aliphatic group (e.g. an alkylene group, a substituted alkylene group, an alkenylene group, a substituted alkenylene group, an alkynylene group, and a substituted alkynylene group), a divalent aromatic group (e.g. an arylene group and a substituted arylene group), a divalent heterocyclic group, and a combination of one of the above and at least one of an oxygen atom (—O—), a sulfur atom (—S—), an imino group (—NH—), a substituted imino bond (—$NR^{31'}$—, wherein $R^{31}$, is an aliphatic group, an aromatic group, or a heterocyclic group), and a carbonyl bond (—CO—).

The above-described divalent aliphatic group may have a cyclic structure or a branched structure. The number of carbon atoms in the aliphatic group is preferably 1 to 20, more preferably 1 to 15, and still more preferably 1 to 10. As for the aliphatic group, a saturated aliphatic group is preferred to an unsaturated aliphatic group. The aliphatic group may have a substituent. Examples of the substituents include a halogen atom, a hydroxyl group, an aromatic group, and a heterocyclic group.

The number of carbon atoms in the above-described divalent aromatic group is preferably 6 to 20, more preferably 6 to 15, and most preferably 6 to 10. The aromatic group may have a substituent. Examples of the substituents include a halogen atom, a hydroxyl group, an aliphatic group, an aromatic group, and a heterocyclic group.

The above-described divalent heterocyclic group preferably has a 5- or 6-membered ring as the heterocyclic ring. One or more of another heterocyclic ring, aliphatic ring, or aromatic ring may be condensed with the heterocyclic ring. The heterocyclic group may have a substituent. Examples of the substituents include a halogen atom, a hydroxy group, an oxo group (=O), a thioxo group (=S), an imino group (=NH), a substituted imino group (=N—$R^{32}$, wherein $R^{32}$ represents an aliphatic group, an aromatic group, or a heterocyclic group), aliphatic group, an aromatic group, and a heterocyclic group.

It is preferred that $L_1$ is a single bond or a divalent linking group containing an alkylene group or an oxyalkylene structure. It is more preferred that the oxyalkylene structure is an oxyethylene structure or an oxypropylene structure.

Furthermore, L may contain a polyoxyalkylene structure containing two or more repeating oxyalkylene structures. As for the polyoxyalkylene structure, a polyoxyethylene structure or a polyoxypropylene structure is preferred. The polyoxyethylene structure is represented by —(OCH$_2$CH$_2$)n— where n is preferably an integer of 2 or more, and more preferably an integer of 2 to 10.

In the general formulas (iv) to (vi), $Z_1$ represents a functional group, other than the graft site, capable of interacting with the titanium black particles, and is preferably a carboxylic acid group or a tertiary amino group, and more preferably a carboxylic acid group.

In the general formula (vi), each of $R^{14}$, $R^{15}$, and $R^{16}$ independently represents a hydrogen atom, a halogen atom (e.g. fluorine, chlorine, bromine, or the like), an alkyl group having 1 to 6 carbon atoms (e.g. a methyl group, an ethyl group, a propyl group, or the like), —$Z_1$, or -$L_1$-$Z_1$. Here, $L_1$ and $Z_1$ are synonymous with $L_1$ and $Z_1$ described above, respectively, and the preferred examples are also the same. It is preferred that each of $R^{14}$, $R^{15}$, and $R^{16}$ independently represents a hydrogen atom or an alkyl group having 1 to 3 carbon atoms, and more preferably a hydrogen atom.

In the present invention, as for the monomer represented by the general formula (iv), preferred is a compound in which each of $R^{11}$, $R^{12}$, and $R^{13}$ independently represents a hydrogen atom or a methyl group, and $L_1$ is a divalent linking group containing an alkylene group or an oxyalkylene structure, and X is an oxygen atom or an imino group, and Z is a carboxylic acid group.

As for a monomer represented by the general formula (v), preferred is a compound in which $R^{11}$ represents a hydrogen atom or a methyl group, and $L_1$ represents an alkylene group, and $Z_1$ represents a carboxylic acid group, and Y represents a methine group.

As for a monomer represented by the general formula (vi), preferred is a compound in which each of $R^{14}$, $R^{15}$, and $R^{16}$ independently represents a hydrogen atom or a methyl group, and L is a single bond or an alkylene group, and Z is a carboxylic acid group.

The following shows typical examples of the monomers (compounds) represented by the general formulas (iv) to (vi). Examples of the monomers include methacrylic acid, crotonic acid, isocrotonic acid, a reaction product of a compound (e.g. 2-hydroxyethyl methacrylate) having addition-polymerizable double bond and a hydroxyl group in molecules and succinic anhydride, a reaction product of a compound having addition-polymerizable double bond and a hydroxyl group in molecules and phthalic anhydride, a reaction product of a compound having an addition-polymerizable double bond and a hydroxyl group in molecules and tetrahydroxy phthalic anhydride, a reaction product of a compound having an addition-polymerizable double bond and a hydroxyl group in molecules and trimellitic anhydride, a reaction product of a compound having an addition-polymerizable double bond and a hydroxyl group in molecules and pyromellitic anhydride, acrylic acid, acrylic acid dimers, oligomers of acrylic acid, maleic acid, itaconic acid, fumaric acid, 4-vinyl benzoic acid, vinyl phenol, 4-hydroxyphenyl methacrylamide, and the like.

From the viewpoint of interacting with the titanium black, the dispersion stability, and the permeability of a developer, the content of the functional group capable of interacting with the titanium black is preferably 0.05 mass % to 90 mass %, more preferably 1.0 mass % to 80 mass %, and still more preferably 10 mass % to 70 mass % with respect to the total mass of the polymer compound (B).

For the purpose of improving various properties such as image intensity, the polymer compound (B1) may further contain other structural units (e.g. a structural unit having a functional group with an affinity for a dispersion medium used for a dispersion) having various functions which differ from the structural unit having a graft chain, the hydrophobic structural unit, and the structural unit having a functional group capable of interacting with the titanium black particles as long as it does not impair the effects of the present invention.

Examples of other structural units include a structural unit derived from a radical polymerizable compound selected from acrylonitriles, methacrylonitriles, and the like.

The polymer compound (B1) may use one or two or more types of other structural units. The content thereof in terms of mass, with respect to the total mass of the polymer compound (B1), is preferably 0% to 80%, and particularly preferably 10% to 60%. In the case where the content is within the above-described range, the sufficient pattern formation properties are maintained.

The acid value of the polymer compound (B1) is preferably in the range of 0 mgKOH/g to 160 mgKOH/g, more preferably in the range of 10 mgKOH/g to 140 mgKOH/g, and still more preferably 20 mgKOH/g to 120 mg KOH/g.

In a case where the acid value of the polymer compound (B1) is less than or equal to 160 mg KOH/g, peeling of the pattern during the development in forming the light-shielding layer 11 is more effectively inhibited, which will be described below. In a case where the acid value of the polymer compound (B1) is 10 mgKOH/g or more, the alkali development property, which will be described below, is improved. In a case where the acid value of the polymer compound (B1) is 20 mgKOH/g or more, precipitation of the dispersoid such as the titanium black or the dispersoid containing the titanium black and the Si particles is further inhibited, the number of coarse particles is further reduced, and the temporal stability of the dispersion composition and the polymerization composition is further improved.

In the present invention, the acid value of the polymer compound (B1) is calculated from the average content of the acid groups in the polymer compound (B1), for example. A resin having a desired acid value is obtained by changing the content of a structural unit containing an acid group, which is a constituent of the polymer compound (B1).

In the case of forming the light-shielding layer 11, the weight average molecular weight of the polymer compound (B1) in terms of polystyrene measured by GPC method in the present invention is preferably 4,000 to 300,000, and more preferably 5,000 to 200,000, and still more preferably 6,000 to 100,000, and particularly preferably 10,000 to 50,000, from the viewpoint of inhibiting peeling of the pattern during development and the development properties.

The GPC method uses HLC-8020GPC (manufactured by Tosoh Corporation) and is based on a method using TSKgel SuperHZM-H, TSKgel SuperHZ4000, or TSKgel SuperHZ2000 (manufactured by Tosoh Corporation, 4.6 mm ID×15 cm) as a column and THF (tetrahydrofuran) as an eluent.

The polymer compound (B1) is synthesized based on a known method. Examples of solvents used for synthesizing the polymer compound (B) include ethylene dichloride, cyclohexanone, methyl ethyl ketone, acetone, methanol, ethanol, propanol, butanol, ethylene glycol monomethyl ether, ethylene glycol monoethyl ether, 2-methoxyethyl acetate, 1-methoxy-2-propanol, 1-methoxy-2-propyl acetate, N, N-dimethylformamide, N, N-dimethylacetamide, dimethyl sulfoxide, toluene, ethyl acetate, methyl lactate, ethyl lactate, and the like. These solvents may be used singly or in combination of two or more.

Specific examples of the polymer compounds (B1) include "Disperbyk-161, 162, 163, 164, 165, 166, and 170 (trade name, polymeric copolymer) manufactured by BYK Co., "EFKA 4047, 4050, 4010, 4165 (trade name, polyurethane-based), EFKA 4330, 4340 (trade name, block copolymer) manufactured by EFKA, and the like. These polymer compounds (B) may be used singly or in combination of two or more.

The specific examples of the polymer compounds (B1) are described in the following, but are not limited thereto. Note that, in the following compounds illustrated as examples, a numerical value written next to each structural unit (a number written next to a repeating unit in a main chain) indicates the content of the structural unit (mass %: although written as "wt %" in the following). A numerical value written next to a repeating unit in a side chain indicates the number of repetition of the repeating unit.

[Chemical formula 9]

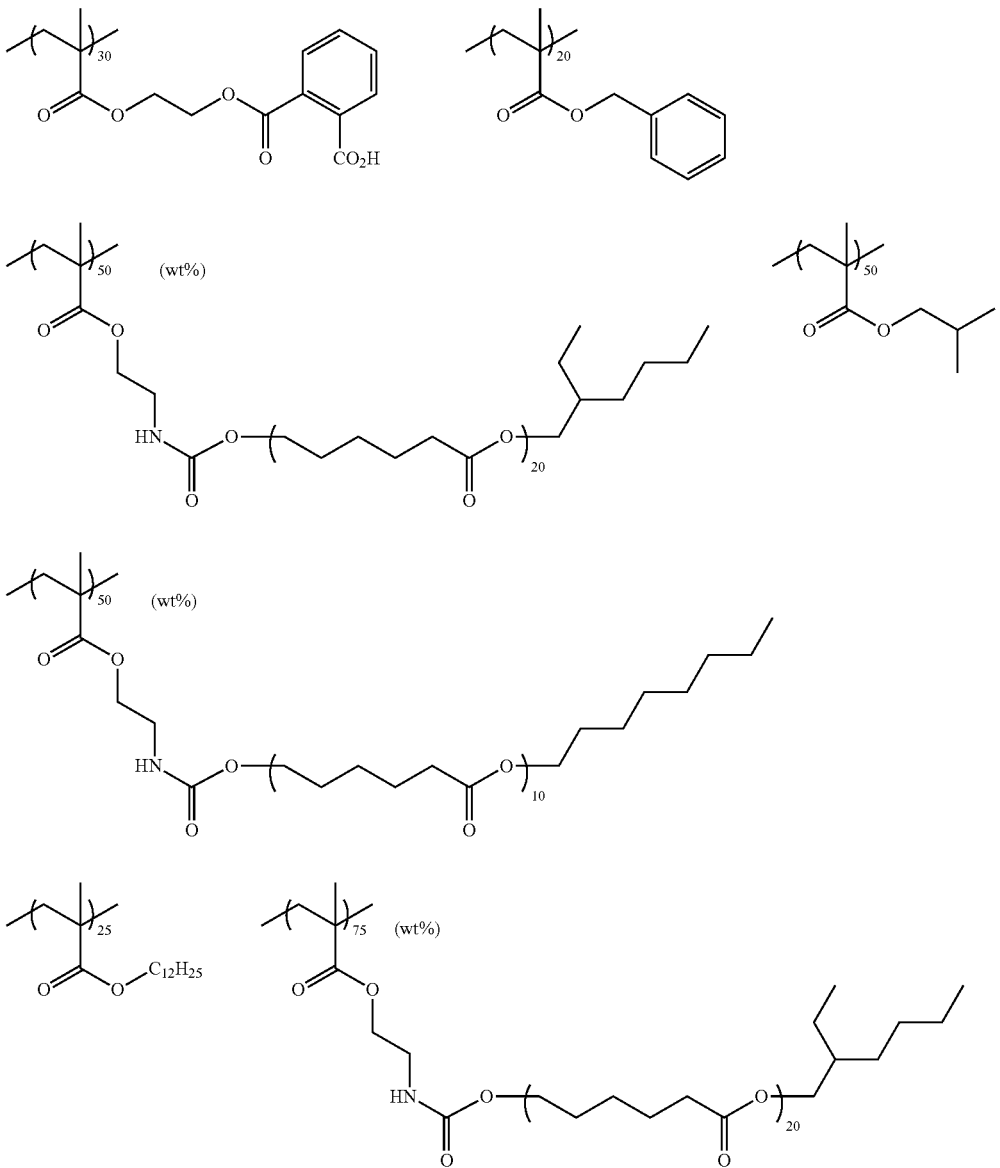

-continued
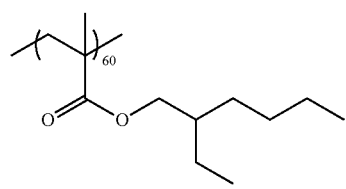
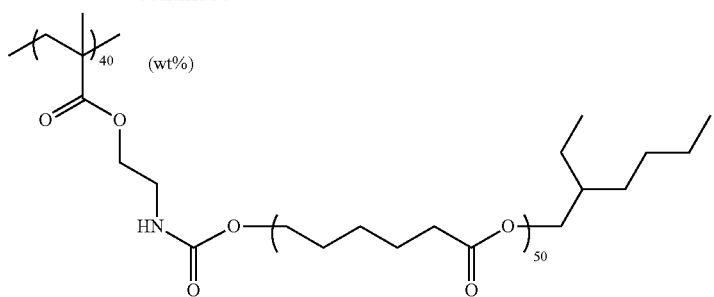
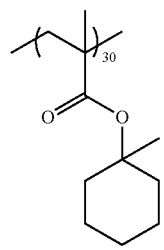
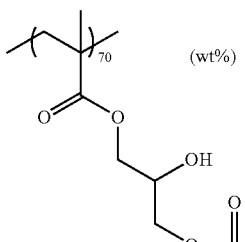
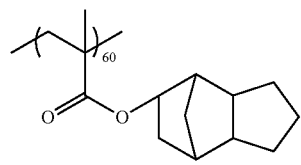
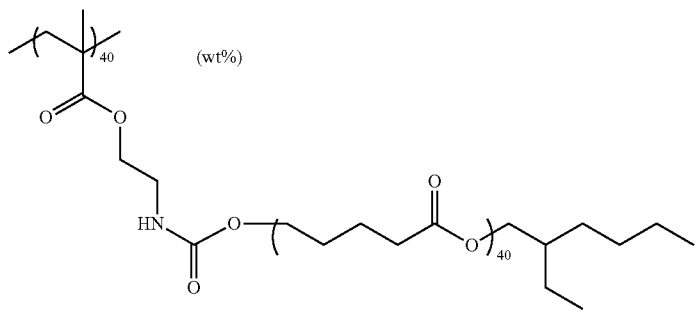
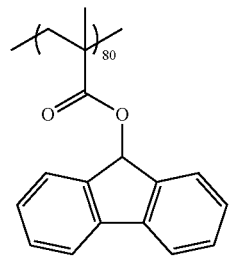
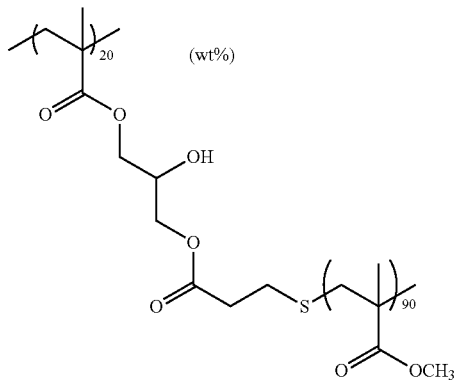
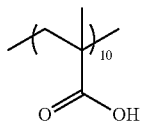
[Chemical formula 10]
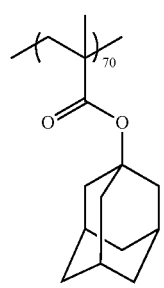
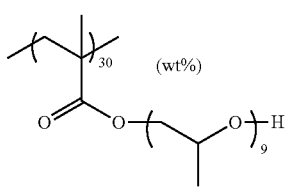
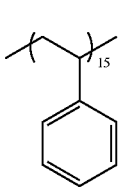
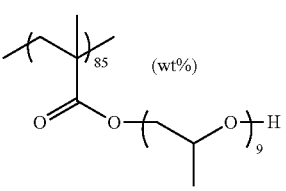

-continued
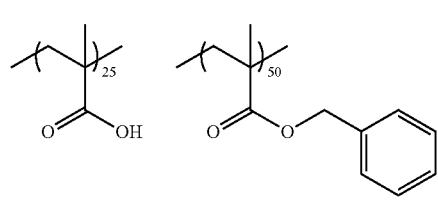 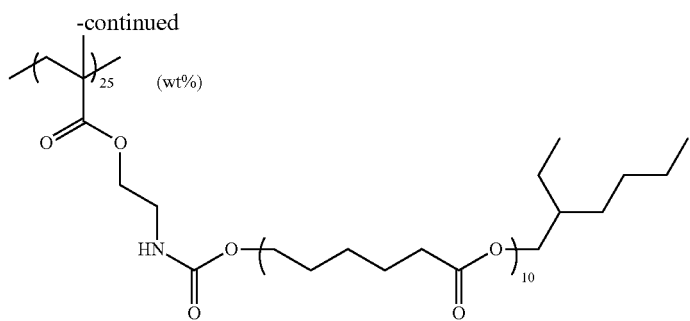
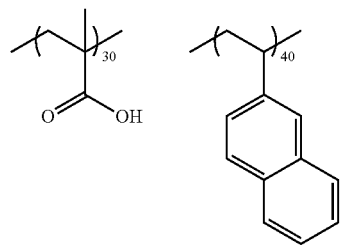 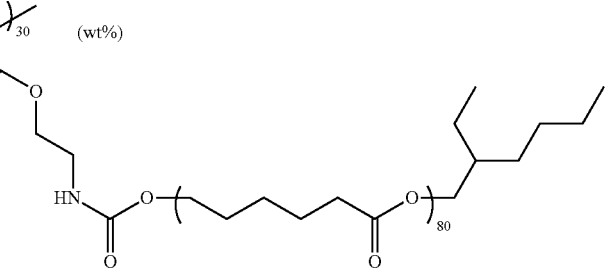
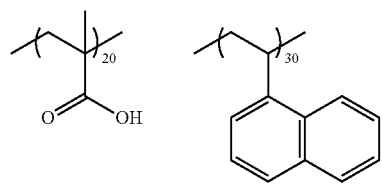 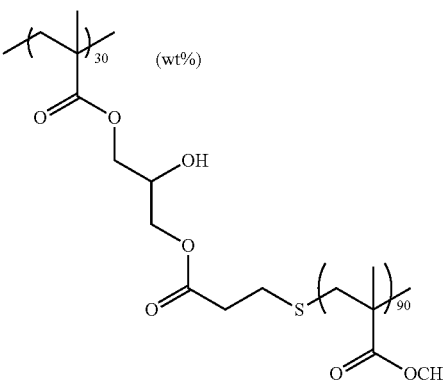 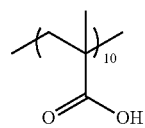
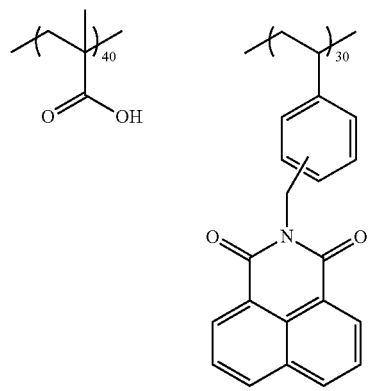 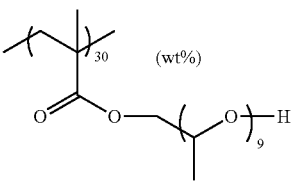
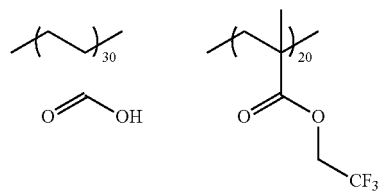

-continued
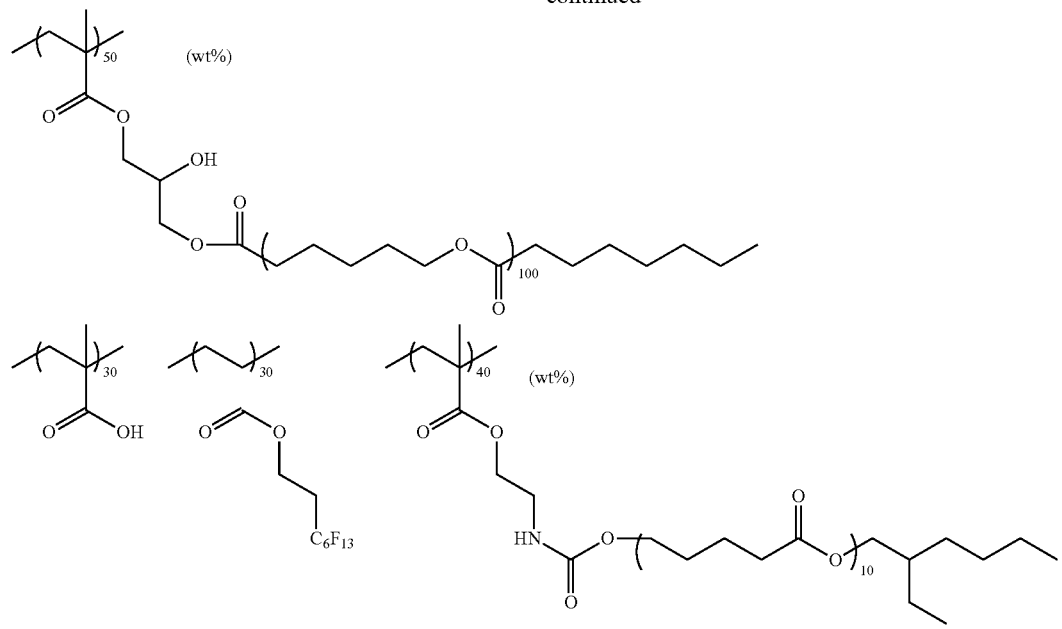
[Chemical formula 11]
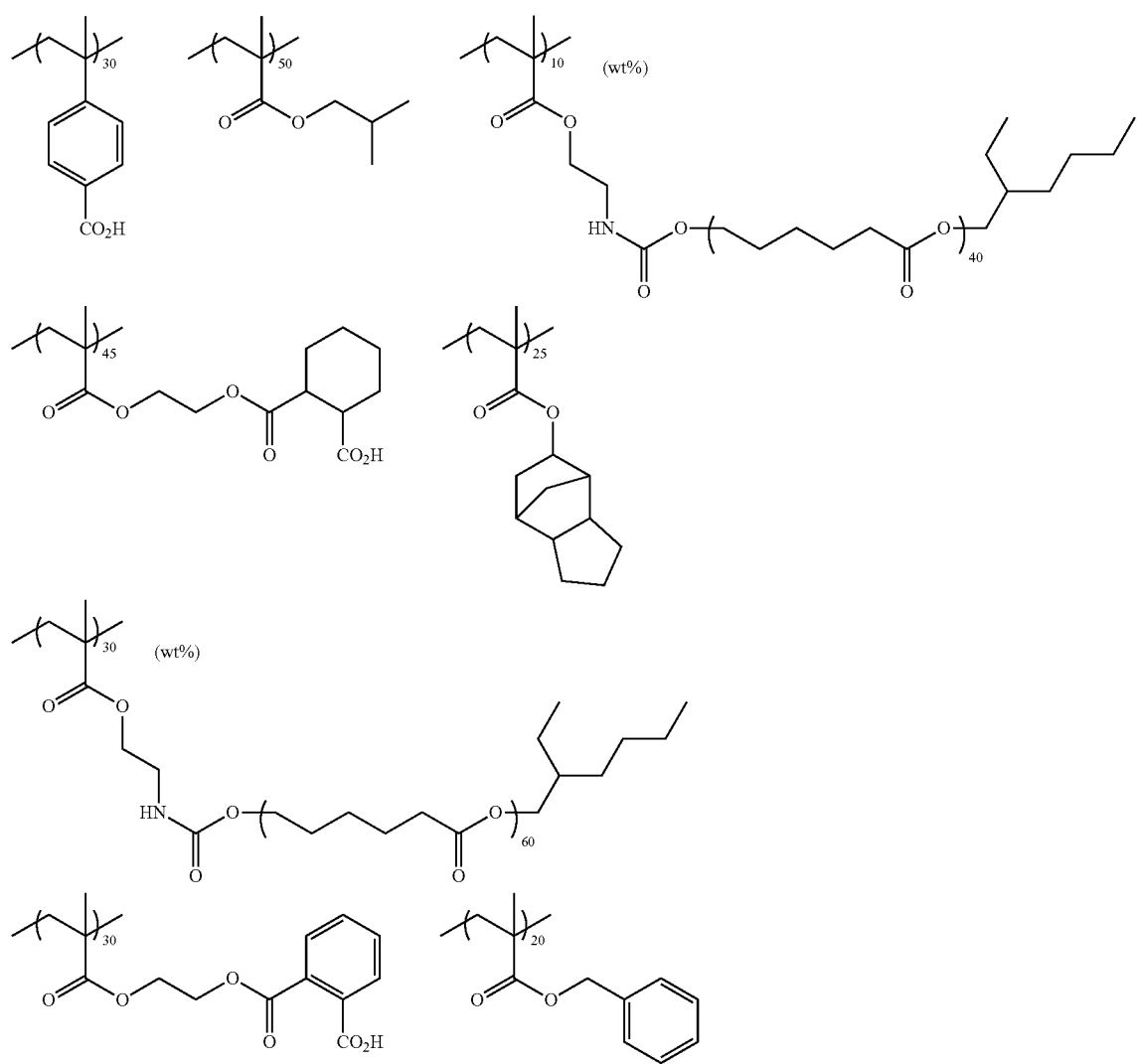

-continued
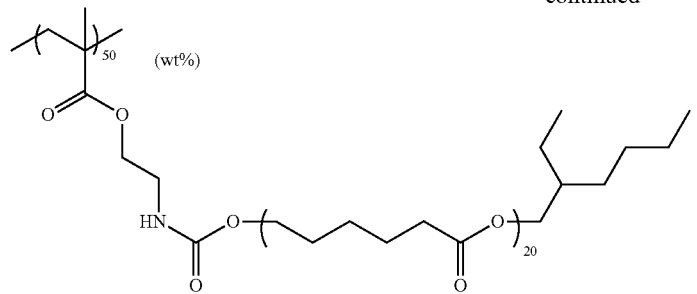
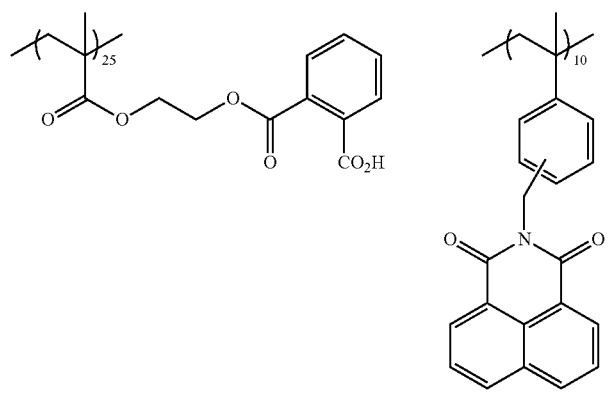
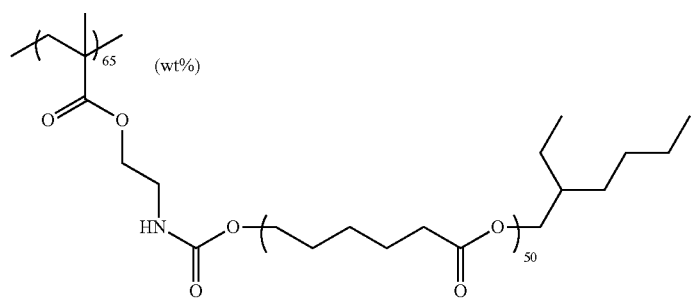
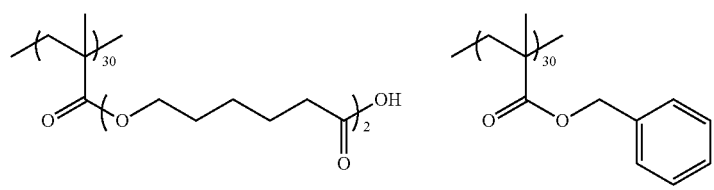
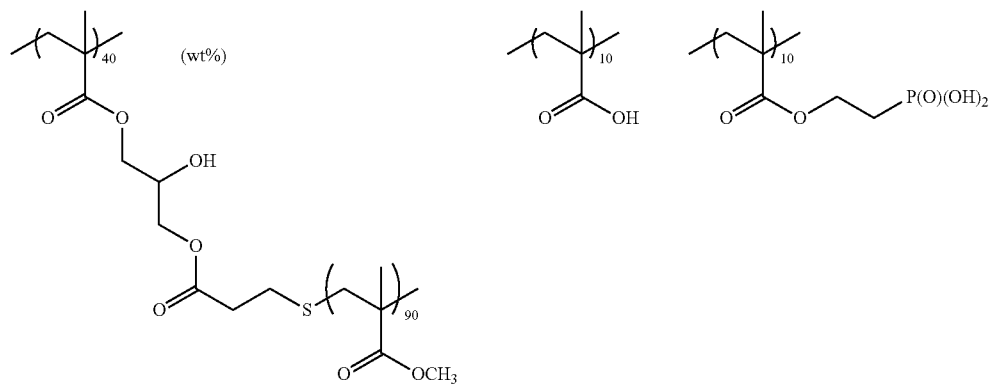

-continued

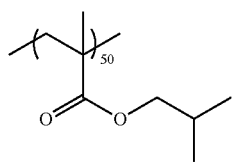 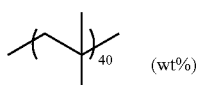

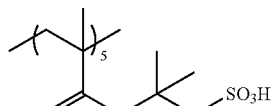 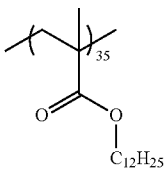

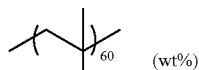

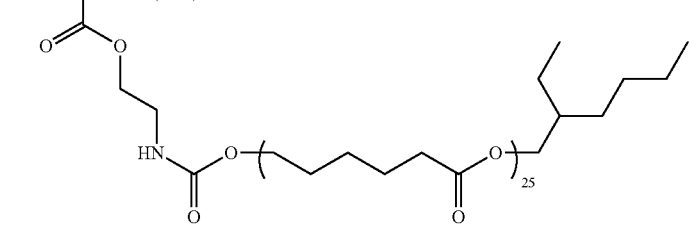

The content of the polymer compound (B1) in the dispersion composition with respect to the total solid content (mass) of the dispersion composition is preferably 1 mass % to 90 mass %, and more preferably 3 mass % to 70 mass %. The content of the polymer compound (B1) in the polymerizable composition with respect to the total solid content (mass) of the polymerizable composition is preferably 0.1 mass % to 50 mass %, more preferably 0.5% to 30 wt %.

<(B2) Resin Different from Polymer Compound (B1)>

The dispersion composition and the polymerizable composition may contain a polymer compound (B2) which differs from the polymer compound (B1) (in other words, which does not correspond to the polymer compound (B1)). The preferred range of the weight average molecular weight of the polymer compound (B2) is similar to that of the polymer compound (B1) described above.

Specific examples of the polymer compounds (B2) include "Disperbyk-101 (trade name, polyamidoamine phosphate), 107 (trade name, carboxylic acid ester), 110 (trade name, copolymer containing acid group), 130 (trade name, polyamide), 180 (trade name, polymeric copolymer), BYK-P104, P105 (trade name, high molecular weight unsaturated polycarboxylic acid)" manufactured by BYK, "EFKA4400, 4402 (trade name, modified polyacrylate), 5010 (polyester amide), 5765 (trade name, high molecular weight polycarboxylate), 6220 (trade name, fatty acid polyester), 6745 (trade name, phthalocyanine derivative), 6750 (trade name, azo pigment derivative)" manufactured by EFKA Co., "AJISPER PB821, PB822" manufactured by Ajinomoto Fine-Techno Co., Ltd., "FLOWLEN TG-710 (urethane oligomer), POLYFLOW No. 50E, No. 300 (trade name, acrylic copolymer)" manufactured by Kyoeisha Chemical Co., Ltd., "Disparlon KS-860, 873SN, 874, #2150 (trade name, aliphatic polycarboxylic acid), #7004 (polyether ester), DA-703-50, DA-705, DA-725" manufactured by Kusumoto Kasei Co., Ltd., "DEMOL RN, N (trade name, naphthalenesulfonic acid formaldehyde polycondensate), DEMOL MS, C, SN-B (trade name, aromatic sulfonic acid formaldehyde polycondensate), HOMOGENOL L-18 (trade name, polymeric polycarboxylic acids), EMULGEN 920, 930, 935, 985 (trade name, polyoxyethylene nonyl phenyl ether), ACETAMIN 86 (stearylamine acetate)" manufactured by Kao Corporation, Ltd., "SOLSPERSE 5000 (phthalocyanine derivative), 22000 (trade name, azo pigment derivative), 13240 (polyester amine), 3000, 17000, 27000 (trade name, polymers having functional units at the terminal ends), 24000, 28000, 32000, 38500 (graft polymers)" manufactured by The Lubrizol Corporation, "Nikkol T106 (polyoxyethylene sorbitan monooleate), MYS-IEX (trade name, polyoxyethylene monostearate)" manufactured by Nikko Chemicals, and the like and also include an amphoteric dispersant such as Hinoakuto T-8000E manufactured by Kawaken Fine Chemical Co., Ltd.

The dispersion composition may or may not contain the polymer compound (B2). In the case where the dispersion composition contains the polymer compound (B2), the content of the polymer compound (B2) with respect to the total solid mass content of the dispersion composition is preferably 0.5 mass % to mass %, and more preferably 1 mass % to 20 mass %. The polymerizable composition of the present invention may or may not contain the polymer compound (B2). In the case where the polymerizable composition contains the polymer compound (B2), the content of the polymer compound (B2) with respect to the total mass content of the polymerizable composition is preferably 0.1 mass % to 50 mass %, and more preferably 0.5 mass % to 30 mass %.

<(C) Solvent>

The dispersion composition and the polymerizable composition of the present invention contains a solvent (C). It is preferred that the solvent (C) is an organic solvent.

Examples of organic solvents include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol mono-isopropyl ether, ethylene glycol monobutyl ether acetate, 3-methoxy propanol, methoxymethoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxy propyl acetate, N, N-dimethylformamide, dimethyl sulfoxide, γ-butyrolactone, ethyl acetate, butyl acetate, methyl lactate, and ethyl lactate, but are not limited thereto.

The solvents may be used singly or in combination of two or more. In a case where two or more solvents are used in combination, particularly preferred is a combination of two or more selected from the above-mentioned methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate.

The amount of the solvent (C) contained in the dispersion composition relative to the total amount of the dispersion composition is preferably 10 mass % to 80 mass %, more preferably 20 mass % to 70 mass %, and still more preferably 30 mass % to 65 mass %. The amount of the solvent (C) contained in the polymerizable composition relative to the total amount of the polymerizable composition is preferably 10 mass % to 90 mass %, more preferably 20 mass % to 80 mass %, still more preferably 25 mass % to 75 mass %.

<(D) Polymerizable Compound>

As described above, the polymerizable composition contains (D) a polymerizable compound. It is preferred that the polymerizable (D) has at least one addition-polymerizable ethylenically unsaturated group and the boiling point of 100° C. or more at normal atmospheric pressure.

Examples of compounds having at least one addition-polymerizable ethylenically unsaturated group and the boiling point of 100° C. or more at the normal atmospheric pressure include monofunctional acrylates or methacrylates such as polyethylene glycol mono (meth) acrylate, polypropylene glycol mono (meth) acrylate, and phenoxyethyl (meth) acrylate; polyethylene glycol di (meth) acrylate, trimethylolethane tri (meth) acrylate, neopentyl glycol di (meth) acrylate, pentaerythritol tri (meth) acrylate, pentaerythritol tetra (meth) acrylate, dipentaerythritol hexa (meth) acrylate, hexanediol (meth) acrylate, trimethylolpropane tri (acryloyloxypropyl) ether, tri (acryloyloxyethyl) isocyanurate, and (meth) acrylates of a compound obtained by adding ethylene oxide or propylene oxide to polyfunctional alcohol such as glycerin or trimethylol ethane, poly (meth) acrylates of pentaerythritol or dipentaerythritol, urethane acrylates described in Japanese Patent Application Publication No. 48-41708, Japanese Patent Application Publication No. 50-6034, Japanese Patent Application Publication No. 51-37193, polyester acrylates described in Japanese Patent Application Publication No. 48-64183, Japanese Patent Application Publication No. 49-43191, and Japanese Patent Unexamined Application Publication No. 52-30490, polyfunctional acrylates such as epoxy acrylate, which is a reaction product of epoxy resin and (meth) acrylic acid, and methacrylates. In addition, photocurable monomers and oligomers described on pages 300 to 308 in Journal of the Adhesion Society of Japan, Vol. 20, No. 7 may also be used.

Furthermore, a compound, which is obtained by (meth) acrylation after addition of ethylene oxide or propylene oxide to the above-mentioned polyfunctional alcohol, expressed by general formulas (1) and (2) described together with the specific examples in Japanese Patent Laid-Open Publication No. 10-62986 may be used.

Of those, preferred are dipentaerythritol penta (meth) acrylate, dipentaerythritolhexa (meth) acrylate, and structures in which the acryloyl groups thereof are linked to dipentaerythritol via an ethylene glycol residue or a propylene glycol residue. Oligomer types thereof may also be used.

Also preferred are urethane acrylates described in Japanese Patent Examined Application Publication No. 48-41708, Japanese Patent Unexamined Application Publication No. 51-37193, Japanese Patent Examined Application Publication Nos. 2-32293 and 2-16765, and urethane compounds having an ethylene oxide-based skeleton described in Japanese Patent Examined Application Publication Nos. 58-49860, 56-17654, 62-39417, and 62-39418. A photopolymerizable composition excellent in photosensitive speed is obtained by using an addition polymerizable compound having an amino structure or a sulfide structure in a molecule as described in Japanese Patent Unexamined Application Publication Nos. 63-277653, 63-260909, and 1-105238. Examples of commercially available products include urethane oligomer UAS-10, UAB-140 (trade names, manufactured by Nippon Paper Chemicals Ltd.), UA-7200 manufactured by Shin-Nakamura Chemical Industry Co., Ltd., DPHA-40H (trade name, manufactured by Nippon Kayaku Co., Ltd.), UA-306H, UA-306T, UA-3061, AH-600, T-600, AI-600 (trade names, manufactured by Kyoeisha Chemical Co., Ltd.), and the like.

Also preferred are ethylenically unsaturated compounds having an acid group. Examples of commercially available products include TO-756 (carboxyl group-containing trifunctional acrylate) and TO-1382 (carboxyl group-containing pentafunctionalacrylate) manufactured by TOAGOSEI Co., Ltd., and the like. As for the polymerizable compound used for the present invention, tetra or higher functional acrylate compounds are preferred.

The polymerizable compound (D) may be used singly or in combination of two or more. In the case where a combination of two or more polymerizable compounds is used, the combination is determined as appropriate in accordance with the physical properties or the like required for the polymerizable compound. Examples of the preferred combinations of the polymerizable compounds may be a combination of two or more types of polymerizable compounds selected from the above-mentioned polyfunctional acrylate compounds, e.g. a combination of dipentaerythritolhexaacrylate and pentaerythritol triacrylate.

The content of the polymerizable compound (D) in the polymerizable composition of the present invention with respect to the total solid content of the polymerizable composition is preferably 3 mass % to 55 mass %, and more preferably 10 mass % to 50 mass %.

<(E) Polymerization Initiator>

The polymerizable composition contains (E) polymerization initiator (preferably a photoinitiator) as described above. The polymerization initiator (E) is a compound which is decomposed by light or heat and initiates and promotes the polymerization of the above-mentioned polymerizable compound (D). It is preferred that the polymerization initiator (E) absorbs light in the wavelength range of 300 to 500 nm.

Specific examples of the polymerization initiators (E) include organic halogenated compounds, oxydiazole compounds, carbonyl compounds, ketal compounds, benzoin compounds, organic peroxide compounds, azo compounds, coumarin compounds, azide compounds, metallocene compounds, organic borate compounds, disulfonic acid compounds, oxime compounds (in particular oxime ester compounds), onium salt compounds, and acyl phosphine (oxide) compounds. More specific examples include a polymerization initiator described in paragraphs [0081] to [0100] and [0101] to [0139] of Japanese Patent Unexamined Application Publication No. 2006-78749. Of the above polymerization initiators, the oxime compounds (in particular the oxime ester compounds) are more preferred from the viewpoint of improving the shape of the pattern obtained. As for the oxime compounds, IRGACURE OXE01 and OXE02 manufactured by Ciba Specialty Chemicals Inc. are preferred. OXE01 and OXE02 provide the same effects.

The content of the polymerization initiator (E) in the polymerizable composition is preferably 0.1 mass % to 30 mass %, and more preferably 1 mass % to 25 mass %, and still more preferably 2 mass % to 20 mass % with respect to the total solid content of the polymerizable composition.

[(F) Other Additives]

In addition to the dispersion composition of the present invention, the polymerizable compound (D), and the polymerization initiator (E), various additives may be added to the polymerizable composition depending on the purpose.

(F-1) Binder Polymer

The polymerizable composition may further contain a binder polymer (F-1) as necessary for the purpose of improving coating properties and the like. It is preferred to use a linear organic polymer as the binder polymer (F-1). Any known "linear organic polymer" may be used arbitrarily. Preferably, a linear organic polymer which is soluble or swellable in water or weakly alkaline water is chosen so as to allow water development or weakly alkaline water development. The linear organic polymer is used not only as a film-forming agent, but selected and used in accordance with a developer (developing agent) composed of water, weak alkaline water, or an organic solvent.

For example, the use of a water-soluble organic polymer allows water development. Examples of such linear organic polymers include radical polymers having a carboxylic acid group in a side chain described in, for example, Japanese Patent Unexamined Application Publication No. 59-44615, Japanese Patent Examined Application Publication No. 54-34327, Japanese Patent Examined Application Publication No. 58-12577, Japanese Patent Examined Application Publication No. 54-25957, Japanese Patent Unexamined Application Publication No. 54-92723, Japanese Patent Unexamined Application Publication No. 59-53836, and Japanese Patent Unexamined Application Publication No. 59-71048, i.e. a resin having carboxyl group-containing monomers alone or copolymerized, a resin obtained by hydrolysis, half-esterification, or half-amidation of an acid anhydride unit having acid anhydride-containing monomers alone or copolymerized, and epoxy acrylate obtained by modifying epoxy resin with unsaturated monocarboxylic acid and acid anhydride, and the like. Examples of the carboxyl group-containing monomers include acrylic acid, methacrylic acid, itaconic acid, crotonic acid, maleic acid, fumaric acid, 4-carboxyl styrene, and the like. Examples of the acid anhydride-containing monomers include maleic anhydride acid, and the like. Also, acidic cellulose derivatives having a carboxylic acid group in a side chain. In addition to those described above, a compound obtained by adding cyclic acid anhydride to a polymer having a hydroxyl group is useful.

Urethane binder polymers containing an acid group described in Japanese Patent Unexamined Application Publication Nos. 7-12004, 7-120041, 7-120042, 8-12424, 63-287944, 63-287947, 1-271741, 10-116232, and the like are advantageous in terms of suitability for low exposure because they are excellent in strength.

Also preferred are acetal-modified polyvinyl alcohol binder polymers having an acid group described in European Patent No. 993966, European Patent No. 1204000, Japanese Patent Application No. 2001-318463, and the like, due to an excellent balance between the film strength and developability. In addition to those described above, polyvinyl pyrrolidone, polyethylene oxide, and the like are useful as the water-soluble linear organic polymers. Also, alcohol-soluble nylon, polyether of 2, 2-bis-(4-hydroxyphenyl)-propane and epichlorohydrin, and the like are useful in order to increase the strength of the cured film.

In particular, of those described above, [benzyl (meth) acrylate/(meth) acrylic acid/other addition polymerizable vinyl monomer as necessary] copolymers and [allyl (meth) acrylate/(meth) acrylic acid/other addition polymerizable vinyl monomer as necessary] copolymers are preferred due to the excellent balance among the film strength, the sensitivity, and the developability.

The weight average molecular weight of the binder polymer (F-1) used in the polymerizable composition is preferably 1,000 to 300,000, more preferably 1,500 to 250,000, still more preferably from 2,000 to 200,000, and particularly preferably 2,500 to 100,000 from the viewpoint of inhibiting peeling of the pattern and from the viewpoint of developability. The number average molecular weight of the binder polymer (F-1) is preferably 1,000 or more, and more preferably in the range of 1500 to 250,000. The polydispersity (weight average molecular weight/number average molecular weight) of the binder polymer (F-1) is preferably 1 or more, and more preferably in the range of 1.1 to 10. Here, the weight average molecular weight of the binder polymer (F-1) is measured by GPC, for example.

The binder polymer (F-1) described above may be any one of a random polymer, a block polymer, a graft polymer, and the like.

The binder polymer (F-1) used in the present invention is synthesized by conventional and known methods. Examples of solvents used at the time of the synthesis include tetrahydrofuran, ethylene dichloride, cyclohexanone, and the like. These solvents are used singly or in combination of two or more. Examples of radical polymerization initiators used at the time of synthesizing the binder polymer (F-1) include known compounds such as azo initiators and peroxide initiators.

In the present invention, an alkali-soluble resin having a double bond in a side chain is used as the binder polymer (F-1). Thereby, both the cure extent (curability) of the exposed portion and the alkali developability of the unexposed portion are particularly improved. The alkali-soluble resin having a double bond in a side chain has an acid group for making the resin alkali-soluble and at least one unsaturated double bond in its structure, thereby improving various types of performance such as removability of a non-image portion. The resin having such structure is described in detail in Japanese Patent Unexamined Application Publication No.

2003-262958 and the resin described therein may be used as the binder polymer of the present invention.

Cardo resin may be used as the binder polymer (F-1). The cardo resin which is selected from a group consisting of epoxy resin, polyester resin, polycarbonate resin, acrylic resin, polyether resin, polyamide resin, polyurea resin, and polyimide resin, and has a fluorene skeleton is preferred. Here, the cardo resin refers to the resin which has cardo structure (skeleton structure in which two annular structures are combined with the quaternary carbon atom which constitutes the annular structure) in a molecule. More specifically, the compound described in paragraphs [0046] to [0057] of Japanese Patent Unexamined Application Publication No. 2011-170334 may be used.

The content of the binder polymer in the polymerizable composition with respect to the total solid content of the composition is preferably 0.1 mass % to 25 mass %, and from the viewpoint of inhibiting peeling of the light-shielding layer 11 and reducing the development residues, more preferably 0.3 mass % to 20 mass % and still more preferably 1.0 to 15 mass %.

(F-2) Colorant

In order to express desired light-shielding properties, the polymerizable composition may contain a colorant (F-2) such as a known organic pigment or dye other than inorganic pigment in combination with another colorant.

Examples of organic pigments used as the colorants (F-2), which can be used in combination with another colorant, includes the pigment described in paragraphs [0030] to [0044] described in Japanese Patent Unexamined Application Publication No. 2008-224982, C. I. Pigment Green 58 and C. I. Pigment Blue 79 with a Cl substituent substituted with OH. Of those described above, the pigments preferably used are listed as follows; however, the colorants (F-2) applicable to the present invention are not limited thereto.

C. I. Pigment Yellow 11, 24, 108, 109, 110, 138, 139, 150, 151, 154, 167, 180, 185, C. I. Pigment Orange 36, 38, 62, 64, C. I. Pigment Red 122, 150, 171, 175, 177, 209, 224, 242, 254, 255, C. I. Pigment Violet 19, 23, 29, 32, C. I. Pigment Blue 15:1, 15:3, 15:6, 16, 22, 60, 66, C. I. Pigment Green 7, 36, 37, 58, C. I. Pigment Black 1

Examples of dyes used as the colorants (F-2) are not particularly limited and known dyes may be selected and used as necessary, for example, pigments described in Japanese Patent Unexamined Application Nos. 64-90403, 64-91102, H1-94301, and H6-11614, Japanese Patent No. 2592207, U.S. Pat. Nos. 4,808,501, 5,667,920, and 5,059,500, Japanese Patent Unexamined Application Publication Nos. H5-333207, H6-35183, H6-51115, H6-194828, H8-211599, H4-249549, H10-123316, H11-302283, H7-286107, 2001-4823, H8-15522, H8-29771, H8-146215, H11-343437, H8-62416, 2002-14220, 2002-14221, 2002-14222, 2002-14223, H8-302224, H8-73758, H8-179120, H8-151531, and the like.

Examples of the chemical structures of the dyes include pyrazole azo type, aniline azo type, triphenylmethane type, anthraquinone type, anthrapyridone type, benzylidene type, oxonol type, pyrazolotriazole azo type, pyridone azo type, cyanine type, phenothiazine type, pyrrolopyrazole azomethine type, xanthene type, phthalocyanine type, benzopyran type, indigo type, pyrromethene type and the like.

As for the colorant (F-2) in the polymerizable composition, preferred is at least one type of organic pigment selected from the group consisting of an orange pigment, a red pigment, and a violet pigment from the viewpoint of compatibility between the curability and the light-shielding properties in the case where the colorant (F-2) is combined with the titanium black, which is essentially contained in the composition. The most preferred combination is a combination with a red pigment.

As for the orange pigment, the red pigment, and the violet pigment, for example, various types of pigments which belong to the "C. I. Pigment Orange", the "C. I. Pigment Red", and the "C. I. Pigment Violet" described above may be selected depending on the required light-shielding properties. In terms of improving the light-shielding properties, the C. I. Pigment Violet 29, the C. I. Pigment Orange 36, 38, 62, 64, the C. I. Pigment Red 177, 254, 255, and the like are preferred.

(F-3) Sensitizer

The polymerizable composition may contain an (F-3) sensitizer for the purpose of improving radical generation efficiency of the polymerization initiator (E) and increasing the wavelength of a photosensitive wavelength. It is preferred that the sensitizer (F-3) sensitizes the polymerization initiator (E) with an electron transfer mechanism or an energy transfer mechanism. Preferred examples of the sensitizers (F-3) include a compound described in paragraphs [0085] to [0098] described in Japanese Patent Unexamined Application Publication No. 2008-214395.

The content of the sensitizer (F-3) with respect to the total solid content of the polymerizable composition is preferably in a range of 0.1 mass % to 30 mass %, more preferably in a range of 1 to 20 mass %, and still more preferably in a range of 2 to 15 mass % from the viewpoint of sensitivity and storage stability.

(F-4) Polymerization inhibitor

It is preferred to add a small amount of a polymerization inhibitor (F-4) to the polymerizable composition of the present invention, during the manufacture or the storage of the polymerizable composition, for the purpose of inhibiting unnecessary thermal polymerization of the polymerizable compound. A known thermal polymerization inhibitor may be used as the polymerization inhibitor (F-4) and specific examples thereof include hydroquinone, p-methoxy phenol, di-t-butyl-p-cresol, pyrogallol, t-butyl catechol, benzoquinone, 4,4'-thiobis (3-methyl-6-t-butylphenol), 2,2'-methylenebis (4-methyl-6-t-butylphenol), N-nitrosophenylhydroxyamine cerous salt and the like. The content of the thermal polymerization inhibitor (F-4) with respect to the total solid content of the polymerizable composition is preferably approximately 0.01 mass % to approximately 5 mass %.

As necessary, in order to prevent polymerization inhibition by oxygen, higher fatty acid derivative such as behenic acid or behenic acid amide, or the like may be added so as to unevenly distribute the higher fatty acid derivative or the like on the surface of the coating film in course of drying after the coating. The amount of the higher fatty acid derivative to be added is preferably approximately 0.5 mass % to approximately 10 mass % with respect to the total solid content.

(F-5) Adhesion Promoter

An adhesion promoter (F-5) may be added to the polymerizable composition for the purpose of improving the adhesion with a hard surface of a support or the like. Examples of the adhesion promoters (F-5) include a silane coupling agent, a titanium coupling agent, and the like.

As for the silane coupling agent, preferred are γ-methacryloxypropyltrimethoxysilane, γ-methacryloxypropyl triethoxysilane, γ-acryloxypropyltrimethoxysilane, γ-acryloxypropyl triethoxysilane, γ-mercaptopropyl trimethoxysilane, γ-aminopropyltriethoxysilane, phenyltrimethoxysilane, and γ-methacryloxypropyl trimethoxysilane.

The content of the adhesion promoter (F-5) is preferably 0.5 mass % to 30 mass % and more preferably 0.7 mass % to 20 mass % with respect to the total solid content of the polymerizable composition.

Note that in the case where the filter body 6, on which the light-shielding layer 11 is formed by applying the polymerizable composition, is made from glass, it is preferred to add the adhesion promoter (F-5) from the viewpoint of improving the sensitivity.

(F-6) Surfactant

Various types of surfactants may be added to the polymerizable composition from the viewpoint of improving coating properties. Various types of surfactants such as fluorine-based surfactants, nonionic-based surfactants, cationic-based surfactants, anionic-based surfactants, and silicone-based surfactants may be used as the surfactants.

In particular, liquid properties (particularly, fluidity) of the polymerizable composition prepared as a coating liquid are improved by containing the fluorine-based surfactant. Thereby uniformity of the coating thickness and liquid-saving properties are further improved. In other words, in a case where a film is formed from a coating liquid which contains a polymerizable composition containing a fluorine-based surfactant, the interfacial tension between the coating liquid and the application surface is lowered, so that wettability to the application surface is improved and thereby coating properties of the application surface is improved. Therefore, it is effective in forming a film having uniform thickness with small unevenness even in a case where a thin film with the thickness in the order of several μm is made with a small liquid amount.

The content of fluorine in the fluorine-based surfactant is preferably 3 mass % to 40 mass %, more preferably 5 mass % to 30 mass o, particularly preferably 7 mass % to 25 mass %. The fluorine surfactant with the fluorine content within the above range is effective in terms of uniformity in thickness of the coating film, liquid-saving properties, and has excellent solubility in the polymerizable composition.

Examples of the fluorine-based surfactants include Megafac F171, the F172, the F173, the F176, the F177, the F141, the F142, the F143, the F144, the R30, the F437, the F475, the F479, same F482, the F554, the F780, the F781 (manufactured by DIC Ltd.), Fluorad FC430, the FC431, the FC171 (manufactured by Sumitomo Co., Ltd.), SURFLON S-382, the SC-101, same SC-103, the SC-104, the SC-105, the SC1068, the SC-381, the SC-383, the 5393, the KH-40 (manufactured by Asahi Glass Co., Ltd.), and the like.

Specific examples of the nonionic-based surfactants include glycerol, trimethylol propane, trimethylol ethane and their ethoxylates and propoxylates (for example, glycerol propoxylate, glycerol ethoxylate, and the like), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid ester (BASF Corp., Pluronic L10, L31, L61, L62, 10R5, 17R2, 25 R2, tetronic 304, 701, 704, 901, 904, 150R1, SOLSPERSE 20000 (manufactured by Nippon Lubrizol Corporation, Ltd.), and the like.

Specific examples of the cationic-based surfactants include phthalocyanine derivatives (trade name: EFKA-745, manufactured by Morishita Sangyo, Ltd.), organosiloxane polymers KP341 (Shin-Etsu Chemical Co., Ltd.), (meth) acrylic acid based (co) polymer POLYFLOW No. 75, No. 90, No. 95 (Kyoeisha Chemical Co., Ltd.), W001 (manufactured by Yusho Co., Ltd.), and the like.

Specific examples of the anionic-based surfactants include W004, W005, and W017 (manufactured by Yusho Co., Ltd.), and the like.

Examples of the silicone-based surfactants include "Toray Silicone DC3PA", "Toray silicone SH7PA", "Toray silicone DC11PA", "Toray silicone SH21PA", "Toray silicone SH28PA", "Toray silicone SH29PA", "Toray silicone SH30PA", and "Toray Silicone SH8400" manufactured by Dow Corning Toray, Ltd., "TSF-4440", "TSF-4300", "TSF-4445", "TSF-4460", and "TSF-4452" manufactured by Momentive Performance Materials Inc., "KP341", "KF6001", and "KF6002" manufactured by Shin-Etsu Silicone Co., Ltd., "BYK307", "BYK323", and "BYK330" manufactured by BYK Co., and the like.

The surfactants may be used singly or in combination of two or more. The amount of the surfactant to be added, with respect to the total mass of the polymerizable composition of the present invention, is preferably 0.001 mass % to 2.0 mass % and more preferably 0.005 mass % to 1.0 mass %.

(F-7) Other Additives

In addition, the polymerizable composition may contain a co-sensitizer for the purpose of improving sensitivity of the sensitizing dye and the initiator to radiation or preventing polymerization inhibition of the photopolymerizable compound caused by oxygen. A known additive such as a diluent, a plasticizer, or an oil-sensitizing agent may be added as necessary to improve the physical properties of the cured film.

<Preparation of Dispersion Composition>

Steps for preparing the dispersion composition of the present invention are not particularly limited. For example, the dispersion composition is prepared by a dispersion process in which the titanium black, being the colorant (A), the polymer compound (B1), being the dispersant (B), and the solvent (C) are dispersed with a stirrer, homogenizer, high-pressure emulsifier, wet pulverizer, wet dispersing machine, or the like. The dispersion process may be performed by two or more dispersion processes (multi-stage dispersion).

<Preparation of Polymerizable Composition>

Steps for preparing the polymerizable composition are not particularly limited. For example, the polymerizable composition is prepared by mixing the dispersion composition, the polymerizable compound (D), the polymerization initiator (E), and various types of additives to be used as desired.

<Light-Shielding Layer>

The light-shielding layer constituting a colored pattern is formed from the above-described polymerizable composition. In the colored pattern formed from the polymerizable composition, residues are inhibited and flatness is improved. The film thickness of the light-shielding layer 11 is not particularly limited. In terms of obtaining the effects of the present invention more effectively, the film thickness after drying is preferably greater than or equal to 0.2 μm and less than or equal to 50 μm, more preferably greater than or equal to 0.5 μm and less than or equal to 30 μm, still more preferably greater than or equal to 0.7 μm and less than or equal to 20 μm. A reflectivity (wavelength: 800 nm) of the light-shielding layer 11 is preferably 5% or less, more preferably 3% or less, and still more preferably 2% or less, and particularly preferably 1% or less. The surface roughness of the light-shielding layer 11 is preferably 0.07 μm or more, more preferably 0.55 μm or more, and particularly preferably greater than or equal to 0.55 μm and less than or equal to 1.5 μm. The size of the colored pattern (the length of one side) is preferably greater than or equal to 0.001 mm and less than or equal to 5 mm, more preferably greater than or equal to 0.05 mm and less than or equal to 4 mm, and still more preferably greater than or equal to 0.1 mm and less than or equal to 3.5 mm from the viewpoint of obtaining the effects of the present invention more effectively. The surface roughness of the light-shielding layer 11 is measured using a stylus profilometer DEKTAK 150 (manufactured by VEECO). The reflectivity of the light-shielding layer 11 was measured using infrared light of 300 to 1300 nm incident on the light-shielding layer 11 at an angle of incidence of 5°, with a spectrometer UV4100 (trade name) manufactured by HITACHI High-Technologies Corporation.

<IR Cut Filter and Method for Manufacturing the Same>

Next, a method for manufacturing the IR cut filter 10 is described. The light-shielding layer 11 constitutes a colored portion of the colored pattern formed from the above-described polymerizable composition. The method for manufacturing the IR cut filter 10 described below includes a method for forming the light-shielding layer 11.

The method for forming the light-shielding layer 11 includes a step (hereinafter may be abbreviated as "polymerizable composition layer forming step") in which a polymerizable composition layer, being a coating film, is formed by applying a coating liquid, being a polymerizable composition, to the incident surface 6a of the filter body 6, a step (hereinafter may be abbreviated as "exposure step") in which the polymerizable composition layer is exposed to light through a mask, and a step (hereinafter may be abbreviated as "development step") in which the polymerizable composition layer after the exposure is developed to form the colored pattern.

To be more specific, the above-described polymerizable composition is applied to the incident surface 6a of the filter body 6 directly or through another layer to form a polymerizable composition layer (the polymerizable composition layer forming step), and the polymerizable composition layer, being the coating film, is exposed to light through a predetermined mask pattern so that only a portion of the coating film exposed to light is cured (the exposure step) and then developed with a developer (the development step), and thereby a pattern-formed film is formed. Thus, the IR cut filter 10 formed with the light-shielding layer 11 is produced.

Hereinafter, referring to FIG. 5, each step in a method for manufacturing the IR cut filter 10 is described.

[Polymerization Composition Layer Forming Step]

Figure 5:
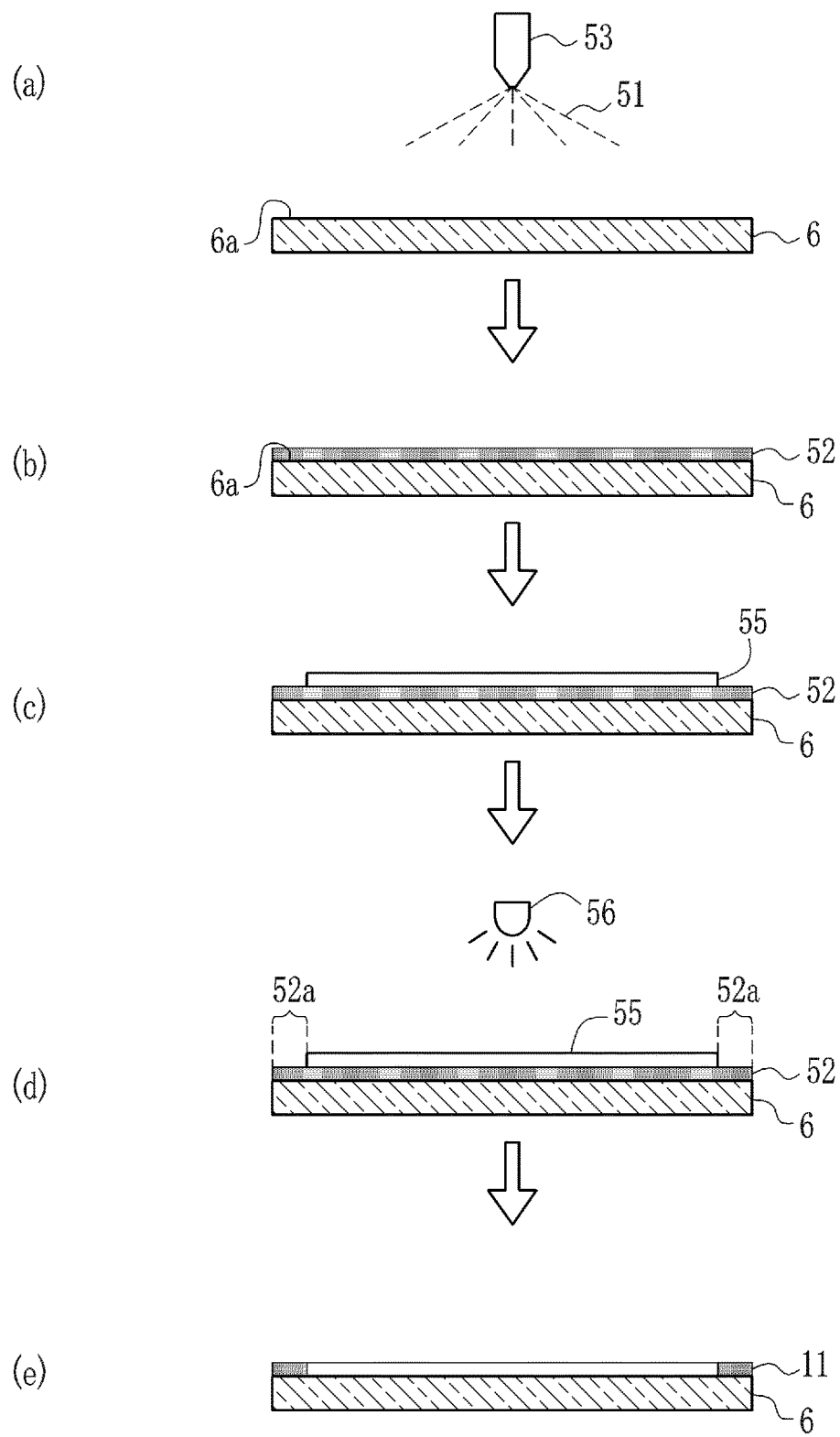
FIG. 5 is an explanatory view illustrating an IR cut filter according to a first embodiment.

In the polymerizable composition layer forming step, as illustrated in parts (a) and (b) of FIG. 5, an above-described polymerizable composition 51 is applied to the incident surface 6a of the filter body 6 to form a polymerizable composition layer 52. In this embodiment, the polymerizable composition layer 52 is formed all over the incident surface 6a, however, the polymerizable composition layer 52 may be formed at least in a region in which the light-shielding layer 11 is formed. A primer coat layer may be provided to the incident surface 6a of the filter body 6 as necessary for the purpose of improving adhesion with the polymerizable composition layer 52, preventing diffusion of a substance, or planarizing the incident surface 6a.

As for a method for applying the polymerizable composition 51 to the incident surface 6a, a spray coating method using a spray coater 53 is used in this embodiment and each embodiment described below. Instead of the spray coating method, various types of application methods such as a spin coating method, slit coating, an ink jet method, rotation coating, casting coating, roll coating, or a screen printing method may be applied.

In the case of the spray coating method, the spray coating may be performed twice or more or four times or more to complete. In the case where the spraying is performed twice, the application pressure (atomizing pressure) of the spray or the distance between a spray-discharge section and the filter body 6 may be changed.

The spray coating method can improve the reflectivity of the polymerizable composition layer 52, however, the adhesion may become insufficient. In the case of the spray coating method, it is considered that the size of polymerizable composition particles which constitute the polymerizable composition layer 52 is controlled by changing application conditions. A layer in which the size of the polymerizable composition particles is small is formed by the first application (first coating), and a layer in which the size of the polymerizable composition particles is large is formed by the second application (second coating). Thereby, the adhesion is ensured by the layer in which the size of the polymerizable composition particles is small. A target reflectivity is achieved by the layer in which the size of the polymerizable composition particles is large. In other words, the object of the present invention is further achieved by a step for forming a layer in which the size of the polymerizable composition particles is small, for ensuring the adhesion, and a step for forming a layer (low reflection layer) in which the size of the polymerizable composition particles is large, for ensuring the low reflectivity. Although the size of the polymerizable composition particles is relative, the average particle diameter of the small-sized polymerizable composition particles (small particles), which are formed by spraying the polymerizable composition and drying the polymerizable composition deposited on an application surface, is preferably 40 µm or less, and more preferably 20 µm or less. The lower limit is in the order of 1 µm. The average particle diameter of the large-sized polymerizable composition particles (large particles) is preferably 50 µm or more, and more preferably 70 µm or more. The upper limit is in the order of 300 µm. Here, the average particle diameter is obtained from the average value of the particle diameters of 20 particles selected arbitrarily while the polymerizable composition particles, which are formed by deposition and drying, are observed with an optical microscopic image.

In order to form the small particles, the atomizing pressure of the spray coater 53 is preferably set to 150 kPa or more, more preferably 350 kPa or more. The upper limit is in the order of 700 kPa. In order to form the large particles, the atomizing pressure of the spray coater 53 is preferably set to 130 kPa or less, more preferably 100 kPa or less. The lower limit is in the order of 50 kPa.

The distance between a discharge section of the polymerizable composition 51 in the spray coater 53 and the filter body 6 is increased (distance B) in the case where the layer (the low reflection layer) in which the size of the polymerizable composition particles is large is formed, and is decreased (distance S) in the case where the layer in which the size of the polymerizable composition particles is small is formed. The distance B is preferably greater than or equal to 1.5 times the distance S, more preferably greater than or equal to twice the distance S, and particularly preferably greater than or equal to three times the distance S.

The polymerizable composition applied to the incident surface 6a is normally dried at a temperature in a range of 70° C. to 110° C. for approximately 2 to 4 minutes. Thus, the polymerizable composition layer 52 is formed.

Note that a member on which the polymerizable composition layer is formed is not limited to the IR cut filter. The polymerizable composition layer may be applied to an optical member (application surface) which requires light-shielding.

[Exposure Step]

In the exposure step, as illustrated in parts (c) and (d) of FIG. 5, the polymerizable composition layer 52 formed in the polymerizable composition layer forming step is exposed to light through a mask 55, so that only an irradiated portion of the polymerizable composition layer 52 is cured. In this embodiment, the mask 55 is formed in a rectangular shape smaller than that of the polymerizable composition layer 52, and placed over a center portion of the polymerizable composition layer 52 (see a part (c) in FIG. 5). The mask 55 covers the polymerizable composition layer 52 with the edge portions of the incident surface 6a of the polymerizable composition layer 52 exposed to the outside. In a case where the polymerizable composition layer 52 is viewed in the normal direction of the incident surface 6a, the edge portions are exposed to the outside. An irradiated portion 52a irradiated with the light from a light source 56 refers to the exposed edge portions only. The irradiated portion 52a becomes the light-shielding layer 11.

In this embodiment, a high-pressure mercury lamp is used as the light source 56. It is preferred that the exposure is carried out by the irradiation of radiation. As for the radiation used for the exposure, ultraviolet rays such as g rays, h rays, and i rays are preferably used. The high-pressure mercury lamp is more preferred. The irradiation intensity is preferably 5 mJ/cm$^2$ to 1500 mJ/cm$^2$, more preferably 10 mJ/cm$^2$ to 1000 mJ/cm$^2$, and most preferably 10 mJ/cm$^2$ to 800 mJ/cm$^2$.

[Development Step]

After the exposure step, an alkali development step (development step) is performed. A non-irradiated portion in the exposure step is eluted into an alkali aqueous solution. Thereby, as illustrated in a part (e) in FIG. 5, only the irradiated portion 52a cured by the light remains and thus the light-shielding layer 11 is formed over the filter body 6. In order to elute the unirradiated portion into the alkali aqueous solution, a method in which the alkaline aqueous solution is applied to the polymerizable composition layer 52, a method in which the filter body 6 formed with the polymerizable composition layer 52 is immersed in the alkali aqueous solution, or the like may be used. Any method may be used as long as it does not alter or elute the filter body 6 and the irradiated portion 52a. An organic alkaline aqueous solution is preferred as the developing solution. The developing temperature is normally greater than or equal to 20° C. and less than or equal to 30° C. and the developing time is 20 seconds or more and 90 seconds or less.

The alkaline aqueous solution may be, for example, inorganic developer in which alkaline compound such as sodium hydroxide, potassium hydroxide, sodium carbonate, sodium hydrogen carbonate, sodium silicate, or sodium metasilicate is dissolved or an organic alkaline developer in which alkaline compound such as aqueous ammonia, ethylamine, diethylamine, dimethylethanolamine, tetramethylammonium hydroxide, tetraethylammonium hydroxide, choline, pyrrole, piperidine, or 1, 8-diazabicyclo-[5,4,0]-7-undecene is dissolved. In the alkaline aqueous solution, the alkaline compound is dissolved such that the concentration is 0.001 to 10 mass %, preferably 0.01 to 1 mass %. A water-soluble organic solvent such as methanol or ethanol, a surfactant, and the like may be added to the alkaline aqueous solution. Note that in the case where the developer composed of the alkaline aqueous solution is used, rinsing with pure water is generally performed after the development.

Note that, in the method for manufacturing the light-shielding layer 11, a curing step in which the formed light-shielding layer 11 is cured by heating and/or exposure may be included as necessary after the polymerizable composition layer forming step, the exposure step, and the development step described above. In the case where the light-shielding layer 11 is cured with heat, the curing treatment is performed for 5 minutes at 200° C. on a hot plate after it is washed with pure water.

Owing to the above-described polymerizable composition, the light-shielding layer 11 exhibits high adhesion properties with the filter body 6. The cured polymerizable composition is excellent in resistance to development, so that it is possible to form a pattern which is excellent in exposure sensitivity and in adhesion with the filter body 6 of the exposure section and has high-resolution to provide a desired cross-sectional shape.

Figures 6, 7:
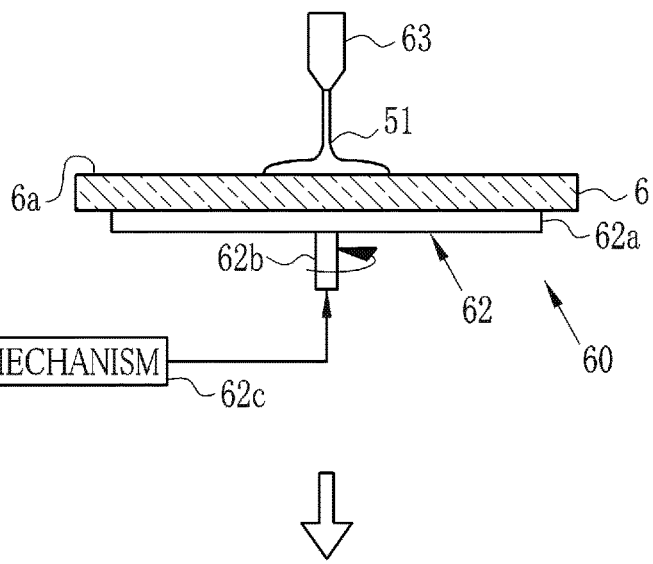
FIG. 6 is an explanatory view illustrating a method for forming a polymerizable composition layer with a spin coating method.
FIG. 7 is a table illustrating experimental results regarding presence or absence of flare in a taken image and acceptance or rejection of viewing angles, with varying size of the light-shielding layer.

Note that the polymerizable composition layer 52 may be formed by a spin coating method as described above. The spin coating method is a method for coating using a spin coater. A spin coater 60, for example, as illustrated in FIG. 6, comprises a mount 62, on which the filter body 6 is placed, and a coating die 63. The mount 62 has a mount body 62a, a rotary axis 62b fixed to the center of the mount body 62a, and a rotary mechanism 62c. The filter body 6 is placed on the mount body 62a, and the polymerizable composition 51 is supplied onto the filter body 6 from the coating die 63 (see a part (a) of FIG. 6). The rotary axis 62b is rotated in a circumferential direction by the rotary mechanism 62c and thereby the mount body 62a is rotated together with the rotary axis 62b. Due to this rotation, the supplied polymerizable composition 51 spreads over the filter body 6 and thus the polymerizable composition layer 52 is formed (see apart (b) in FIG. 6).

Hereinafter, the present invention is described specifically, but the present invention is not limited to the following examples as long as it does not exceed the scope of the present invention. Note that unless otherwise specified, "parts" and "%" are in terms of mass. The room temperature refers to 25° C.

EXAMPLES

Synthesis of Specific Resin 1

600 g of ε-caprolactone and 22.8 g of 2-ethyl-1-hexanol were introduced to a three-necked flask 1000 mL, and stirred while nitrogen is blown therein. 0.1 g of monobutyl tin oxide was added thereto and heated to 100° C. 8 hours later, after disappearance of the raw material was checked by gas chromatography, the mixture was cooled to 80° C. After 0.1 g of 2,6-dibutyl-4-methylphenol was added, 27.2 g of 2-methacryloyloxyethyl isocyanate was added. After 5-hour stirring, the disappearance of the raw material was checked by $^1$H-NMR, and then the mixture was cooled to the room temperature, and thereby 650 g of solid precursor M1 (the structure below) was obtained. The M1 was identified by $^1$H-NMR, IR, and mass spectrometry.

[Chemical formula 12]

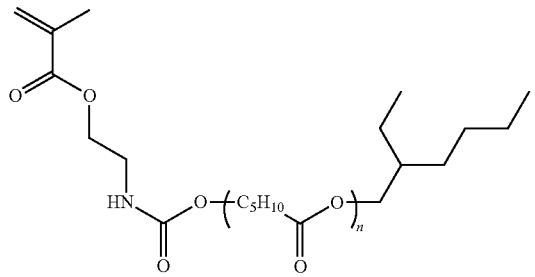

M1

80.0 g of the precursor M1, 20.0 g of isobutyl methacrylate, 2.3 g of dodecyl mercaptan, and 233.3 g of propylene glycol monomethyl ether acetate were introduced in a nitrogen-substituted three-necked flask, and stirred with a stirrer (Three-One Motor manufactured by Shinto Scientific Co., Ltd.), and heated up to 75° C. while nitrogen is blown into the flask. 0.2 g of 2,2-azobis (2,4-dimethylvaleronitrile) (V-65 manufactured by Wako Pure Chemical Industries Co., Ltd.) was added thereto, and stirred for 2 hours while being heated at 75° C. 2 hours later, 0.2 g of V-65 was further added. After 3 hours of heating and stirring, a 30% solution of a specific resin 1 described below was obtained. The ClogP value written beneath a structural unit, on the left side, of the specific resin 1 represents the ClogP value in a compound (monomer) which corresponds to the structural unit. In the specific resin, the composition ratio in the resin is x=20 and y=80, the number of atoms in a graft chain excluding hydrogen atoms=257, the acid value=0 mgKOH/g, and weight average molecular weight=22000.

[Chemical formula 13]

Specific resin 1

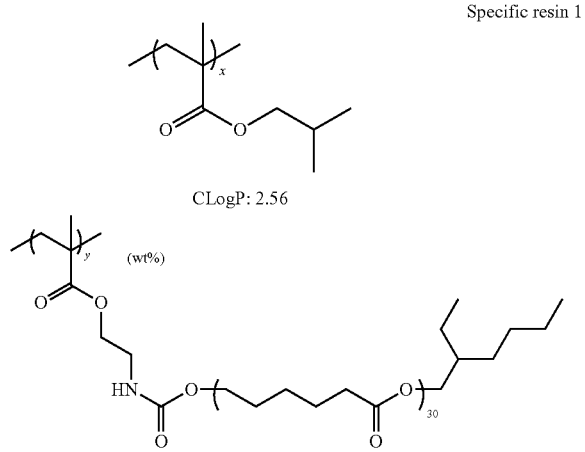

Preparation of Titanium Black Dispersion

—Preparation of titanium black A-1 —

100 g of titanium oxide MT-150A (trade name, manufactured by Tayca Co., Ltd.) with the average particle diameter of 15 nm, 25 g of silica particles AEROPERL (registered trademark) 300/30 (manufactured by Evonik) with a BET surface area of 300 m$^2$/g, and 100 g of a dispersant Disperbyk190 (trade name, manufactured by BYK Co., Ltd.) were measured and mixed together, and 71 g of ion electrochemical exchange water was added thereto, and then were subjected to processing for 20 minutes using the KURABO-made MAZERSTAR KK-400W at revolution speed 1360 rpm and rotation speed 1047 rpm. Thereby a uniform mixture aqueous solution was obtained. A quartz vessel was filled with the aqueous solution and heated to 920° C. in an oxygen atmosphere with a small rotary kiln (manufactured by Motoyama Ltd.), and then the atmosphere was replaced with nitrogen, and nitride reduction treatment was performed by flowing ammonia gas at 100 mL/min for 5 hours at the same temperature. After the completion, the recovered powder was ground with a mortar and thereby titanium black A-1 (the dispersoid containing the titanium black particles and the Si atoms) in powder form containing the Si atoms and having a specific surface area of 73 m$^2$/g was obtained.

The components shown in the following composition 1 are stirred for 15 minutes using a stirrer (EUROSTAR manufactured by IKA Co.) to obtain a dispersion "a".

(Composition 1)

| | |
|---|---|
| The titanium black (A-1) obtained as described above | 25 parts |
| 30 mass % solution of propylene glycol monomethyl ether acetate, being the specific resin 1 | 25 parts |
| Propylene glycol monomethyl ether acetate (PGMEA) (solvent) | 50 parts |

The obtained dispersion "a" was subjected to a dispersion process under the following conditions by using Ultra Apex Mill UAM015 manufactured by Kotobuki Industries Ltd., and thereby titanium black dispersion was obtained.

(Dispersion Conditions)

Bead diameter: φ 0.05 mm

Beads filling rate: 75% by volume

Mill peripheral speed: 8 m/sec

Volume of mixture liquid to be subjected to dispersion process: 500 g

Circulation flow rate (pump feed rate): 13 kg/hour

Temperature of liquid being treated: 25 to 30° C.

Cooling water: tap water

Volume of annular chamber of bead mill: 0.15 L

Number of passes: 90 passes

<Preparation of Polymerizable Composition>

The components of the following composition A were stirred with a stirrer to prepare the polymerizable composition.

(Composition A)

| | |
|---|---|
| Benzyl methacrylate/acrylic acid copolymer (composition ratio: benzyl methacrylate/acrylic acid copolymer = 80/20 (mass %), weight average molecular weight: 25000; binder polymer) | 5.0 parts |
| Dipentaerythritol hexaacrylate (polymerizable compound) | 5.0 parts |
| Ethoxylated pentaerythritol tetraacrylate (polymerizable compound) | 2.0 parts |
| Titanium black dispersion described above | 70.0 parts |
| Propylene glycol monomethyl ether acetate (solvent) | 8.94 parts |
| Ethyl 3-ethoxy propionate (solvent) | 7.0 parts |
| Polymerization initiator: a compound 1 described below (IRGACURE OXE01 manufactured by BASF) | 1.0 part |
| 4-methoxyphenol (polymerization inhibitor) | 0.01 parts |
| 3-methacryloxypropyl trimethoxysilane (Silane coupling agent) | 1.0 part |
| Megafac F781 (manufactured by DIC Ltd.) (surfactant) | 0.05 parts |

[Chemical formula 14]

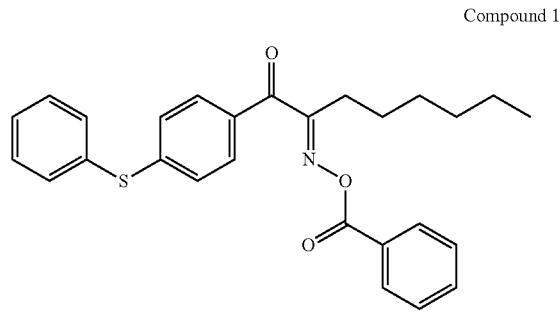

Compound 1

<Formation of Light-Shielding Layer>

The polymerizable composition 51 prepared as described above was applied over the incident surface 6a of the filter body 6 by a well-known spray coating method. Then a heating process (prebaking) was performed for 120 seconds by using a hot plate at 100° C. Thereby a polymerizable composition layer with the dry film thickness of 1.5 μm was formed. Next, the exposure was performed at the amount of exposure of 1000 mJ/cm$^2$ with an i-rays stepper exposure device FPA-3000i5+(manufactured by Canon Ltd.) at the wavelength of 365 nm through an island-pattern mask with the 2 μm square pattern size.

Then the filter body 6 formed with the irradiated polymerizable composition layer is placed on a horizontal rotary table of a spin shower developer (DW-30 type, manufactured by Chemitronics Co., Ltd.), and puddle development was performed for seconds at 23° C. using 0.3% aqueous solution of tetramethylammonium hydroxide. Thereby the unirradiated portion of the polymerizable composition layer 52 was eluted into the above-mentioned aqueous solution.

Next, the filter body 6 was fixed to the above-mentioned horizontal rotary table by a vacuum chuck system and a rinsing process was performed by supplying a shower of pure water through an ejection nozzle from the above of the rotation center while the horizontal rotary table was rotated by a rotary device at the number of revolution 50 rpm, and then washed with pure water. After that, the curing treatment was performed on a hot plate at 200° C. for 5 minutes. Thus, the IR cut filter 10 with the incident surface 6a formed with the light-shielding layer 11 was manufactured.

[Example 1] to [Example 3], [Reference Example 1], and [Comparative Example 1]

The solid-state imaging device 2 illustrated in FIGS. 1 and 2 is installed in a digital camera, and then imaging is performed. The subject light is incident on the IR cut filter 10 through the taking lens 7. After the IR light is cut by the filter body 6, the subject light enters the image sensor 3. At this time, the harmful rays R1, R2, and the like are blocked by the light-shielding layer 11.

In the image sensor 3, the plurality of color pixels arranged in the light receiving surface photoelectrically convert the incident light and store the signal charges. At the time of imaging, the signal charge of each color pixel is read out sequentially, and three color signals are outputted. After being subjected to signal processing in an analog Processing circuit, which has a noise removing circuit and an amplifying circuit, incorporated in the digital camera, the three color signals are converted into image data by an A/D converter. Thus, a taken image is displayed.

In an example 1, as illustrated in FIG. 4, L2/L1=1 is satisfied where L1 denotes a length from the side end of the filter body 6 to the side end of the image sensor 3 and L2 denotes a length from the side end of the filter body 6 to the inner end of the light-shielding layer 11. The presence or the absence of flare in a taken image and whether the viewing angle is acceptable or unacceptable (rejected) are evaluated. As compared with the example 1, in an example 2, L2/L1=0.5 is satisfied. In an example 3, L2/L1=0.5 is satisfied. In a comparative example, L2/L1=1.2 is satisfied. In the comparative example 1, the light-shielding layer 11 is not provided. Other conditions were the same as those in the example 1. The experimental results are shown in FIG. 7.

The experimental result regarding the presence or absence of flare was evaluated as A in the case where the taken image is free from flare, and evaluated as B in the case where the taken image has little flare, and evaluated as Z in the case where the flare appears notably in taken image. Note that A and B are the levels which are accepted and Z is the level which is rejected.

As a result of the experiments, in the example 1, a clean image free from flare was taken and a sufficient viewing angle was obtained. In the examples 2 and 3, clean images with little flare were taken and the viewing angles were sufficient. Thus, in the examples 1 to 3, the light-shielding layer 11 blocks the harmful rays such as the reflective light R1 and R2 (see FIG. 3). Thereby the incidence of the harmful rays onto the image sensor 3 is inhibited, so that the occurrences of flare and ghost are inhibited.

In a reference example 1, the viewing angle was not as sufficient as those in the examples 1 to 3. Outer peripheral portions of an image were not available. However, there was little flare and little ghost. The reference example 1 had certain effects on the flare and the ghost. In the comparative example 1, there was a significant amount of flare. Note that similar experimental results were obtained after the experiments were carried out several times with the conditions the same as those in the examples 1 to 3, the reference example 1, and the comparative example 1.

Example 10

The light-shielding layer 11 was formed over the filter body 6 in a manner similar to the example 1. Note that in the example 10, the atomizing pressure of the spray was changed as follows. A layer in which the size of the polymerizable composition particles is small was formed first (the atomizing pressure was 400 kPa; the average particle diameter of the polymerizable composition particles was 15 μm). Then, a layer in which the size of the polymerizable composition particles is large was formed (the atomizing pressure is 100 kPa; the average particle diameter of the polymerizable composition particles is 80 μm). As a result, little peeling of the light-shielding layer 11 was observed in the cross-cut test, showing excellent adhesion properties of the light-shielding layer 11.

[Second Embodiment]

Figure 8:
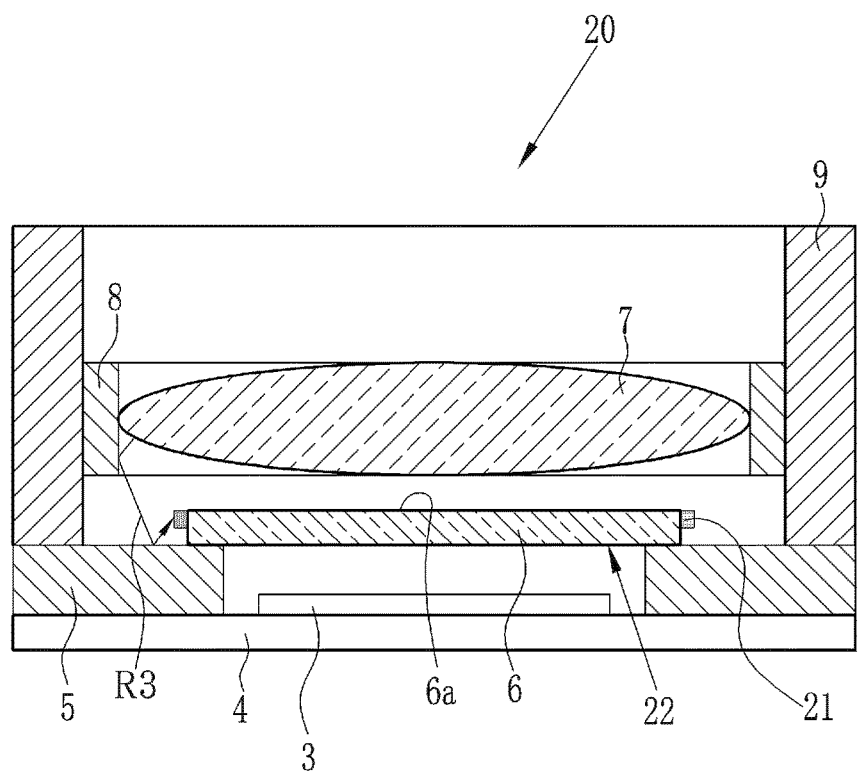
FIG. 8 is a cross-sectional view illustrating a solid-state imaging device according to a second embodiment.

In FIG. 8, a solid-state imaging device 20 of a second embodiment is illustrated. Note that the elements which are the same as or similar to those of the first embodiment are designated with the same reference numbers and detailed descriptions thereof are omitted.

The solid-state imaging device 20 comprises the image sensor 3, the circuit board 4, the ceramic plate 5, an IR cut filter 22, the taking lens 7, the lens holder 8, and the support barrel 9. The IR cut filter 22 has the filter body 6 and the light shielding layer 21. The light shielding layer 21 is formed over the entire periphery of the side end faces of the filter body 6. The light shielding layer 21 is formed to be flush with the incident surface 6a, and lower portions of the side end faces of the filter body 6 illustrated in FIG. 8 are not formed with the light shielding layer 21. In the absence of the light-shielding layer 21, the reflective light R3 exited from the taking lens 7 and reflected by the front surface of the ceramic plate 5 enters the image sensor 3 after repetitive reflection and refraction inside the device and thereby causes the flare in a taken image. In this embodiment, however, the light shielding layer 21 blocks the harmful rays such as the reflective light R3 traveling toward the image sensor 3. As a result, a taken image in which the flare is inhibited is displayed.

Figure 9:
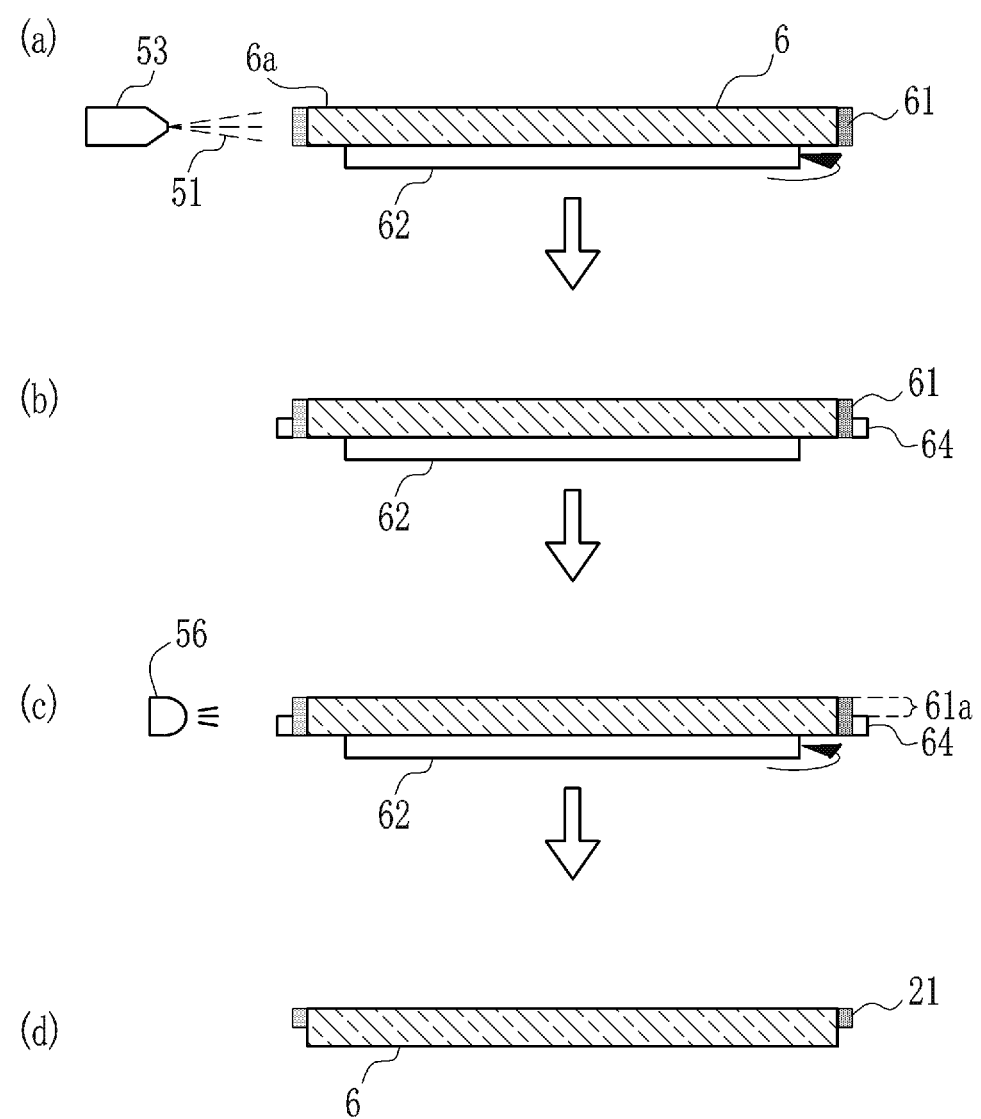
FIG. 9 is an explanatory view illustrating a method for manufacturing an IR cut filter in a second embodiment.

Referring to FIG. 9, a method for manufacturing the IR cut filter 22 is described. As illustrated in a part (a) in FIG. 9, the filter body 6 is placed on the mount 62. The spray coater 53, which is disposed to face the side face of the mount 62, sprays the polymerizable composition 51 onto the side end face of the filter body 6 while the mount 62 is rotated in a circumferential direction with the top face of the mount 62 maintained in the horizontal direction. Thus the polymerizable composition 51 is applied. After the application, the drying was performed under the above-described conditions and thereby a polymerizable composition layer 61 was formed on the side end face of the filter body 6 (the polymerizable composition layer forming step).

Next, as illustrated in parts (b) and (c) in FIG. 9, the polymerizable composition layer 61 is exposed through a mask 64, so that only a portion of the polymerizable composition layer 61 irradiated with the light is cured (the exposure step). In this embodiment, the mask 64 has a rectangular frame form with an opening at the center. The size of the opening is the same as that of the filter body 6 formed with the polymerizable composition layer 62. The thickness of the mask 64 is smaller than that of the filter body 6. The mask 64 is disposed with its underside flush with the exit surface of the filter body 6 as illustrated in FIG. 9. Thus, the mask 64 is provided over the outer periphery of the polymerizable composition layer 61 (see the part (b) in FIG. 9). The mask 64 covers the polymerizable composition layer 61 such that the mask 64 exposes an upper portion of the polymerizable composition layer 61 to the outside as illustrated in the drawing. The edge portion of the polymerizable composition layer 61 is exposed to the outside when viewed in the normal direction of the incident surface. Only the exposed portion is an irradiated portion 61a, which is irradiated with the light from the light source 56. The irradiated portion 61a becomes the light shielding layer 21.

Figures 10, 11:
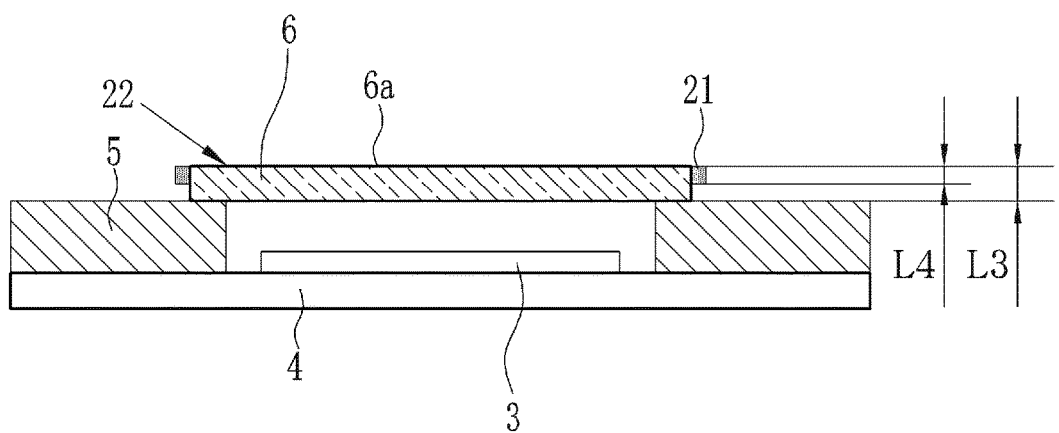
FIG. 10 is a cross-sectional view illustrating a CMOS sensor, a circuit board, a ceramic plate, an IR cut filter, and a light-shielding layer according to a second embodiment.
FIG. 11 is a table illustrating experimental results regarding the presence or absence of flare in a taken image and the acceptance or rejection of viewing angles in a case where the size of the light-shielding layer is varied in the solid-state imaging device of the second embodiment.

The exposure (the exposure step) is performed by applying the light from the light source 56, which is disposed to face the mount 62, while the mount 62 is rotated in a manner similar to that in the polymerizable composition layer forming step. After the exposure step, alkali development step (the development step) is performed. The unirradiated portion not irradiated in the exposure step is eluted into an alkali aqueous solution. Thereby, as illustrated in apart (d) of FIG. 9, only the irradiated portion 52a cured by the light remains and thus the light-shielding layer 21 is formed over the end face of the filter body 6. Note that the above-described curing step may be performed after the development step. Note that, as illustrated in FIG. 10, it is preferred to satisfy L4≤L3 where L3 denotes the length of the filter body 6 in the optical axis direction and L4 denotes the length from the incident surface 6a of the filter body 6 to a rear end (underside) of the light shielding layer 21. Thereby the viewing angle in the case of L4≤L3 is greater than that in the case of L4>L3.

[Example 4] to [Example 6], and [Comparative Example 2]

The solid-state imaging device 20 illustrated in FIG. 8 is installed in the digital camera, and then imaging is performed. In an example 4, as illustrated in FIG. 10, L4/L3=0.1 was satisfied where L3 denotes the length of the filter body 6 in the optical axis direction and L4 denotes the length from the incident surface 6a of the filter body 6 to the rear end of the light shielding layer 21. The presence or absence of the flare in a taken image and whether the viewing angle is accepted or rejected are evaluated. As compared with the example 1, in the example 5, L4/L3=0.5 was satisfied. In the example 6, L4/L3=1 was satisfied. In the comparative example 2, the light shielding layer 21 was not provided. Other conditions were the same as those in the example 4. The experimental results were shown in FIG. 10. With regard to the experimental results on the presence or absence of the flare, a level C (acceptable level), which corresponds to a taken image of an acceptable level with some flare, was provided in addition to the levels A, B, and Z, which are the same as those in the first embodiment.

As a result of the experiments, in the example 4, an image of an acceptable level with some flare was taken. In examples 5 and 6, clean images with little flare were taken. Note that the sufficient viewing angles were obtained in the examples 4 to 6.

In the comparative example 2, a significant amount of flare occurred. Note that similar experimental results were obtained after the experiments were carried out for several times with the conditions same as those in the examples 4 to 6 and the comparative example 2.

[Third Embodiment]

Figure 12:
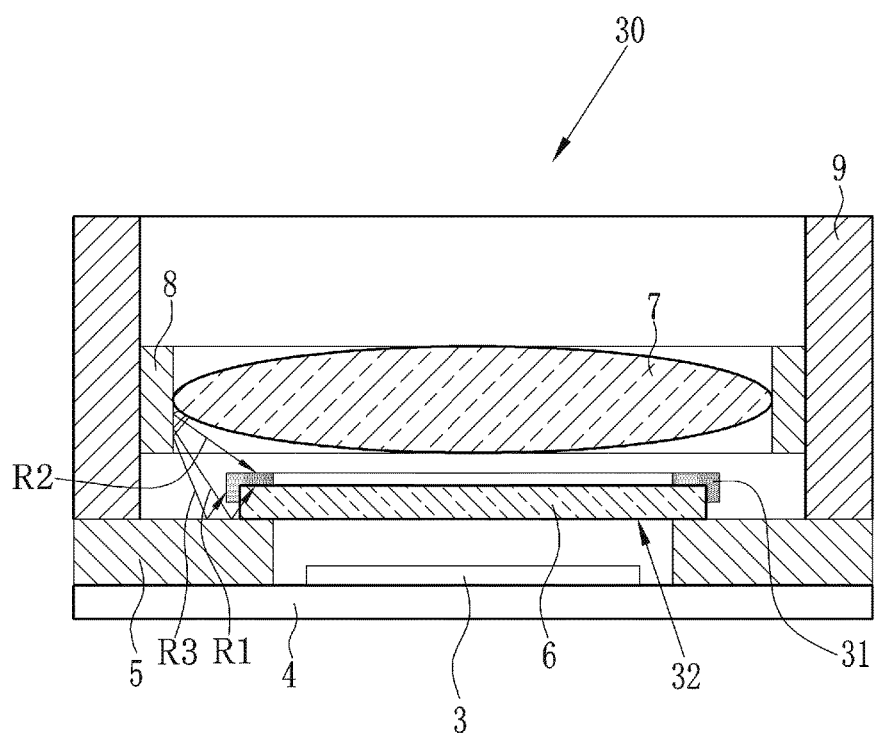
FIG. 12 is a cross-sectional view of a solid-state imaging device according to a third embodiment.

FIG. 12 illustrates a solid-state imaging device 30 of the third embodiment. Note that elements which are the same as or similar to those of the first embodiment are designated with the same reference numbers and detailed descriptions thereof are omitted.

The solid-state imaging device 30 comprises the image sensor 3, the circuit board 4, the ceramic plate 5, an IR cut filter 32, the taking lens 7, the lens holder 8, and the support barrel 9. The IR cut filter 32 has the filter body 6 and a light-shielding layer 31. The light-shielding layer 31 is formed over the entire periphery of the edge portions and the side end faces of incident surface 6a of the filter body 6. In other words, the first and second embodiments are combined with each other. In this embodiment, the light-shielding performance is higher than those of the first and second embodiments, so that the occurrences of the flare and the ghost are inhibited reliably.

Figure 13:
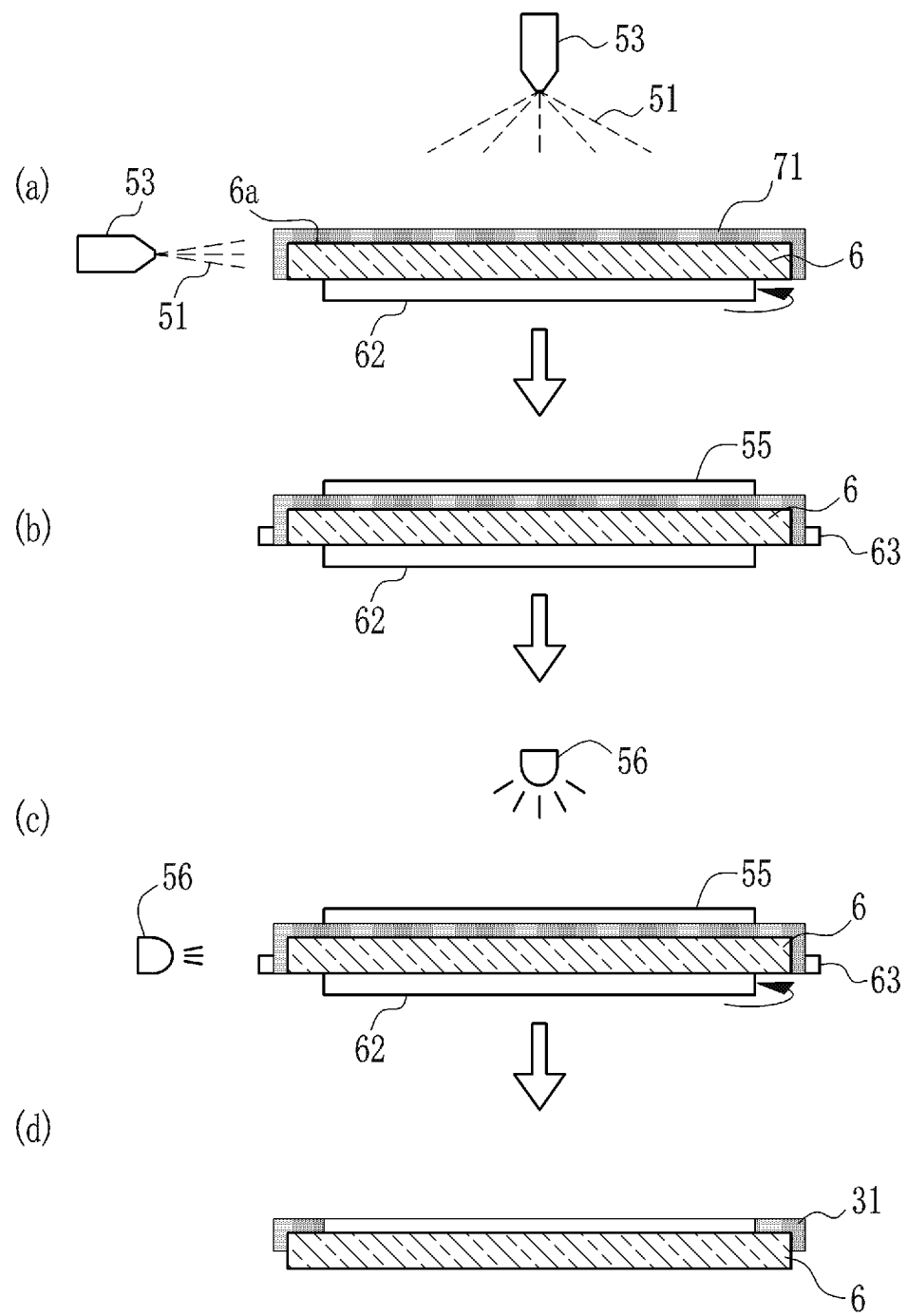
FIG. 13 is an explanatory view of a method for manufacturing an IR cut filter according to the third embodiment.

Referring to FIG. 13, a method for manufacturing the IR cut filter 32 is described. As illustrated in a part (a) of FIG. 13, the polymerizable composition 51 is applied, with the spray coater 53, to the incident surface 6a and the side end faces of the filter body 6. In order to perform the application to the side end faces of the filter body 6, the filter body 6 is placed on the rotatable mount 62, and the spray coater 53, which is disposed to face the side face of the mount 62, sprays the polymerizable composition 51 onto the side end faces of the filter body 6 while the mount 62 is rotated in a circumferential direction with the top surface of the mount 62 maintained in the horizontal direction, in a manner similar to that of the second embodiment. After the application, drying is performed under the above-described conditions, and thereby a polymerizable composition layer 71 is formed over the incident surface 6a and the side end faces of the filter body 6 (polymerizable composition layer forming step).

Next, as illustrated in parts (b) and (c) of FIG. 13, the exposure process is performed with the masks 55 and 64. The exposure is performed by applying the light from the light source 56 disposed above the mount 62 and the light source 56 disposed to face the side face of the mount 62 while the mount 62 is rotated in a manner similar to that in the polymerizable composition layer forming step. The alkali development step (the development step) is performed after the exposure step. The unirradiated portion not irradiated in the exposure step is eluted into an alkaline aqueous solution. Thereby, as illustrated in a part (d) in FIG. 13, only a portion cured by the light remains, so that the light-shielding layer 31 is formed over the edge portions and over the side end faces of the incident surface 6a of the filter body 6. Note that after the development step, the curing step may be performed as described above.

[Fourth Embodiment]

Figure 14:
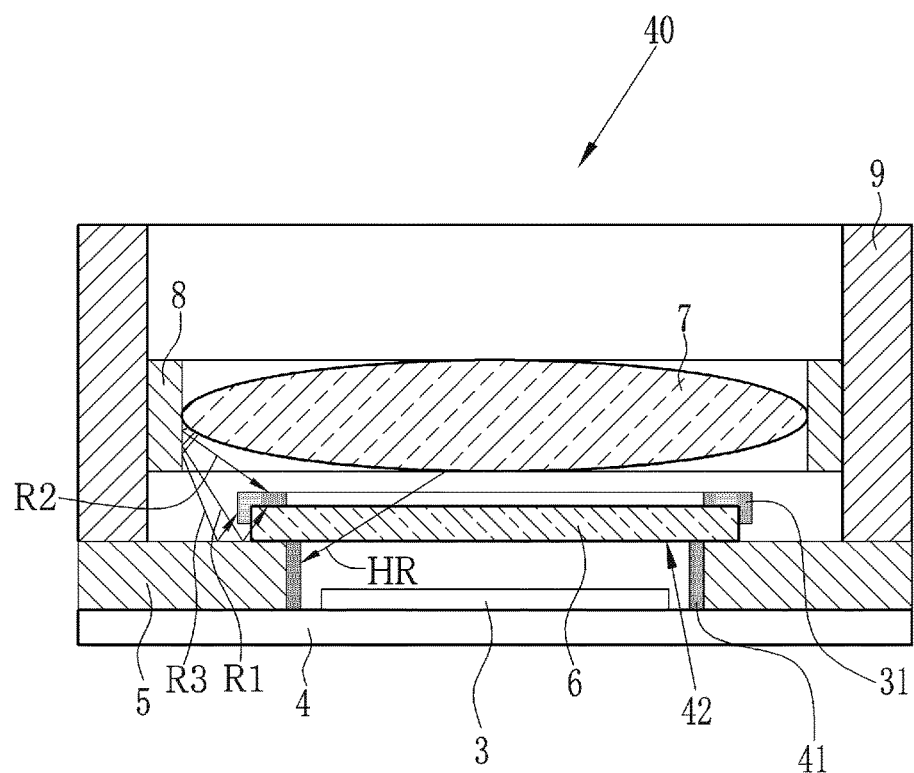
FIG. 14 is a cross-sectional view illustrating a solid-state imaging device according to a fourth embodiment.

FIG. 14 illustrates a solid-state imaging device 40 of a fourth embodiment. Note that elements which are the same as or similar to those of the third embodiment are designated with the same reference numbers and detailed descriptions thereof are omitted.

The solid-state imaging device 40 comprises the image sensor 3, the circuit board 4, the ceramic plate 5, an IR cut filter 42, the taking lens 7, the lens holder 8, and the support barrel 9. The IR cut filter 42 has the filter body 6 and the light-shielding layer 31. The light-shielding layer 31 is formed over the entire periphery of the edge portions and the side end faces of the incident surface 6a of the filter body 6.

A light-shielding layer 41 is formed over an inner wall of the ceramic plate 5. In a case where the light-shielding layer 41 is not formed, the reflective light exited from the taking lens 7 and passed through the filter body 6 and reflected by the inner wall of the ceramic plate 5 is incident on the image sensor 3, causing the flare in a taken image. In this embodiment, however, the light-shielding layer 41 blocks the harmful rays HR from entering the inner wall of the ceramic plate 5. In this embodiment, the light-shielding performance is higher than those in the first to third embodiments, so that the occurrence of the flare is inhibited reliably. In this embodiment, the light-shielding layer 41 is formed by a spray coating method. In a case where a coating is applied also to other walls in addition to the inner walls of the ceramic plate 5, the light-shielding layer 41 may be formed by the developing process after the exposure process using a mask (not shown).

Note that, in the above embodiments, the filter body 6 having the reflective film formed on the glass is used, but is not limited thereto. A low-pass filter may be used as the filter body 6.

In the above embodiments, the IR cut filter 10, 22, 32, or 42 is held by the ceramic plate 5, but the plate is not limited thereto. The IR cut filter may be held by a resin plate or a metal plate.

What is claimed is:

1. An IR cut filter disposed and used on a light receiving surface side of a solid-state imaging element comprising:
   a filter body for cutting IR light of subject light traveling toward the light receiving surface; and
   a light-shielding layer formed over at least one of an edge portion of an incident surface of the filter body and a side end face of the filter body and blocking visible light,
   wherein the light-shielding layer is formed over the edge portion of the incident surface of the filter body, and
   wherein a length L1 from a side end of the incident surface to a side end of the solid state imaging element in an orthogonal direction orthogonal to an optical axis direction and a length L2 from a side end of the filter body to an inner end of the light-sheiding layer in the orthogonal direction satisfy L2≤L1.

2. The IR cut filter according to claim 1, wherein the light-shielding layer contains carbon black or titanium black.

3. The IR cut filter according to claim 1, wherein the light-shielding layer is formed by a spin coating method or a spray coating method.

4. The IR cut filter according to claim 1, wherein the light-shielding layer is further formed over the side end face, and
   a length L3 of the filter body in the optical axis direction and a length L4 from the incident surface to a rear end of the light-shielding layer in the optical axis direction satisfy L4≤L3.

5. The IR cut filter according to claim 1, wherein a reflectivity of the light-shielding layer at a wavelength of 800 nm is 2% or less and surface roughness is 0.55μm or more.

6. A solid-state imaging device comprising:
   a taking lens;
   a solid-state imaging element disposed on an exit surface side of the taking lens;
   an IR cut filter disposed between the taking lens and the solid-state imaging element, the IR cut filter having a filter body and a light-shielding layer, the filter body cutting IR light of subject light traveling toward a light receiving surface of the solid-state imaging element, the light-shielding layer blocking visible light, the light-shielding layer being formed over at least one of an edge portion of an incident surface of the filter body and a side end face of the filter body; and
   a support plate for supporting the IR cut filter,
   wherein the light-shielding layer is formed over the edge portion of the incident surface of the filter body, and
   wherein a length L1 from a side end of the incident surface to a side end of the solid-state imaging element in an orthogonal direction orthogonal to an optical axis direction and a length L2 from a side end of the filter body to an inner end of the light shielding layer in the orthogonal direction satisfy L2≤L1.

7. An IR cut filter disposed and used on a light receiving surface side of a solid-state imaging element comprising:
   a filter body for cutting IR light of subject light traveling toward the light receiving surface; and
   a light-shielding layer formed over a side end face of the filter body and blocking visible light,
   wherein a length L3 of the filter body in an optical axis direction and a length L4 from an incident surface of the filter body to a rear end of the light-shielding layer in the optical axis direction satisfy L4≤L3.

8. The IR cut filter according to claim 7, wherein the light-shielding layer contains carbon black or titanium black.

9. The IR cut filter according to claim 7, wherein the light-shielding layer is formed by a spin coating method or a spray coating method.

10. The IR cut filter according to claim 7, wherein a reflectivity of the light-shielding layer at a wavelength of 800 nm is 2% or less and surface roughness is 0.55 μm or more.

11. A solid-state imaging device comprising:
    a taking lens;
    a solid-state imaging element disposed on an exit surface side of the taking lens;

an IR cut filter disposed between the taking lens and the solid-state imaging element, the IR cut filter having a filter body and a light-shielding layer, the filter body cutting IR light of subject light traveling toward a light receiving surface of the solid-state imaging element, the light-shielding layer blocking visible light, the light-shielding layer being formed over a side end face of the filter body; and a support plate for supporting the IR cut filter, wherein a length $L3$ of the filter body in an optical axis direction and a length $L4$ from an incident surface of the filter body to a rear end of the light-shielding layer in the optical axis direction satisfy $L4 \leq L3$.

12. The IR cut filter according to claim 1, wherein the light-shielding layer constitutes a colored pattern and the length of one side of the colored pattern is in a range from 0.001 to 5 mm.

13. The IR cut filter according to claim 1, wherein the light-shielding layer includes black colorant and a polymer compound containing a structural unit having a graft chain and a hydrophobic structural unit that is different from the structural unit having the graft chain.

14. The IR cut filter according to claim 1, wherein the side end of the filter body is located outside the side end of the solid-state imaging element.

* * * * *